United States Patent
Wu

(10) Patent No.: US 9,704,871 B2
(45) Date of Patent: Jul. 11, 2017

(54) SEMICONDUCTOR DEVICE HAVING A MEMORY CELL AND METHOD OF FORMING THE SAME

(71) Applicant: Micron Technology, Inc., Boise, ID (US)

(72) Inventor: Nan Wu, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 14/840,459

(22) Filed: Aug. 31, 2015

(65) Prior Publication Data

US 2016/0086955 A1 Mar. 24, 2016

(30) Foreign Application Priority Data

Sep. 18, 2014 (JP) ................................. 2014-189712
Feb. 16, 2015 (JP) ................................. 2015-027434

(51) Int. Cl.
*H01L 27/108* (2006.01)
*H01L 27/02* (2006.01)

(52) U.S. Cl.
CPC .. *H01L 27/10814* (2013.01); *H01L 27/10876* (2013.01); *H01L 27/10885* (2013.01); *H01L 27/0207* (2013.01)

(58) Field of Classification Search
CPC ......... H01L 27/10814; H01L 27/10885; H01L 27/10876; H01L 27/0207
See application file for complete search history.

(56) References Cited

U.S. PATENT DOCUMENTS

2012/0086084 A1* 4/2012 Kikuchi .......... H01L 21/823842
257/369
2015/0126013 A1* 5/2015 Hwang ............. H01L 27/10888
438/381

FOREIGN PATENT DOCUMENTS

| JP | 2007-287794 | 11/2007 |
|---|---|---|
| JP | 2009-010366 | 1/2009 |
| JP | 2011-205030 | 10/2011 |
| JP | 2012-134439 | 7/2012 |
| JP | 2012-248686 | 12/2012 |
| JP | 2013-055213 | 3/2013 |
| JP | 2013-058676 | 3/2013 |

* cited by examiner

*Primary Examiner* — Roy Potter
*Assistant Examiner* — Paul Patton
(74) *Attorney, Agent, or Firm* — Wells St. John P.S.

(57) ABSTRACT

There is provided an apparatus includes a substrate having a main surface, a wordline buried in the substrate and a bitline buried in a shallower area than the wordline in the substrate.

12 Claims, 51 Drawing Sheets

K-K

C-C

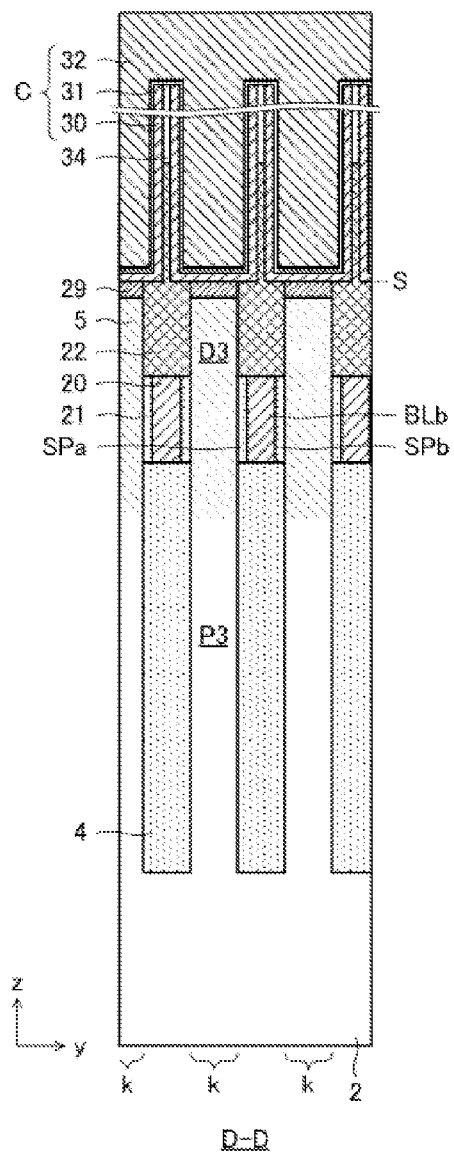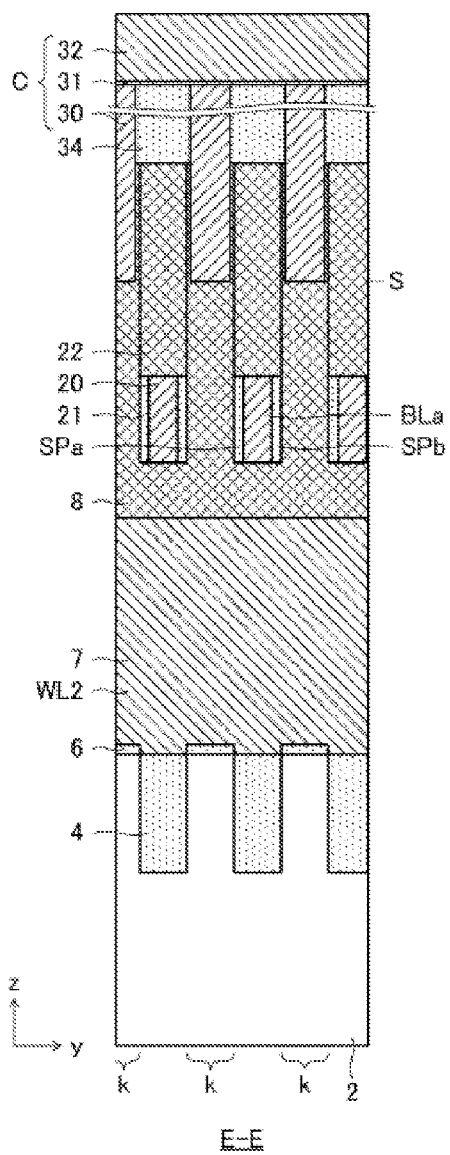

FIG. 7a
FIG. 7b
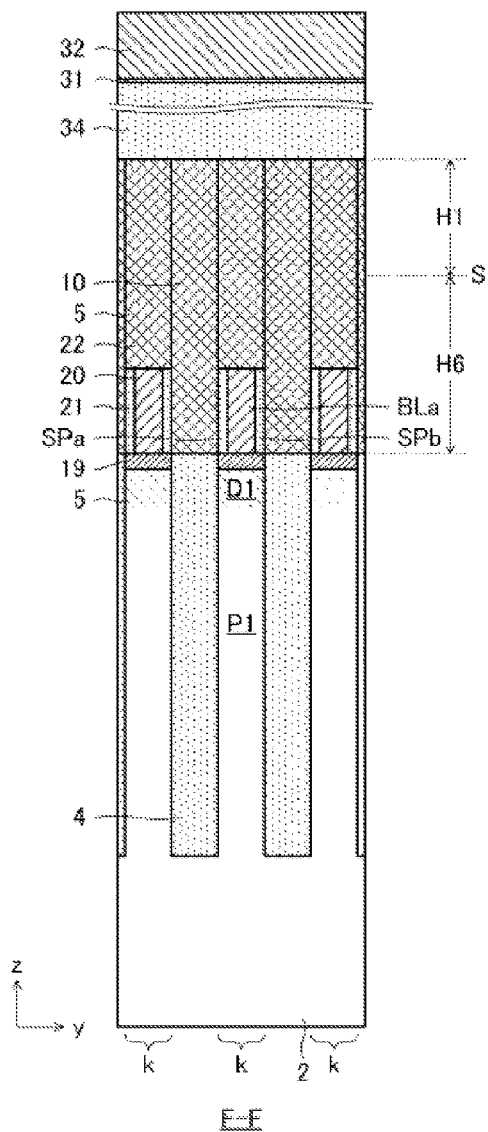
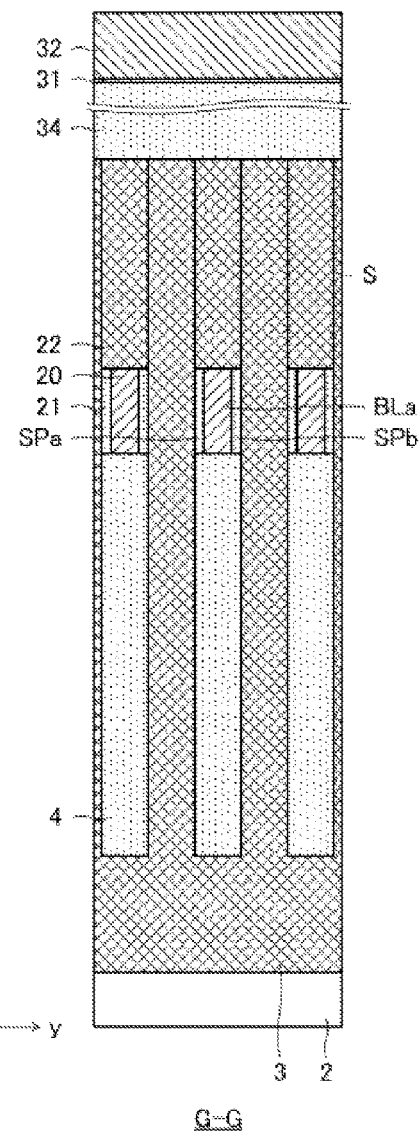

A-A

A-A

A-A

A-A

A-A

G-G

B-B

A-A

A-A

A-A

A-A

A-A

SEMICONDUCTOR DEVICE HAVING A MEMORY CELL AND METHOD OF FORMING THE SAME

RELATED PATENT DATA

This application is based upon and claims the benefit of priority from Japanese Patent Application No. 2014-189712 filed on Sep. 18, 2014, and Japanese Patent Application No. 2015-027434 filed on Feb. 16, 2015, the disclosures of which are hereby incorporated herein in their entirety by reference.

FIELD OF THE INVENTION

The present invention relates to a semiconductor device and a method of manufacturing the same and particularly relates to a semiconductor device having a wordline of a trench gate structure and a method of manufacturing the semiconductor device.

DESCRIPTION OF THE RELATED ART

In general, a memory cell of such a semiconductor device as DRAM (Dynamic Random Access Memory) has a wordline making up a gate electrode of a cell transistor, a bitline so extending as to intersect the wordline, and a memory element, such as capacitor.

Known types of conventional cell transistor structures include a planar gate type, a trench gate type, and a vertical type. Patent document 1 (Japanese Patent Application Publication No. JPA 2007-287794) discloses an example of a semiconductor device including a planar gate type cell transistor (hereinafter "planar gate type semiconductor device"). Patent documents 2, 3, 4, and 5 (Japanese Patent Application Publication Nos. JPA 2012-134439, JPA 2012-248686, JPA 2013-055213, and JPA 2013-058676) disclose an example of a semiconductor device including a trench gate type cell transistor (hereinafter "trench gate type semiconductor device"). Patent documents 6 and 7 (Japanese Patent Application Publication Nos. JPA 2009-010366 and JPA 2011-205030) disclose an example of a semiconductor device including a vertical cell transistor (hereinafter "vertical-transistor-utilized semiconductor device").

SUMMARY OF THE INVENTION

In one embodiment, there is provided a semiconductor device having a memory cell that includes a semiconductor substrate, a first wordline, a first bitline, a first transistor and a first memory element. The semiconductor substrate includes a main surface, the first wordline and the first bitline are formed inside the semiconductor substrate, respectively, and the bitline is located over the first wordline. The first transistor includes a control gate connected to the first wordline and one of source and drain connected to the first bitline. The first memory element formed over the main surface of the semiconductor substrate.

In another embodiment, there is provided an apparatus that includes a substrate, a wordline and a bitline. The substrate having a main surface, the wordline buried in the substrate, and the bitline buried in a shallower area than the wordline in the substrate.

BRIEF DESCRIPTION OF THE DRAWINGS

FIG. 6a is a vertical sectional view of the semiconductor device 1 that is taken along a D-D line of FIG. 1, and FIG. 6b is a vertical sectional view of the semiconductor device 1 that is taken along an E-E line of FIG. 1.

FIG. 7a is a vertical sectional view of the semiconductor device 1 that is taken along an F-F line of FIG. 1, and FIG. 7b is a vertical sectional view of the semiconductor device 1 that is taken along a G-G line of FIG. 1.

FIG. 70b is a sectional view of the semiconductor device 1 that is taken along the A-A line of FIG. 70a.

FIG. 71b is a sectional view of the semiconductor device 1 that is taken along the A-A line of FIG. 71a.

DETAILED DESCRIPTION OF THE PREFERRED EMBODIMENTS

Preferred embodiments of the present invention will now be described in detail with reference to the accompanying drawings.

A configuration of a semiconductor device 1 according to a first embodiment of the present invention will first be described, referring to FIGS. 1 to 7.

Figure 3:
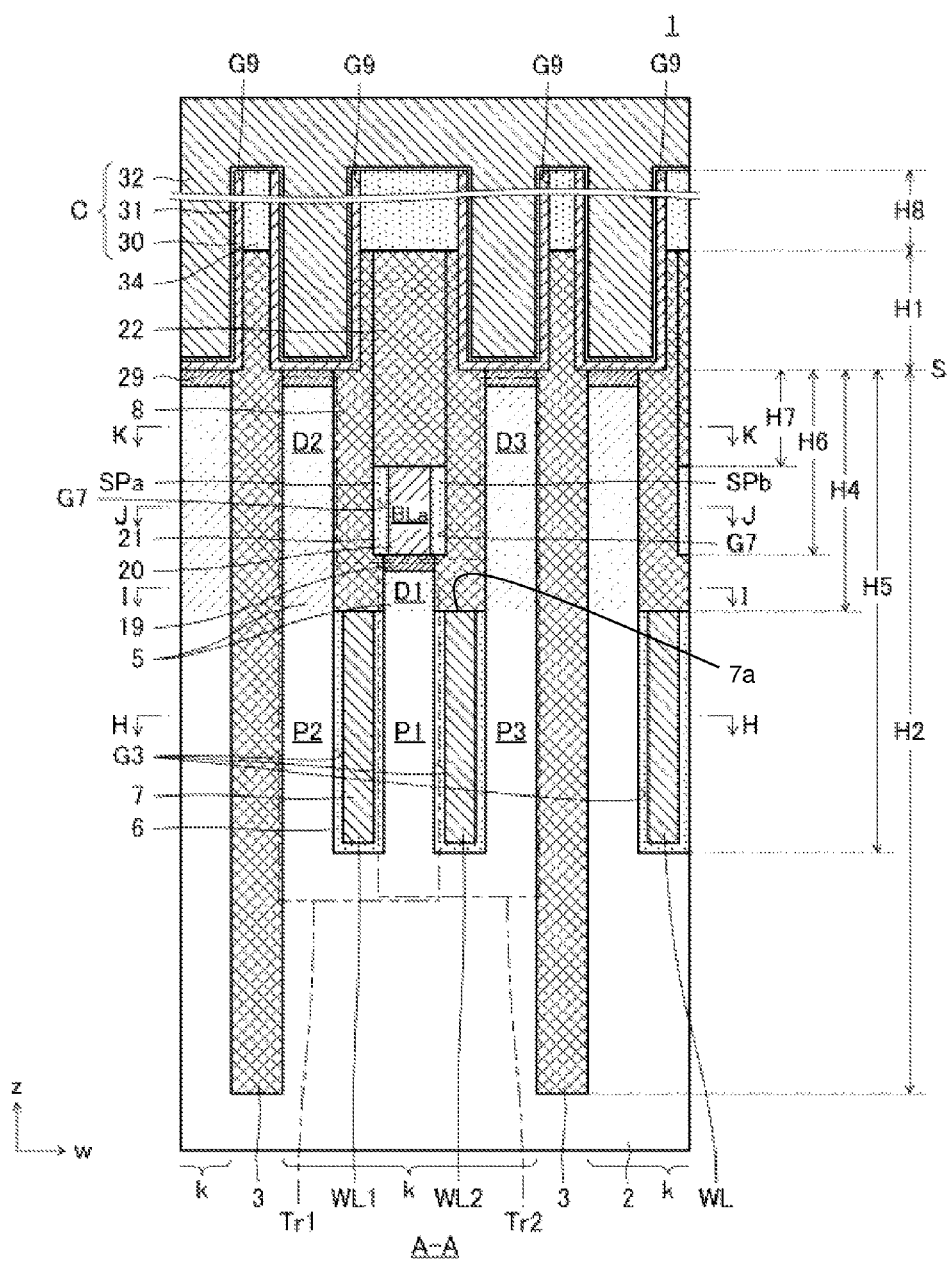
FIG. 3 is a vertical sectional view of the semiconductor device 1 that is taken along an A-A line of FIG. 1.

The semiconductor device 1 is a DRAM and includes capacitors C serving as memory elements, as shown in FIG. 3, etc. The present invention is applied not only to the DRAM but also preferably to, for example, a ReRAM (Resistance Random Access Memory) including resistance-variable elements serving as memory elements and to a PRAM (Phase Change Random Access Memory) including phase-variable elements serving as memory elements.

As shown in FIG. 3, etc., the semiconductor device 1 includes a semiconductor substrate 2, on the main surface of which a memory cell region and a peripheral circuit region are formed. The main surface S of the semiconductor substrate 2 is defined as a reference plane. The memory cell region is a region in which multiple memory cells are arranged into a matrix formation. The peripheral circuit region is a region in which circuits that control the operation of the memory cells are formed, and is formed around the memory cell region. FIGS. 1 to 7 depict only the part of the memory cell region.

In the following description, it is assumed that a lithography resolution limit, i.e., minimum processing dimension F (feature size) is 20 nm and that the semiconductor substrate 2 is made of p-type single crystal silicon. The present invention, however, is applied also to a semiconductor device manufactured by performing lithography with a minimum processing dimension F not equal to 20 nm or using a semiconductor substrate not made of the p-type single crystal silicon.

Figure 1A:
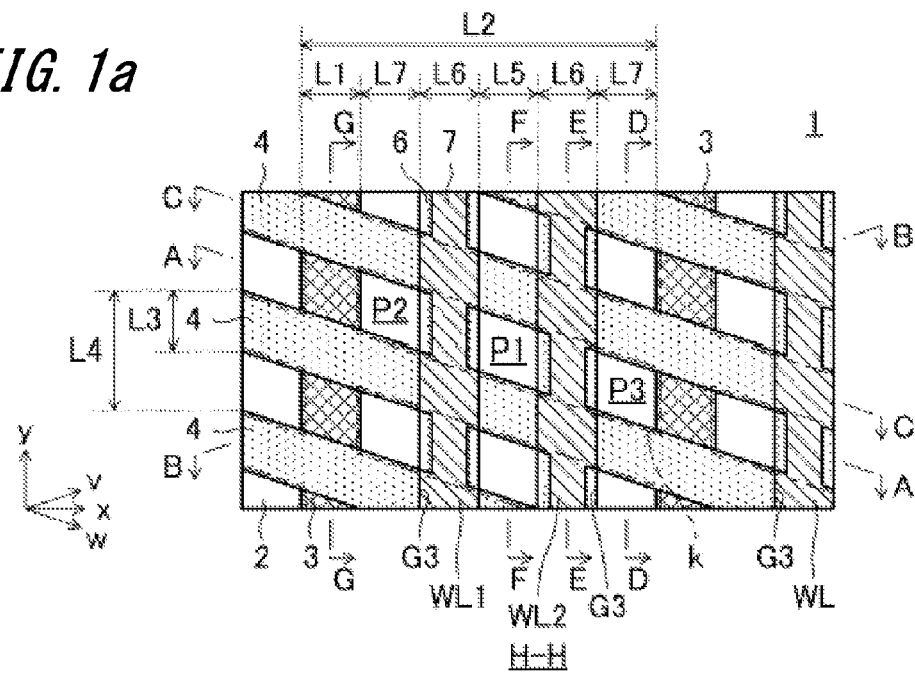
FIGS. 1a and 1b are horizontal sectional views of a semiconductor device 1 according to a preferred first embodiment of the present invention, FIG. 1a showing a sectional view taken along an H-H line of FIG. 3 while FIG. 1b showing a sectional view taken along an I-I line of FIG. 3.
Figure 1B:
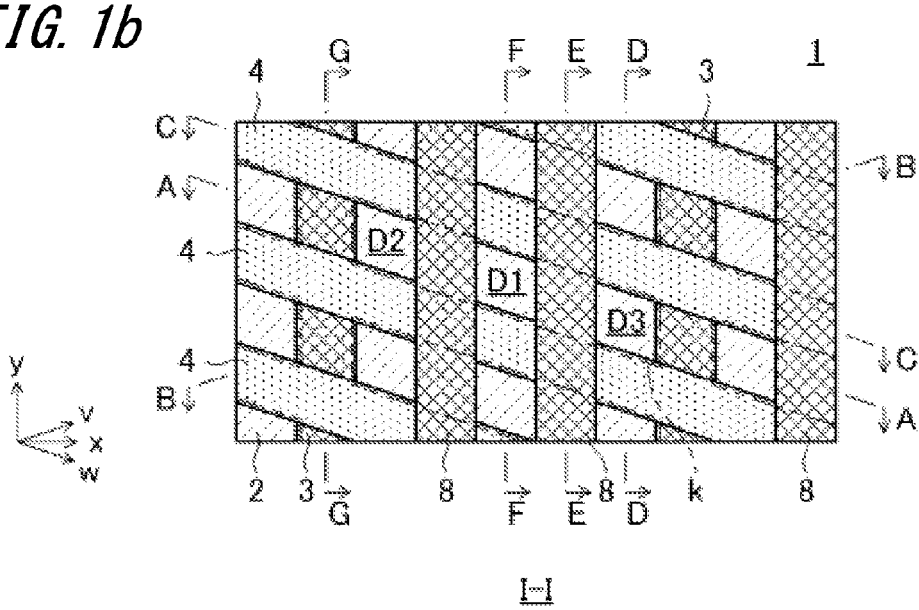

As shown in FIGS. 1a and 1b, etc., isolation dielectric films 3 (first isolation dielectric film) are buried in the semiconductor substrate 2 such that the isolation dielectric films 3 extending in the y direction (first direction) are arranged repeatedly in the x direction (third direction) perpendicular to the y direction. The isolation dielectric films 3 are made of a silicon nitride film and make up an isolation region formed by a so-called STI (Shallow Trench Isolation) method. It is preferable that the width L1 in the x direction of each isolation dielectric film 3 be 20 nm, which is equal to the minimum processing dimension F, and that the arrangement pitch L2 in the x direction of the isolation dielectric films 3 be 120 nm, which is 6 times as large as the minimum processing dimension F.

Isolation dielectric films 4 (second isolation dielectric film) are also buried in the semiconductor substrate 2 such that the isolation dielectric films 4 extending in a w direction (second direction) inclined negativewise against the x direction are arranged repeatedly in the y direction. The isolation dielectric films 4 are made of a silicon oxide film and together with the isolation dielectric films 3, make up the isolation region formed by the STI method. It is preferable that the width L3 in the y direction of each isolation dielectric film 4 be 20 nm and that the arrangement pitch L4 in the y direction of the isolation dielectric films 4 be 40 nm, which is 2 times as large as the minimum processing dimension F.

The reason for selecting the silicon nitride film and the silicon oxide film as the materials of the isolation dielectric film 3 and the isolation dielectric film 4, respectively, which reason will be mentioned again in description of a method of manufacturing the semiconductor device 1, is that adopting different etching rates for these different materials (ensuring an etching selection ratio) in manufacturing processes for the semiconductor device 1 is preferable.

The above isolation dielectric films 3 and 4 define multiple active areas k into a matrix formation on the main surface S of the semiconductor substrate 2. As shown in FIGS. 1a and 1b, each active area k is defined into a parallelogram having one pair of opposed sides parallel with the w direction and the other pair of opposed sides parallel with the y direction. It can be understood from FIG. 1a that the width in the x direction of each active area k is equal to L2−L1=5F. The active areas k are arranged such that they are lined up in the x direction, in the y direction, and in the w direction.

As shown in FIGS. 1a and 3, multiple wordline trenches G3 extending in the y direction parallel with each other are formed on the semiconductor substrate 2. The wordline trenches G3 are arranged such that two wordline trenches G3 pass through each of multiple active areas k lined up in the y direction. As a result, the semiconductor substrate 2 and the isolation dielectric film 4 are exposed alternately on the inner side faces and bottom face of each wordline trench G3, as shown in FIGS. 1a and 6b.

It is preferable that the width L6 in the x direction of each wordline trench G3 be 20 nm equal to the minimum processing dimension F, and that the separation distance L7 between each wordline trench G3 and the isolation dielectric film 3 adjacent thereto be also 20 nm equal to the minimum processing dimension F. It is understood from FIG. 1a that by determining the width L6 and the separation distance L7 in this manner, the separation distance L5 in the x direction between two wordline trenches G3 passing through one active area k is also determined to be 20 nm equal to the minimum processing dimension F (L5=L2−L1−2*L6−2*L7).

A conductive film 7 is buried in a lower part of each wordline trench G3 with a gate dielectric film 6 interposed between the conductive film 7 and the inner surface of the wordline trench G3. The gate dielectric film 6 is, for example, a silicon oxide film of 4 nm in thickness, and the conductive film 7 is, for example, made of a metal, such as titanium nitride (TiN) and tungsten (W). As shown in FIGS. 1a and 6b, etc., the gate dielectric film 6 is not formed on a part where the isolation dielectric film 4, i.e., silicon oxide film, is exposed on the inner surface of the wordline trench G3. The conductive film 7 buried in the wordline trenches G3 makes up multiple wordlines WL including wordlines WL1 and WL2 (first and second wordlines) shown in FIG. 1a, etc. Each of wordlines are extending in the y direction parallel with each other and having a upper surface 7a. A first cap dielectric film 8 made of a silicon nitride film is buried in an upper part of the each wordline trench G3, where the upper surface of each wordline WL 7a is covered with the first cap dielectric film 8. The wordlines are formed inside the semiconductor substrate 2.

As shown in FIG. 3, each active area k is divided by the corresponding two wordline trenches G3 into three subareas. Of three subareas, the subarea sandwiched between the corresponding two wordline trenches G3 makes up a semiconductor pillar P1, on top of which a diffusion layer D1 (first diffusion layer) is formed. The diffusion layer D1 is composed of an impurity diffusion layer 5 formed by implanting n-type impurity ions into the semiconductor substrate 2 and a metal silicide layer 19 formed by causing the upper part of the impurity diffusion layer 5 to react with a metal, such as cobalt (Co) and titanium (Ti).

The subarea located opposite to the semiconductor pillar P1 across the wordline WL1 makes up a semiconductor pillar P2, on top of which a diffusion layer D2 (second diffusion layer) is formed. Likewise, the subarea located opposite to the semiconductor pillar P1 across the wordline WL2 makes up a semiconductor pillar P3, on top of which a diffusion layer D3 (third diffusion layer) is formed. Similar to the diffusion layer D1, each of the diffusion layers D2 and D3 is composed of the impurity diffusion layer 5 formed by implanting n-type impurity ions into the semiconductor substrate 2 and a metal silicide layer 29 formed by causing the upper part of the impurity diffusion layer 5 to react with a metal, such as cobalt and titanium.

It is understood from FIG. 1a that the width in the x direction of the semiconductor pillar P1 (diffusion layer D1) is equal to the above separation distance L5, while the width in the x direction of the semiconductor pillar P2 (diffusion layer D2) and the same of the semiconductor pillar P3 (diffusion layer D3) are each equal to the above separation distance L7.

In the configuration described above, the wordline WL1, the semiconductor pillars P1 and P2, and the diffusion layers D1 and D2 combine to make up an n-channel MOS transistor Tr1 (first transistor), as shown in FIG. 3. The wordline WL1 serves as a control electrode of the transistor Tr1, and the diffusion layers D1 and D2 serve as one and the other of source and drain of the transistor Tr1, respectively. The channel of the transistor Tr1 is formed in a region in semiconductor substrate 2 that is around the wordline WL1.

The wordline WL2, the semiconductor pillars P1 and P3, and the diffusion layers D1 and D3 combine to make up an n-channel MOS transistor Tr2 (second transistor). The wordline WL2 serves as a control electrode of the transistor Tr2, and the diffusion layers D1 and D3 serve as one and the other of source and drain of the transistor Tr2, respectively. The channel of the transistor Tr2 is formed in a region in semiconductor substrate 2 that is around the wordline WL2.

It is understood from the above description that one transistor Tr1 and one transistor Tr2 are constructed in each active area k. The diffusion layer D1 in each active area k makes up the common source and drain shared by the corresponding transistors Tr1 and Tr2.

The locations of the above constituent elements in the vertical direction (direction of a normal to the main surface S of the semiconductor substrate 2) will be described, referring to FIGS. 3 and 4. In the following description, the main surface S of the semiconductor substrate 2 is defined as a reference plane based on which the vertical locations of constituent elements are explained.

As shown in FIG. 3, each isolation dielectric film 3 is formed such that its upper surface is located higher than the main surface S by a height H1 while its lower surface is located lower than the main surface S by a depth H2. The height H1 is, for example, 50 nm, and the depth H2 is, for example, 300 nm. As shown in FIG. 4, each isolation dielectric film 4 is formed such that its upper surface is located lower than the main surface S by a depth H6 while its lower surface is located lower than the main surface S by a depth H3. The depth H3 is, for example, 250 nm, and the depth H6 is, for example, 75 nm.

As shown in FIG. 3, the wordline WL is formed such that its upper surface 7a is located lower than the main surface S by a depth H4 while its lower surface is located lower than the main surface S by a depth H5. The depth H4 is, for example, 100 nm, and the depth H5 is, for example, 200 nm. The cap dielectric film 8 covering the upper surface 7a of the wordline WL is formed such that the upper surface of the first cap dielectric film 8 is located higher than the main surface S by the height H1. The upper surface of the first cap dielectric film 8 is, therefore, flush with the upper surface of the isolation dielectric film 3.

The diffusion layer D1 is formed such that its upper surface is located lower than the main surface S by the depth H6 while its lower surface is located lower than the main surface S by the depth H4. The upper surface of the diffusion layer D1 is, therefore, flush with the upper surface of the isolation dielectric film 4. The lower surface of the diffusion layer D1 and the upper surface 7a of the wordline WL are located at the same depth level. The diffusion layers D2 and D3 are formed such that their upper surfaces are located on the main surface S while their lower surfaces are located lower than the main surface S by the depth H4, which means that the diffusion layers D2 and D3 are formed to be higher than the diffusion layer D1. The lower surfaces of the diffusion layers D2 and D3 are flush with the lower surface of the diffusion layer D1.

Figure 2A:
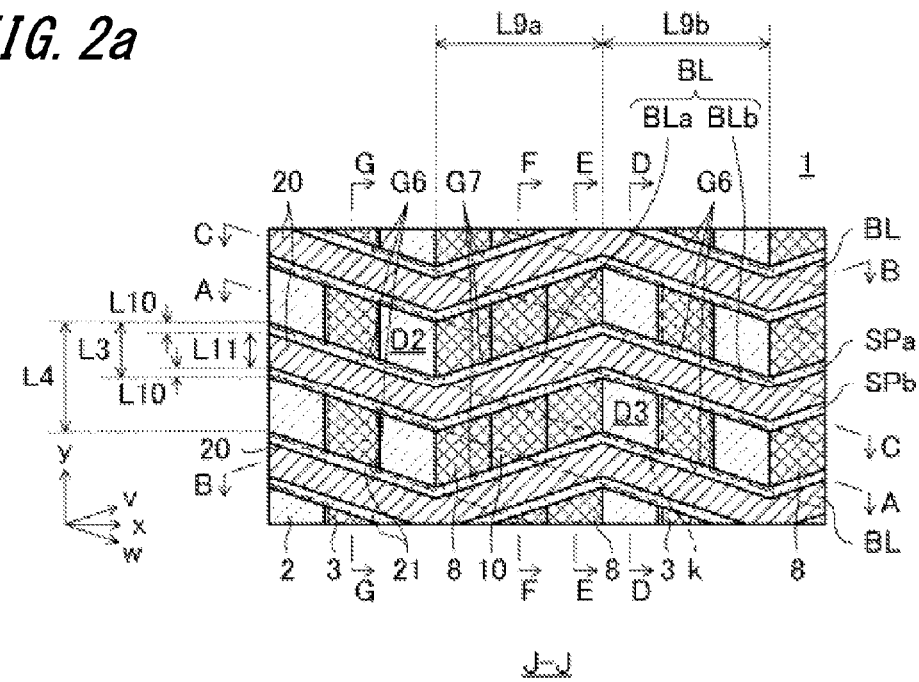
FIG. 2a is a horizontal sectional view of the semiconductor device 1 that is taken along a J-J line of FIG. 3.

As shown in FIG. 2a, multiple bitline trenches G6 and G7 are formed also on the semiconductor substrate 2. As shown in FIG. 3, these bitline trenches G6 and G7 are formed such that their bottoms are located lower than the main surface S by the depth H6 (i.e., located flush with the upper surface of the diffusion layer D1). The lower surfaces of the bitline trenches G6 and G7 are, therefore, above the wordline WL.

Each bitline trench G6 extends in the w direction and, in a plan view, is identical in shape and location with the part of isolation dielectric film 4 that is sandwiched between two wordlines WL adjacent to each other across the isolation dielectric film 3. The width in the y direction of each bitline trench G6 is, therefore, equal to the width L3 in the y direction of the isolation dielectric film 4. The arrangement pitch in the y direction of the bitline trenches G6 is also equal to the arrangement pitch L4 in the y direction of the isolation dielectric films 4.

Each bitline trench G7 extends in a v direction (fourth direction) inclined positivewise against the x direction, and, in a plan view, is placed in a region made up of two wordlines WL corresponding to the same active area k and a space between the wordlines WL, for each active area k. Each bitline trench G7, specifically, is located such that it intersects the corresponding active area k at its center. At the bottom of the bitline trench G7, the diffusion layer D1 in the corresponding active area k is exposed. The bitline trenches G7 are identical in width and arrangement pitch with the bitline trenches G6, thus having the width L3 and the arrangement pitch L4. Each pair of bitline trenches G6 and G7 adjacent to each other in the x direction are connected to each other. Hence, as shown in FIG. 2a, a snaking trench extending in the x direction as a whole is formed. The bitline trenches G6 and G7 having one of inner side face and other of inner side face opposing to the one of inner side face in the y direction.

A bitline spacer SPa is formed on the one inner side face of each of the bitline trenches G6 and G7, while a bitline spacer SPb is formed on the other inner side face of the same. Each of the bitline spacers SPa and SPb is a silicon oxide film 21 formed into a side wall shape, thus covering the whole of the corresponding inner side faces. It is preferable that the width L10 in the y direction of each of the bitline spacers SPa and SPb be ⅒ to ¼ of the minimum processing dimension F (i.e., 2 to 5 nm), or more preferably, be 4 nm. As shown in FIG. 3, each of the bitline spacers SPa and SPb is formed such that its uppers surface is located lower than the main surface S by a depth H7. The depth H7 is determined to be 10 nm to 50 nm, preferably, to be 40 nm.

The bitline BL is disposed in the in-trench region lying between the bitline spaces SPa and SPb. To put it another way, the bitline spacers SPa and SPb are arranged between the inner side faces of the bitline trenches G6 and G7 and the side faces of the bitline BL, respectively. The width L11 in the y direction of the bitline BL is given by subtracting a value two times the width L10 in the y direction of the bitline spacers SPa from the width L3 in the y direction of the bitline trenches G6 and G7. For example, if the widths L3 and L10 are 20 nm and 4 nm, respectively, the width L11 is determined to be 12 nm. The upper surface of the bitline BL is located lower than the main surface S by the depth H7, as the upper surfaces of the bitline spacers SPa and SPb are. The lower surface of the bitline BL is located upper than the upper surface 7a of the wordline WL and connected to an upper surface of the first diffusion layer D1. The upper part of the bitline trenches G6 and G7 is filled with a second cap dielectric film 22 made of a silicon nitride film, so that the upper surface of the bitline BL is covered with the second cap dielectric film 22. As shown in FIG. 3, the upper surface of the second cap dielectric film 22 is located higher than the main surface S by the height H1. The upper surface of the second cap dielectric film 22 is, therefore, flush with the upper surface of the isolation dielectric film 3.

The bitline BL is composed of a lamination of a titanium nitride film serving as a barrier film and a tungsten film serving as a low-resistance conductive film. The above metal silicide film 19 is provided in order to reduce the contact resistance between silicon (diffusion layer D1) and the bitline BL composed of such metal films.

Because the bitline trenches G6 and G7 make up the above snaking trench, the bitline BL has a snaking structure. Specifically, as shown in FIG. 2a, the bitline BL has such a shape that multiple intersect line portions BLa extending in the v direction and multiple parallel line portions BLb extending in the w direction are connected together in series in the x direction such that the intersect line portions BLa and parallel line portions BLb are arranged alternately in the snaking structure.

Figure 4:
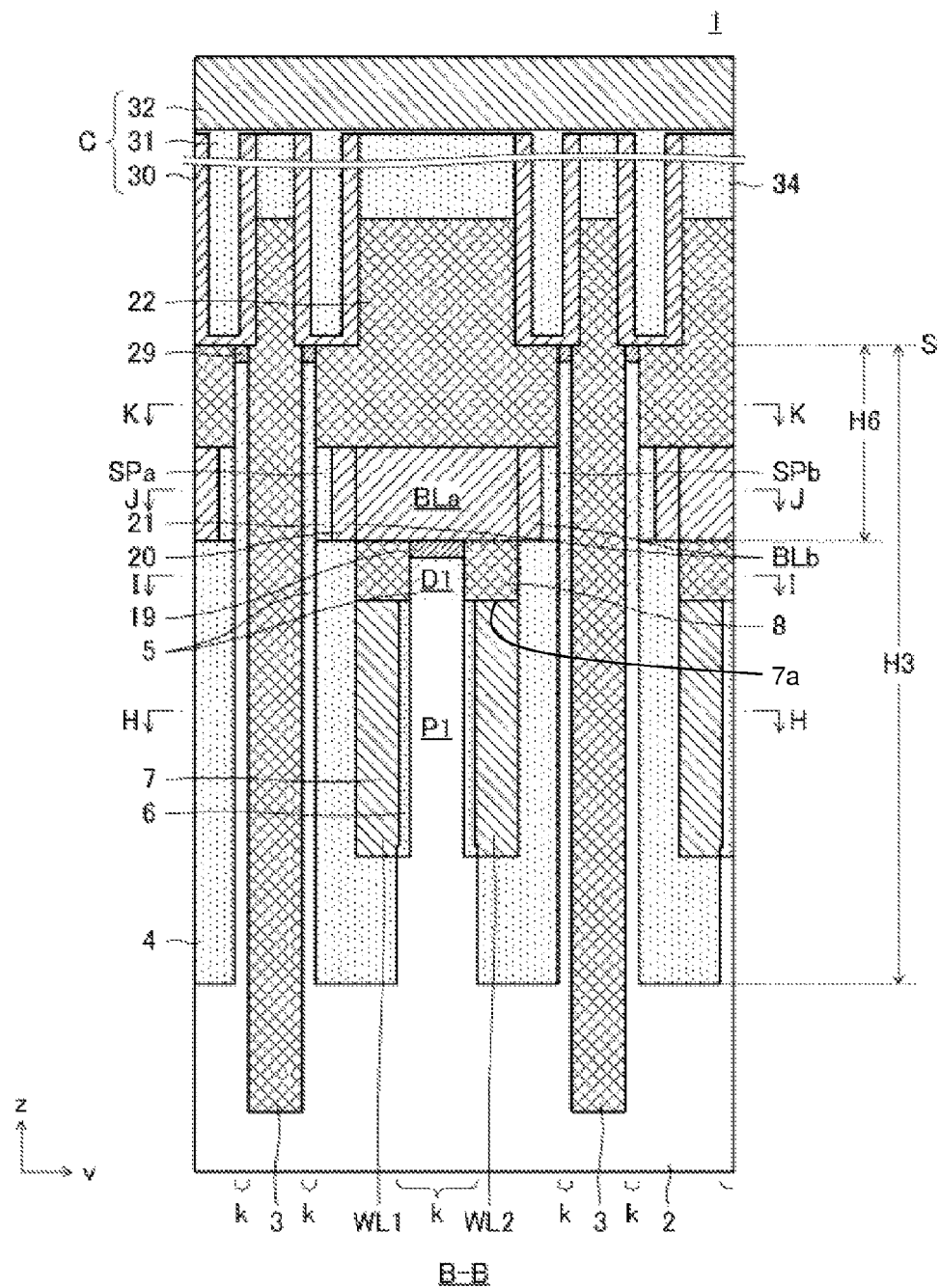
FIG. 4 is a vertical sectional view of the semiconductor device 1 that is taken along a B-B line of FIG. 1.

Each intersect line portion BLa is so disposed as to intersect the corresponding active area k, and is, as shown in FIGS. 3, 4, and 7a, in contact with the diffusion layer D1 exposed at the bottom of the bitline trench G7. Through this contact, each bitline BL is electrically connected to each of the multiple diffusion layers D1 arranged in the x direction. The width L9a in the x direction of each intersect line portion BLa (FIG. 2a) is a value (60 nm) given by adding the width L5 of the diffusion layer D1 to a value two times the width L6 in the x direction of the wordline trench G3.

Figure 5:
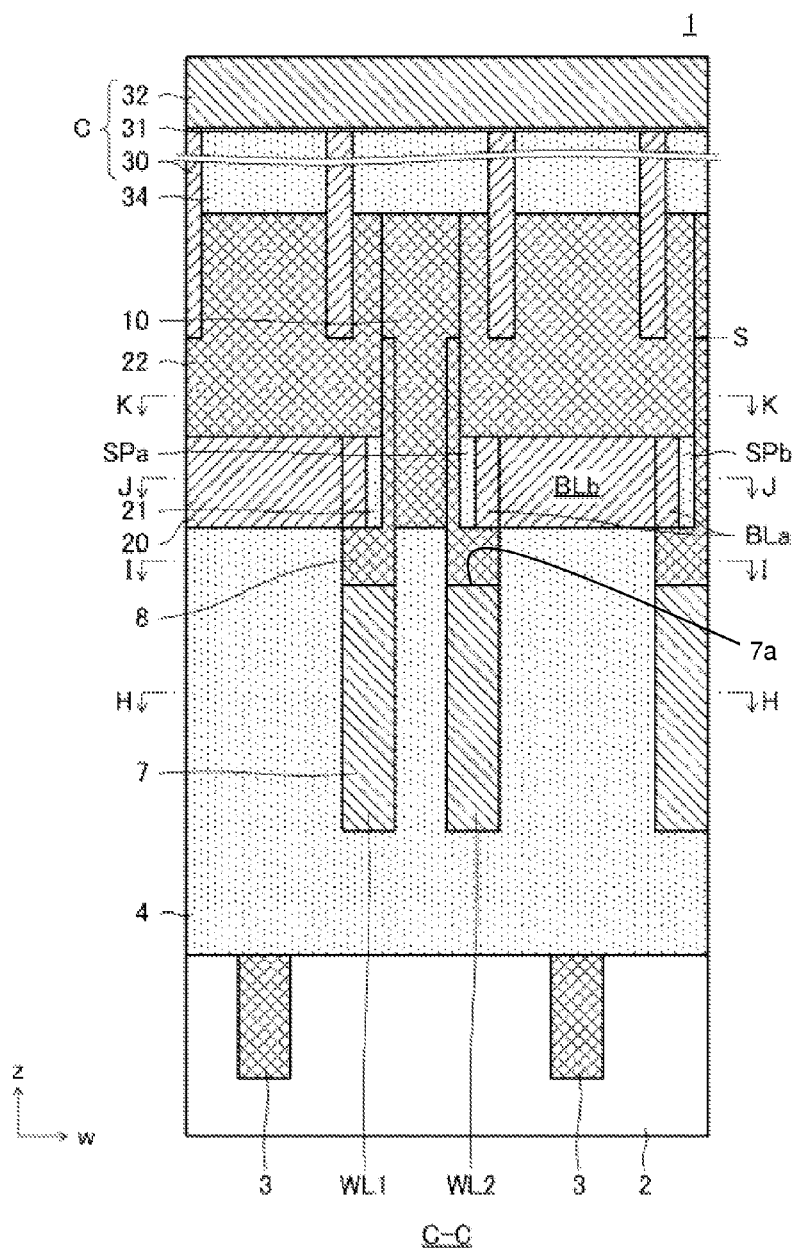
FIG. 5 is a vertical sectional view of the semiconductor device 1 that is taken along a C-C line of FIG. 1.

As shown in FIGS. 5, 6a, and 7b, each parallel line portion BLb is so disposed as to overlap the isolation dielectric film 4. The width L9b in the x direction of each parallel line portion BLb (FIG. 2b) is a value (60 nm) given by adding a value two times the width L7 in the x direction of each of the diffusion layers D2 and D3 to the width L1 in the x direction of the isolation dielectric film 3. The intersect line portion BLa and the parallel line portion BLb adjacent to each other are axisymmetric with respect to a virtual line extending in the y direction along the boundary between the intersect line portion BLa and the parallel line portion BLb.

As shown in FIG. 2, each parallel line portion BLb is so disposed as to pass through the diffusion layers D2 and D3. As shown in FIGS. 2a and 6a, only the bitline spacers SPa and SPb insulate each parallel line portion BLb from the diffusion layers D2 and D3. As a result, a parasitic capacitor with the bitline spacers SPa and SPb serving as a capacitor dielectric film is formed between the diffusion layers D2 and D3 and each parallel line portion BLb. According to the conventional trench gate type semiconductor device, as described above, a dielectric film between a bitline and a conductive layer (memory element contact plug) adjacent thereto is a silicon nitride film with a relatively large dielectric constant, which poses a problem that a parasitic capacitance formed between the bitline and the conductive layer turns out be large. According to the semiconductor device 1, however, the bitline spacers SPa and SPb are made of the silicon oxide film having a dielectric constant smaller than that of the silicon nitride film, in which case, compared to the conventional trench gate type semiconductor device, the parasitic capacitance formed between each parallel line portion BLb and the conductive layer (diffusion layers D2 and D3) adjacent thereto is reduced.

As shown in FIGS. 2a, 2b, 5, and 7a, a protective dielectric film 10, which is a silicon nitride film, is disposed between two intersect line portions BLa adjacent to each other in the y direction. The protective dielectric film 10 is a dielectric film formed by manufacturing processes to be described later (see FIGS. 26 to 30) such that it extends in the y direction in the region between the wordline WL1 and the wordline WL2 to cover the diffusion layers D1 and isolation dielectric films 4 arranged alternately in the y direction. The part of protective dielectric film 10 that is formed right above the diffusion layers D1 is eliminated when the bitline trench G7 is formed, and therefore does not remain in the completed semiconductor device 1. As shown in FIG. 7a, the protective dielectric film 10 is formed such that its upper surface is located higher than the main surface S by the height H1 and its lower surface is located lower than the main surface S by the depth H6.

It is understood from the above description that the semiconductor device 1 has a silicon nitride film layer near the surface of the semiconductor substrate 2, which silicon nitride film layer is composed of the isolation dielectric film 3, the first cap dielectric film 8, the second cap dielectric film 22, and protective dielectric film 10. The bitline trenches G6 and G7 are trenches formed on this silicon nitride film layer, in which the silicon nitride film is exposed on the inner surfaces of the bitline trenches G6 and G7 except the part where the diffusion layers D2 and D3 are exposed. This allows the bitline spacers SPa and SPb to be made from the silicon oxide film. The diffusion layers D2 and D3 make up conductive layers (first and second conductive layers) extending vertically in the silicon nitride film layer.

Figure 2B:
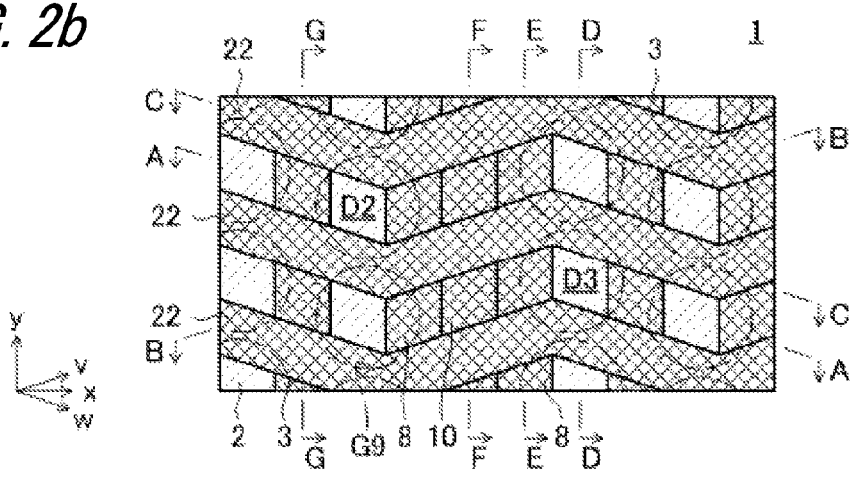
FIG. 2b is a horizontal sectional view of the semiconductor device 1 that is taken along a K-K line of FIG. 3.

The above silicon nitride film layer has a flattened upper surface, which is, as shown in FIG. 3, covered with a cylinder dielectric film 34 with a film thickness H8, which is, for example, 1500 nm. As shown in FIGS. 2b and 3, multiple cylinder holes G9 are formed on the cylinder dielectric film 34. The multiple cylinder holes G9 are formed such that each cylinder hole G9 corresponds to each of the diffusion layers D2 and D3 and that each cylinder hole G9 penetrates not only the cylinder dielectric film 34 but also the part of silicon nitride film layer that is on the upper surface of each of the corresponding diffusion layers D2 and D3. At the bottom of each cylinder hole G9, therefore, the upper surface of each of the corresponding diffusion layers D2 and D3 is exposed.

These cylinder holes G9 are provided in order to form multiple capacitors C including a capacitor C (first memory element) that is combined with a transistor Tr1 to make up a memory cell and a capacitor C (second memory element) that is combined with a transistor Tr2 to make up a memory cell. Specifically, in each cylinder hole G9, a lower electrode 30 for each capacitor C is formed, which lower electrode 30 is overlaid with a capacitor dielectric film 31 and an upper electrode 32 that are common to each capacitor C.

More specifically, the lower electrode 30 functions as an independent unit in each cylinder hole G9 and is so formed as to cover the inner surface of the corresponding cylinder hole G9. The lower surface of the lower electrode 30 is in contact with the upper surface of the corresponding diffusion layer D2 or D3 and is therefore connected to the other of source and drain of the corresponding transistor. It is preferable that the lower electrode 30 be made of a metal compound, such as titanium nitride. The metal silicide film 29 mentioned above is provided in order to reduce the contact resistance between the lower electrode 30, i.e., a metal compound, and the silicon (diffusion layers D2, D3).

Following formation of the lower electrode 30, the capacitor dielectric film 31 is formed as a thin film covering the exposed surface of the lower electrode 30 and of the cylinder dielectric film 34. Following formation of the capacitor dielectric film 31, the upper electrode 32 is formed such that it fills up each cylinder hole G9 and yet leaves a portion with a given thickness on top of the cylinder hole G9. The capacitor dielectric film 31 and upper electrode 32 formed in such a manner are common to each capacitor C.

As described above, according to the semiconductor device 1 of the first embodiment, the bitline BL is placed in the bitline trenches G6 and G7 formed on the silicon nitride film layer. The bitline BL is formed inside the semiconductor substrate 2. The bitline BL is located between the upper surface 7a of the wordline WL and the main surface S of the semiconductor substrate in the direction of a normal to the main surface S. Therefore, the upper surface of the bitline BL is positioned lower than the main surface S and the lower surface of the bitline is positioned upper than the upper surface 7a of the wordline WL and connected to the upper surface of the first diffusion layer D1. In this structure, the diffusion layers D2 and D3 and the bitline BL can be insulated from each other via the bitline spacers made of the silicon oxide film with a dielectric constant smaller than that of the silicon nitride film. As a result, the parasitic capacitance formed between the bitline and the diffusion layers D2 and D3 is reduced. This contributes to realization of the faster operation of the semiconductor device 1. Even if part of the diffusion layers D2 and D3 is replaced with a metal contact plug, extra room can be added to a space for placing the contact plug. An example in which the diffusion layers D2 and D3 are partially replaced with such a contact plug is included in a third embodiment, which will be described later.

According to the semiconductor device 1 of the first embodiment, the bitline BL and capacitor C are both arranged above the wordline WL. This allows the bitline BL to be formed without difficulty, as in the case of the conventional trench gate type semiconductor device. Compared to a vertical-transistor-utilized semiconductor device in which the bitline BL is located below the wordline WL, therefore, the semiconductor device 1 of the first embodiment offers higher production yield.

Because the bitline BL is buried in a location lower than the upper surfaces of the diffusion layers D2 and D3 (that is, the upper surface of the bitline BL is located lower than the main surface S), according to the semiconductor device 1 of the first embodiment, providing the above memory element contact plug is unnecessary. Different from the case of the above trench gate type semiconductor device, therefore, the semiconductor device 1 of the first embodiment does not pose a problem that the memory element contact plug cannot be placed at the center of the upper surface of each of the diffusion layers D2 and D3. A problem of an increase in contact resistance between the capacitor C and the diffusion layers D2 and D3, therefore, does not arise.

In addition, according to the semiconductor device 1 of the first embodiment, arrangement of the lower electrodes 30 is not hampered by the bitline BL. As shown in FIG. 2b, therefore, the lower electrodes 30 can be arranged in a close-packed structure, which allows enlargement of the surface area of the capacitor C, thus allowing an increase in the capacitance of the capacitor C.

Figure 8:
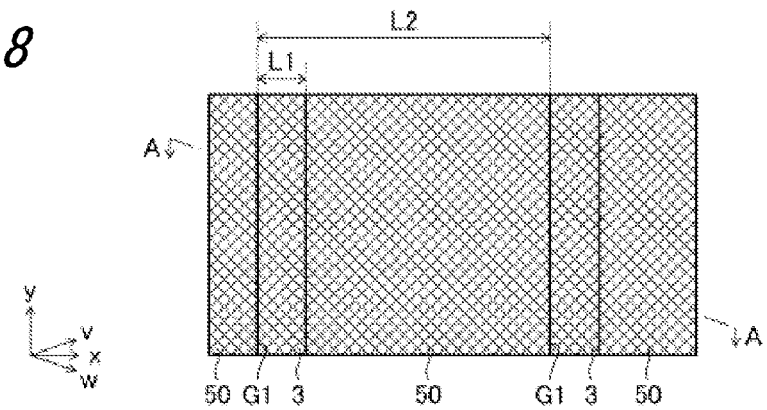
FIG. 8 is a top view of the semiconductor device 1 according to the preferred first embodiment of the present invention during a manufacturing process.
Figure 65:
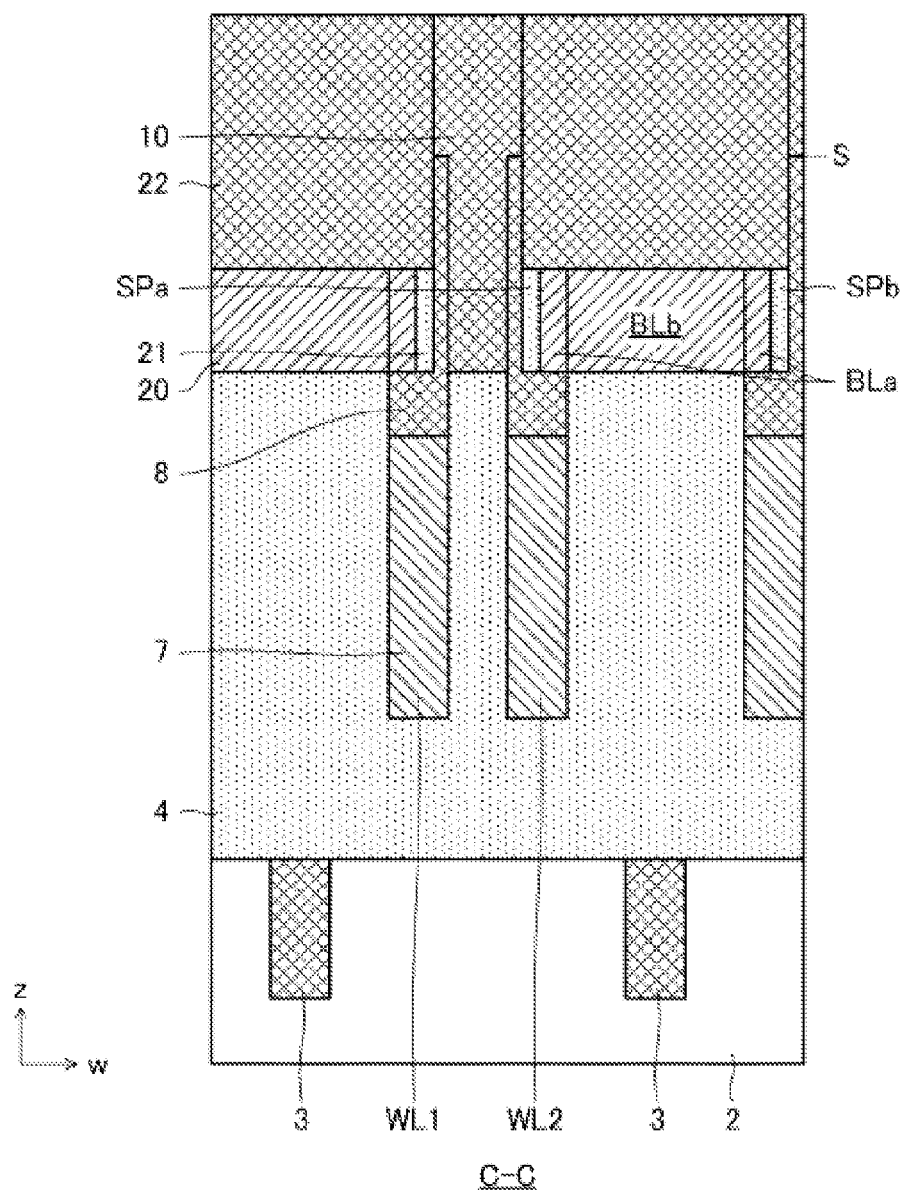
FIG. 65 is a vertical sectional view of the semiconductor device 1 that is taken along a C-C line of FIG. 62.

A method of manufacturing the semiconductor device 1 will then be described, referring to FIGS. 8 to 65.

Figure 9:
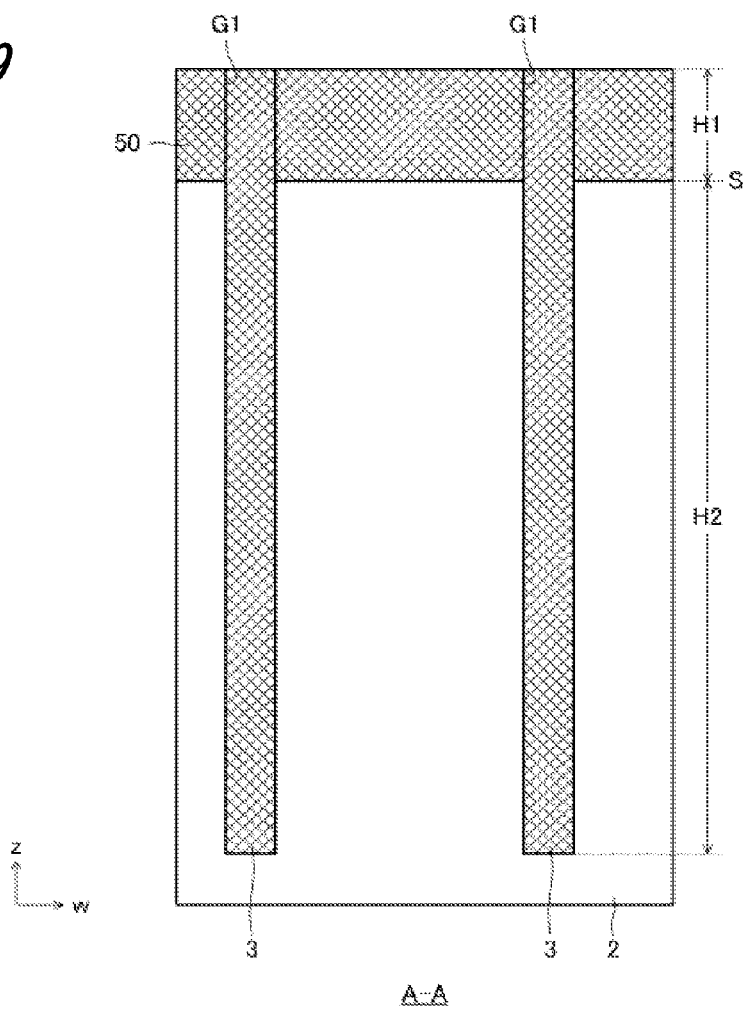
FIG. 9 is a vertical sectional view of the semiconductor device 1 that is taken along an A-A line of FIG. 8.

As shown in FIGS. 8 and 9, a hard mask film (mask film) 50 made of a silicon nitride film with a thickness H1 (50 nm) is formed on the main surface S of the semiconductor substrate 2. On the upper surface of the hard mask film 50, a photoresist (not depicted) is deposited, on which openings equivalent to regions for forming the isolation dielectric film 3 are formed by lithography. These openings are extended in the y direction (first direction) and are arranged repeatedly in the x direction. A film of a multi-mask structure including an amorphous carbon film, etc., may be used in place of the photoresist. This applies also to the lithographic step carried out in other processes.

Subsequently, the openings of the photoresist are transferred to the hard mask film 50 by anisotropic dry etching. As a result, isolation trenches G1 (first isolation trench) are formed on the hard mask film 50. The photoresist is then eliminated. Subsequently, the semiconductor substrate 2 made of silicon is etched by anisotropic dry etching using the hard mask film 50 as a mask, to extend the isolation trenches G1 into the semiconductor substrate 2. The depth H2 of each isolation trench G1 from the main surface S is determined to be, for example, 300 nm. The width L1 in the x direction of the isolation trench G1 is determined to be, for example, 20 nm. The arrangement pitch L2 of the isolation trenches G1 in the x direction is determined to be, for example, 120 nm.

The anisotropic dry etching according to the first embodiment is an etching method by which a bias voltage is applied to a fluorine-containing plasma or chlorine-containing plasma generated by high-frequency excitation to cause fluorine ions, chlorine ions, etc., in the plasma to fall vertically onto the surface of the semiconductor substrate 2 so that a layer to be etched below the surface is etched into exactly the same pattern as the plane pattern of the mask. Dry etching in its simple terminology, however, includes isotropic etching by which a pattern exactly the same as a mask pattern is not always formed. According to this embodiment, various films made of different materials, such as silicon oxide film, silicon nitride film, and silicon film making up the semiconductor substrate 2, are etched. In the etching process, either selective etching or isotropic etching is adopted properly according to the composition of gases making up the above plasma and control over pressure, high-frequency power, etc.

Subsequently, as the hard mask 50 is left as it is, a silicon nitride film of 50 nm in thickness is formed across the whole surface such that the silicon nitride film fills up the isolation trenches G1. It is preferable that the silicon nitride film be formed by known CVD or ALD. Subsequently, out of the silicon nitride film formed in such a manner, the silicon nitride film deposited on the upper surface of the hard mask film 50 is eliminated by known CMP or dry etching. In this process, the silicon nitride film is eliminated such that its upper surface is located higher than the main surface S by the height H1, which is determined to be, for example, 50 nm. Hence the isolation dielectric film 3 (first isolation dielectric film) is buried in the isolation trenches G1, as a result of which isolation areas extending in the y direction are formed.

Figure 10:
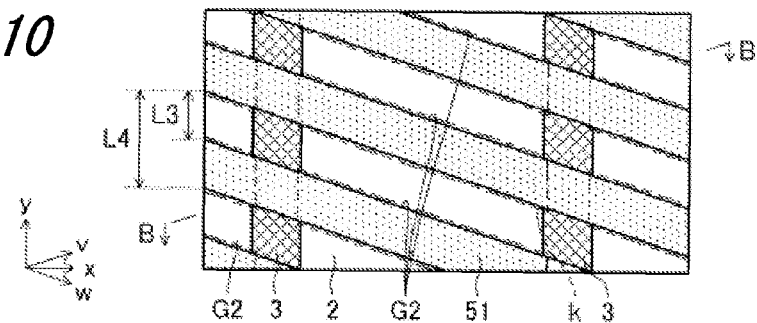
FIG. 10 is a top view of the semiconductor device 1 during a manufacturing process (which follows the process indicated in FIG. 8).
Figure 11:
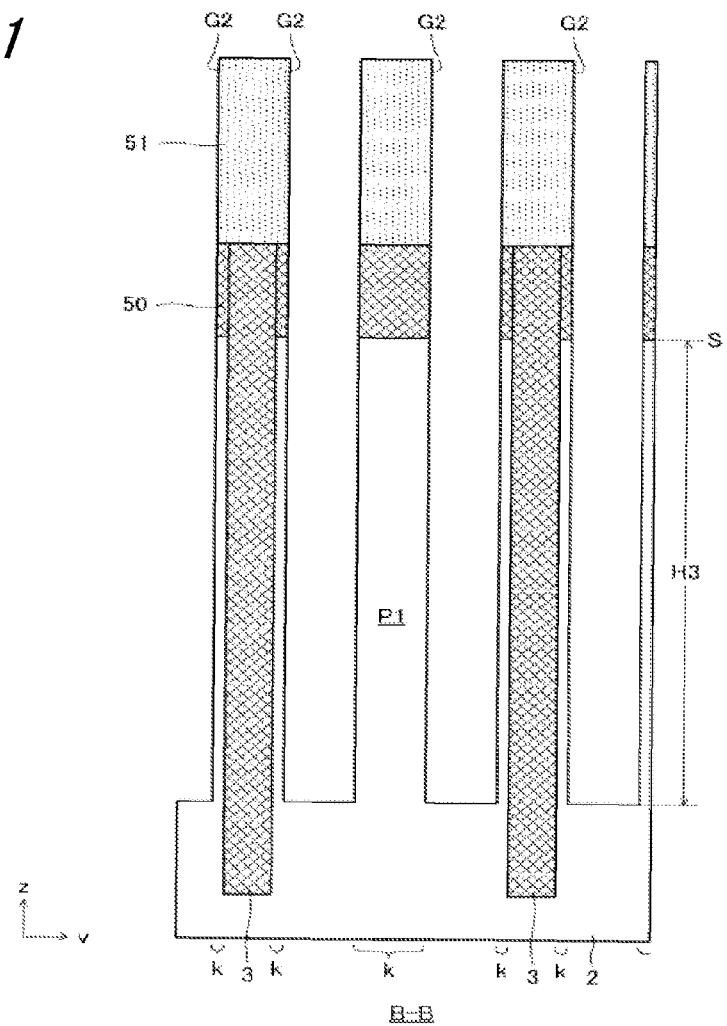
FIG. 11 is a vertical sectional view of the semiconductor device 1 that is taken along a B-B line of FIG. 10.

Subsequently, as shown in FIGS. 10 and 11, a hard mask film 51 made of a silicon oxide film of 100 nm in thickness is formed across the whole surface. On the upper surface of the hard mask film 51, a photoresist (not depicted) is deposited, on which openings equivalent to regions for forming the isolation dielectric film 4 are formed by lithography. These openings are extended in the w direction (second direction) and are arranged repeatedly in the y direction.

Subsequently, the openings of the photoresist are transferred to the hard mask film 51 by anisotropic dry etching. As a result, isolation trenches G2 (second isolation trench) are formed on the hard mask film 51. The photoresist is then eliminated. Subsequently, the semiconductor substrate 2 made of the silicon and the isolation dielectric film 3 made of the silicon nitride film are etched at a constant etching rate by anisotropic dry etching using the hard mask film 51 as a mask, to extend the isolation trenches G2 into the semiconductor substrate 2. The depth H3 of each isolation trench G2 from the main surface S is determined to be, for example, 250 nm. The width L3 in the y direction of the isolation trench G2 is determined to be, for example, 20 nm. The arrangement pitch L4 of the isolation trenches G2 in the y direction is determined to be, for example, 40 nm. By the processes described so far, the active areas k are demarcated by the isolation trenches G1 and G2.

Figure 12:
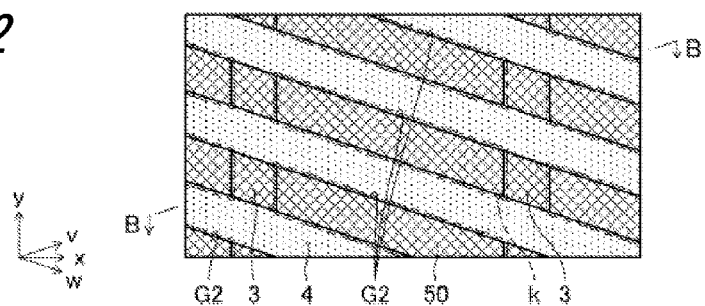
FIG. 12 is a top view of the semiconductor device 1 during a manufacturing process (which follows the process indicated in FIG. 10).
Figure 13:
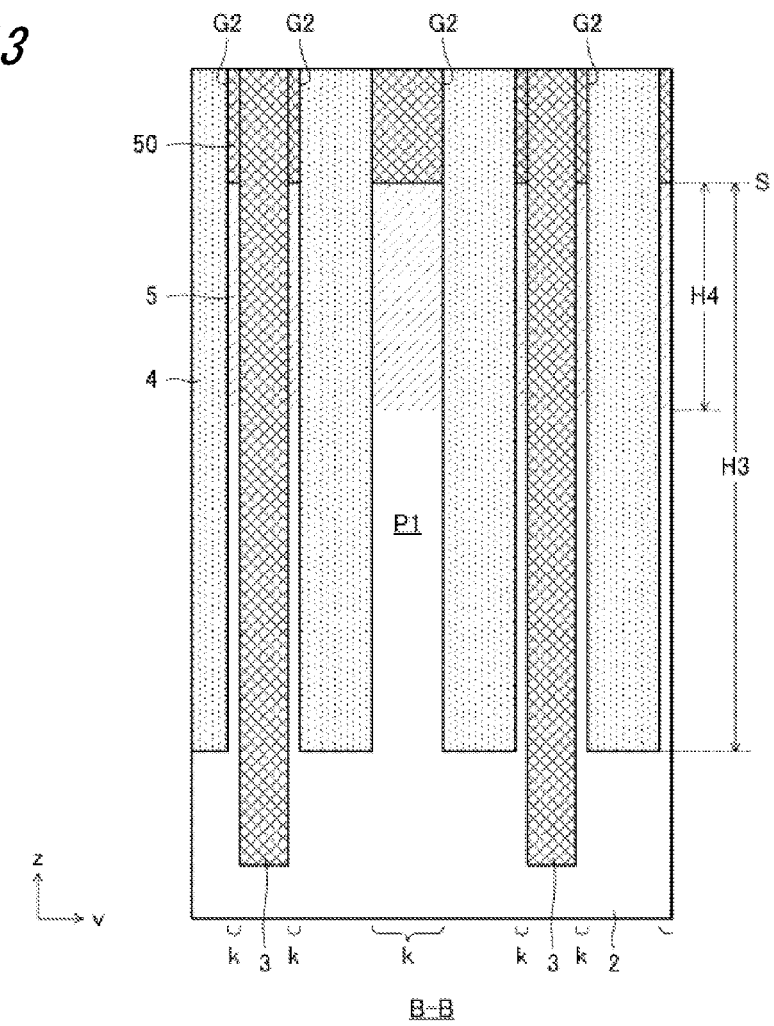
FIG. 13 is a vertical sectional view of the semiconductor device 1 that is taken along a B-B line of FIG. 12.

Subsequently, as shown in FIGS. 12 and 13, a silicon oxide film of 50 nm in thickness is formed across the whole surface such that the silicon oxide film fills up the isolation trenches G2. The silicon oxide film is formed by known CVD (F-CVD), which is a film deposition method accompanying flowability. According to this method, a deposited film grows with flowability. By this method, therefore, the isolation trenches G2 can be filled with the silicon oxide film without forming a void or seam. The silicon oxide film filling up the isolation trenches G2 may be structured as a lamination of a silicon oxide film formed by known HDP and a silicon film formed by known F-CVD. In other words, the isolation trench G2 may be filled with the lamination in such a way that its lower half is filled with the silicon oxide film formed by known HDP first so as not to fill the entire isolation trench G2 and then its upper half is filled with the silicon film formed by known F-CVD. In both cases, the silicon oxide film is formed by F-CVD and then is subjected to known reforming annealing to reform the silicon oxide film into a silicon oxide film with a more densely structure. The reforming annealing is performed under a steam atmosphere or ozone atmosphere.

Subsequently, the silicon oxide film formed on the upper surface of the hard mask film 50 is eliminated by CMP. As a result, not only the silicon oxide film formed to fill the isolation trenches G2 with the silicon oxide film but also the hard mask film 51 is eliminated from the upper surface of the hard mask film 50. As a result, respective upper surfaces of the hard mask film 50 and the isolation dielectric film 3 are exposed. The silicon oxide film remaining in the isolation trenches G2 serves as the isolation dielectric film 4 (second isolation dielectric film). At this point, the upper surface of the isolation dielectric film 4 is flush with respective upper surfaces of the hard mask film 50 and the isolation dielectric film 3.

Subsequently, ions of n-type impurity whose conductivity is reverse to the conductivity of the p-type semiconductor substrate 2 are implanted into the active areas k by ion implantation, and the implanted impurity is activated by heat treatment to form the n-type impurity diffusion layer 5. The n-type impurity diffusion layer 5 should preferably be formed such that its impurity concentration is within a range of $1*10^{18}$ to $1*10^{19}$ (atoms/cm$^3$) and that the depth H4 of its lower surface is 100 nm.

Figure 14:
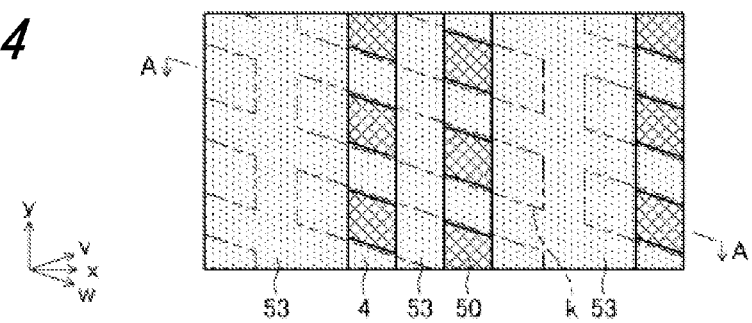
FIG. 14 is a top view of the semiconductor device 1 during a manufacturing process (which follows the process indicated in FIG. 12).
Figure 15:
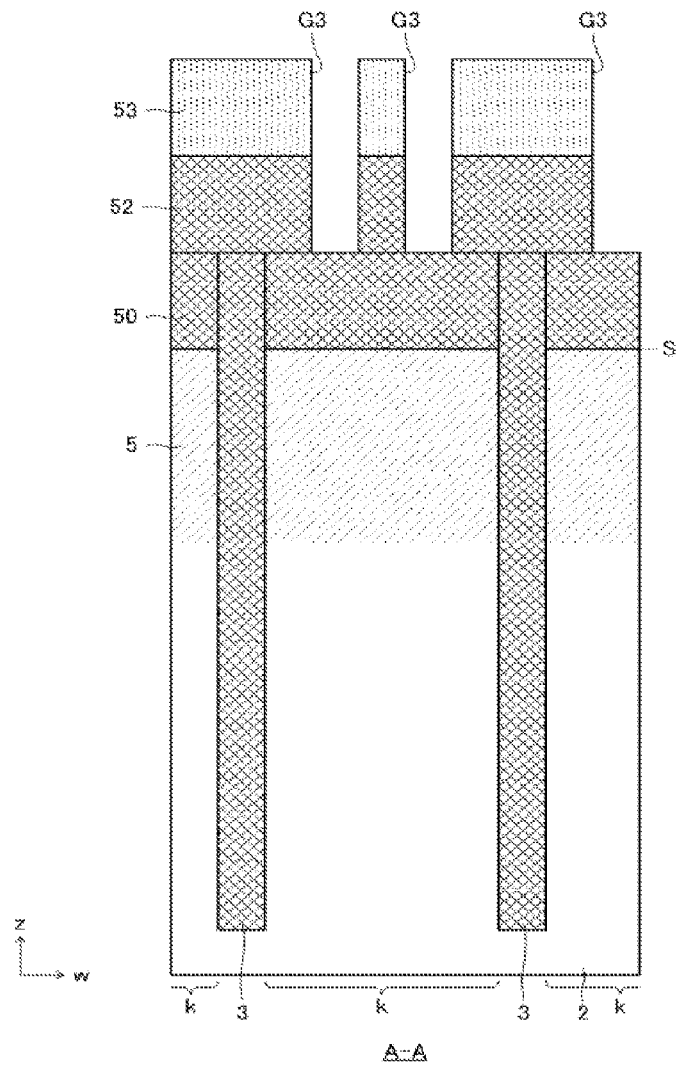
FIG. 15 is a vertical sectional view of the semiconductor device 1 that is taken along an A-A line of FIG. 14.

Subsequently, as shown in FIGS. 14 and 15, a hard mask film composed of a silicon nitride film 52 and a silicon oxide film 53 is formed across the whole surface by CVD. On the upper surface of the hard mask film, a photoresist (not depicted) is deposited, on which openings equivalent to regions for forming the wordline trench G3 are formed by lithography. These openings are extended in the y direction and are arranged repeatedly in the x direction.

Subsequently, the openings of the photoresist are transferred to the silicon nitride film 52 and silicon oxide film 53 by anisotropic dry etching. As a result, wordline trenches G3 are formed on the silicon nitride film 52 and silicon oxide film 53. The photoresist is then eliminated. At this stage, on the bottom of each wordline trench G3, the silicon oxide film (isolation dielectric film 4) and the silicon nitride film (hard mask film 50) are exposed alternately in the y direction, as shown in FIG. 14.

Figure 16:
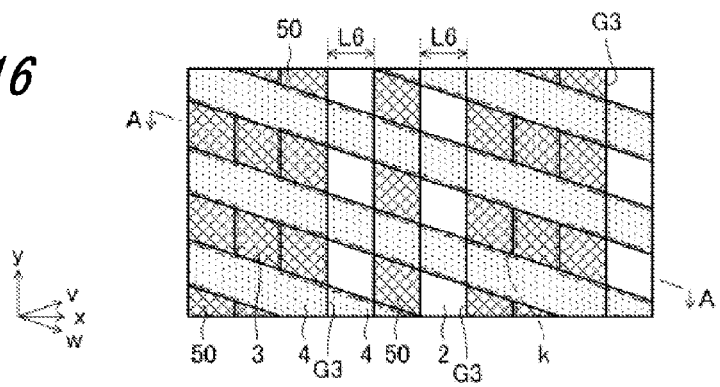
FIG. 16 is a top view of the semiconductor device 1 during a manufacturing process (which follows the process indicated in FIG. 14).
Figure 17:
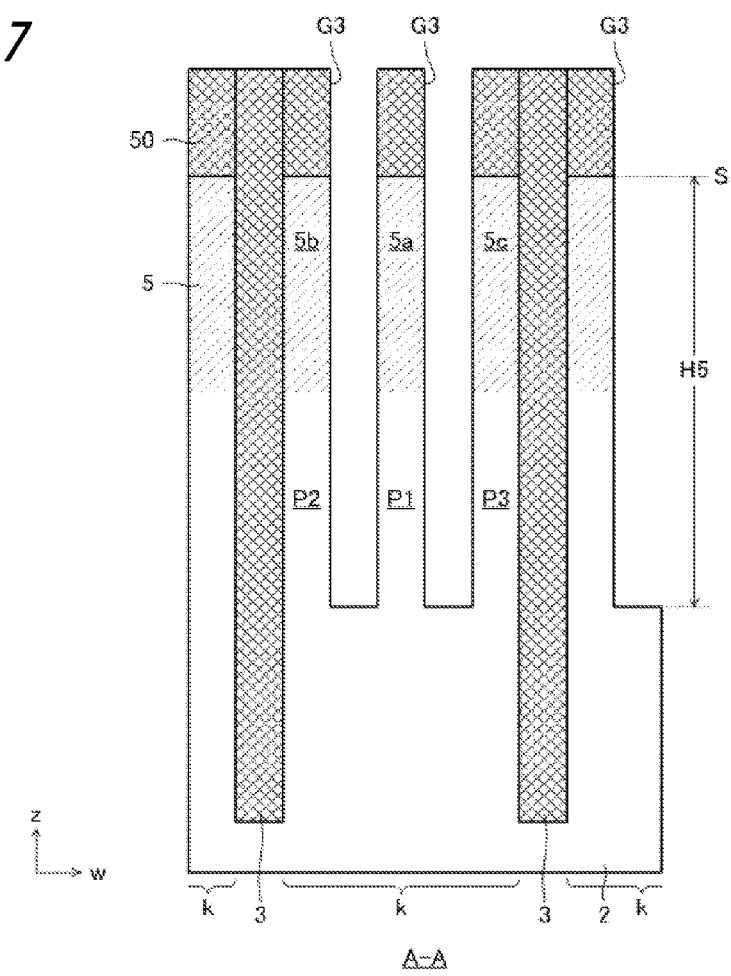
FIG. 17 is a vertical sectional view of the semiconductor device 1 that is taken along an A-A line of FIG. 16.

Subsequently, the hard mask film 50 is etched by anisotropic dry etching using the silicon oxide film 53 as a mask. At this stage, the impurity diffusion layer 5 (semiconductor substrate 2) and the isolation dielectric film 4 are exposed alternately on the bottom of each wordline trench G3 (not depicted). Subsequently, the semiconductor substrate 2 (including the impurity diffusion layer 5) and the isolation dielectric film 4 are etched at a constant etching rate by anisotropic dry etching using the silicon nitride film 52 as a mask. Through these processes, as shown in FIGS. 16 and 17, the wordline trenches G3 are extended into the semiconductor substrate 2. The depth H5 of each wordline trench G3 from the main surface S is determined to be, for example, 200 nm. The width L6 in the x direction of the wordline trench G3 is determined to be, for example, 20 nm. The silicon nitride film 52 and silicon oxide film 53 disappear during the course of etching for forming the wordline trenches G3.

As described above, the wordline trenches G3 are arranged such that two wordline trenches G3 pass through one active area k. As a result, in each active area k, the semiconductor pillar P1 having the width L5 (e.g., 20 nm) and the semiconductor pillars P2 and P3 each having the width L6 (e.g., 20 nm) are formed, as shown in FIG. 1a. In each active area k, the impurity diffusion layer 5 is divided into the first to third portions 5a to 5c, which correspond respectively to the diffusion layers D1 to D3 of FIG. 3.

Figure 18:
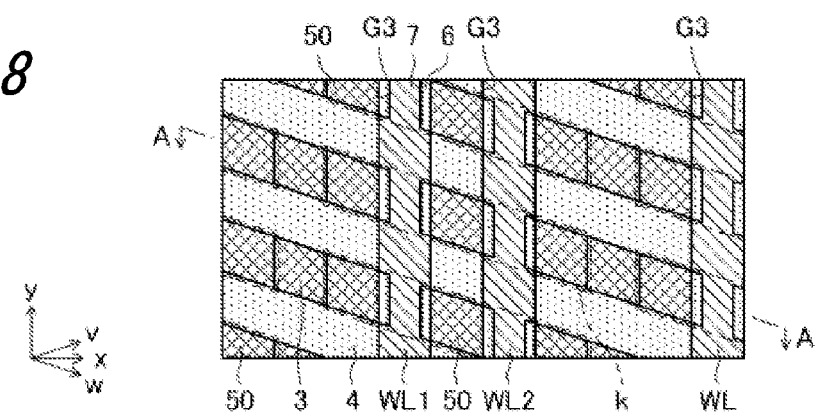
FIG. 18 is a top view of the semiconductor device 1 during a manufacturing process (which follows the process indicated in FIG. 16)
Figure 19:
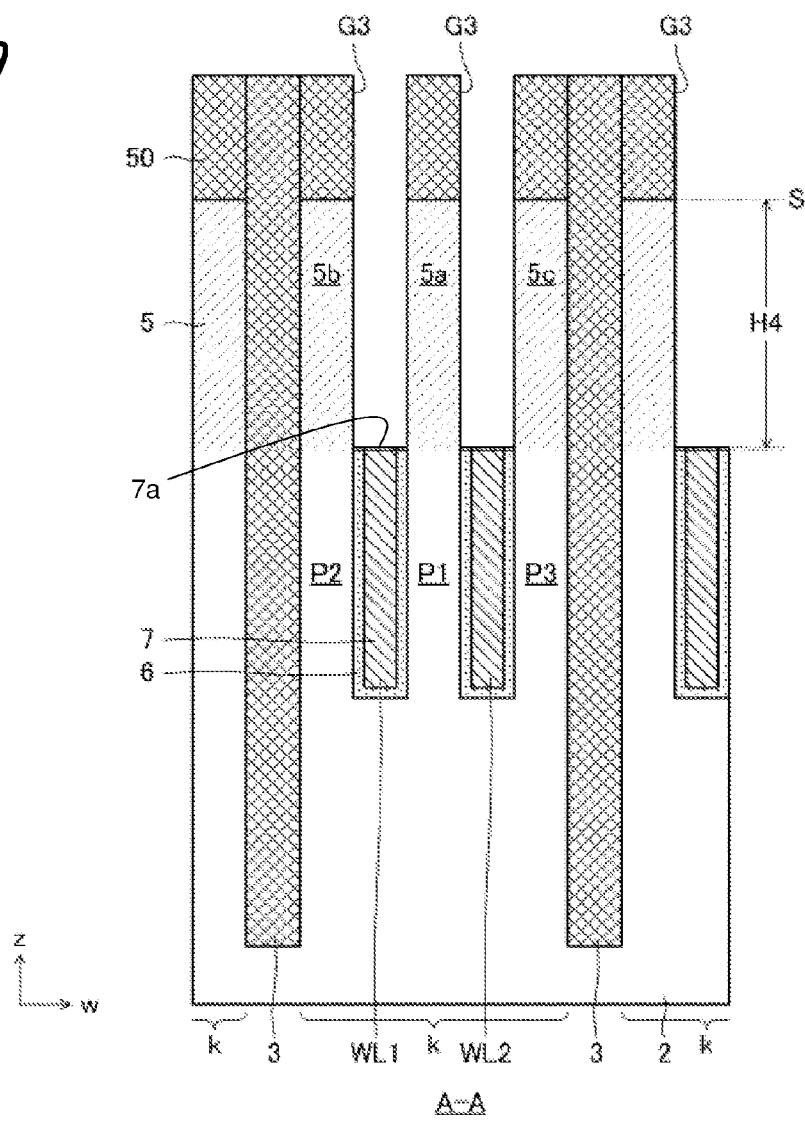
FIG. 19 is a vertical sectional view of the semiconductor device 1 that is taken along an A-A line of FIG. 18.

Subsequently, as shown in FIGS. 18 and 19, the gate dielectric film 6 made of a silicon oxide film is formed on the inner surface of each wordline trench G3 by a thermal oxidation method. The thickness of the gate dielectric film 6 is determined to be, for example, 4 nm. As shown in FIG. 18, the gate dielectric film 6 is formed on a part where the semiconductor substrate 2 is exposed and is not formed on a part where the isolation dielectric film 4, i.e., silicon oxide film, is exposed.

Subsequently, a metal film is formed by known ALD or CVD such that it fills up the wordline trenches G3. It is preferable that the metal film be a laminated film formed by, for example, depositing a titanium nitride film of 3 nm in thickness and a tungsten film of 20 nm in thickness in increasing order. The titanium nitride film functions as a barrier film and may be replaced with a different metal nitride film that functions as a barrier film. The tungsten film functions as a low-resistance conductive film.

As a result of formation of the metal film, the wordline trenches G3 are filled completely with the metal film. Subsequently, the metal film and gate dielectric film 6 are etched back by dry etching to leave the unetched part of them in the lower part of the wordline trenches G3. Hence the wordline WL having the gate dielectric film 6 interposed between the wordline WL and the semiconductor substrate 2 is formed in the lower part of each wordline trench G3. It is preferable that this etching back be so controlled that the depth H4 of the upper surface 7a of the wordline WL from the main surface S is determined to be, for example, 100 nm. By this etching control, the upper surface 7a of the wordline WL and the lower surface of the impurity diffusion layer 5 are located at the same depth level.

Figure 20:
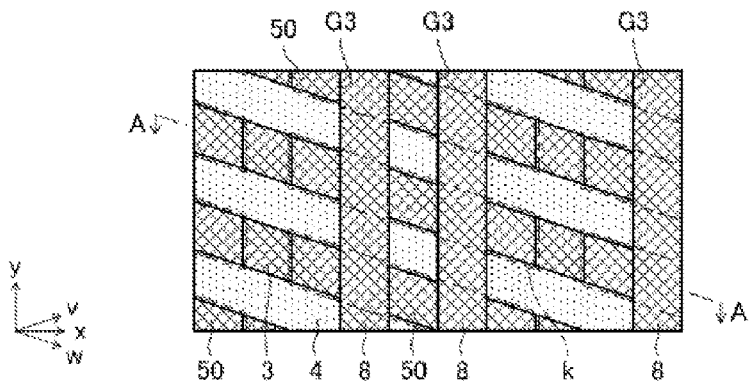
FIG. 20 is a top view of the semiconductor device 1 during a manufacturing process (which follows the process indicated in FIG. 18).
Figure 21:
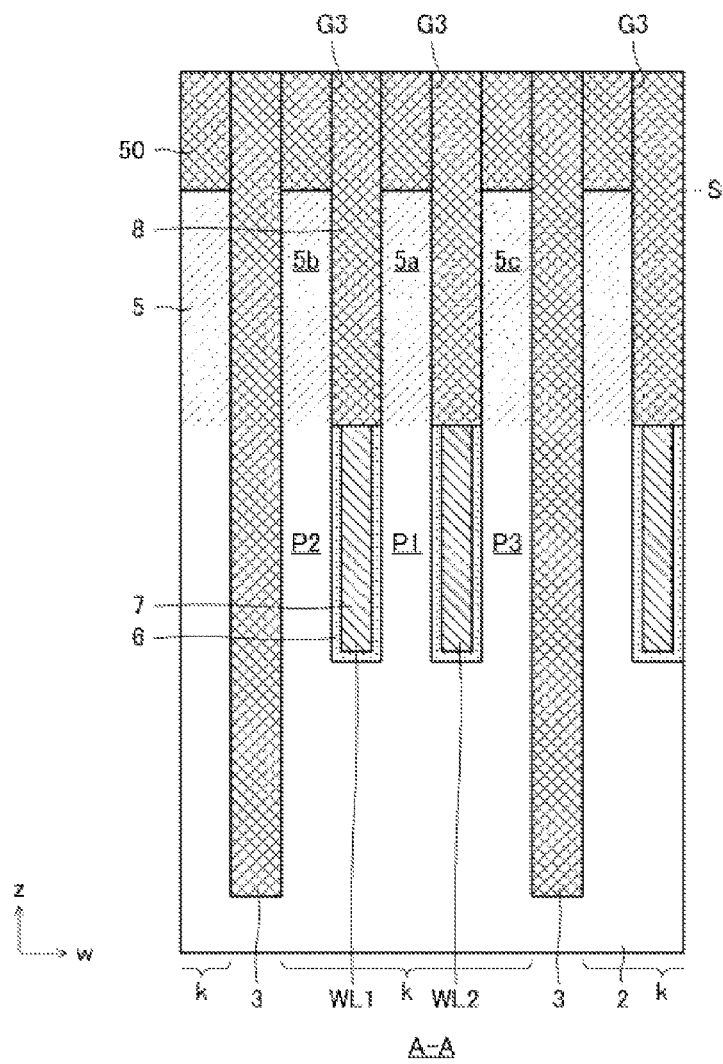
FIG. 21 is a vertical sectional view of the semiconductor device 1 that is taken along an A-A line of FIG. 20.

Subsequently, as shown in FIGS. 20 and 21, a silicon nitride film is so formed by CVD or ALD that it has an enough thickness (50 nm) to fill the space formed above the wordline WL in each wordline trench G3. The silicon nitride film deposited on the upper surface of the hard mask film 50 is then eliminated by dry etching. As a result, the first cap dielectric film 8 covering the upper surface 7a of the wordline WL is formed. The upper surface of the first cap dielectric film 8 is flush with the upper surface of the hard mask film 50 and with respective upper surfaces of the isolation dielectric films 3 and 4.

Figure 22:
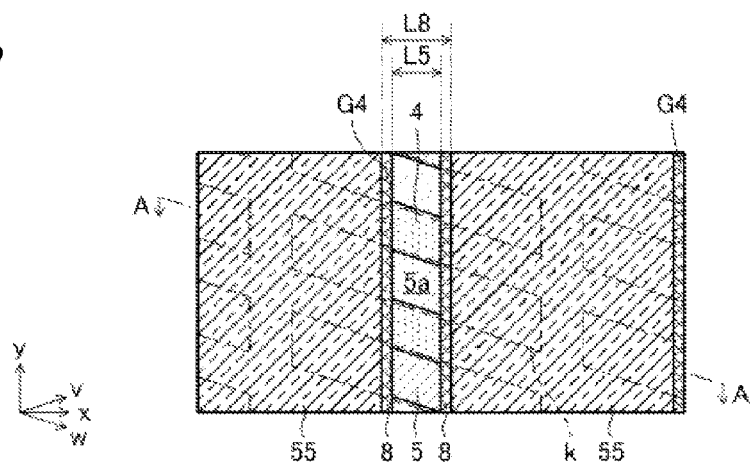
FIG. 22 is a top view of the semiconductor device 1 during a manufacturing process (which follows the process indicated in FIG. 20).
Figure 23:
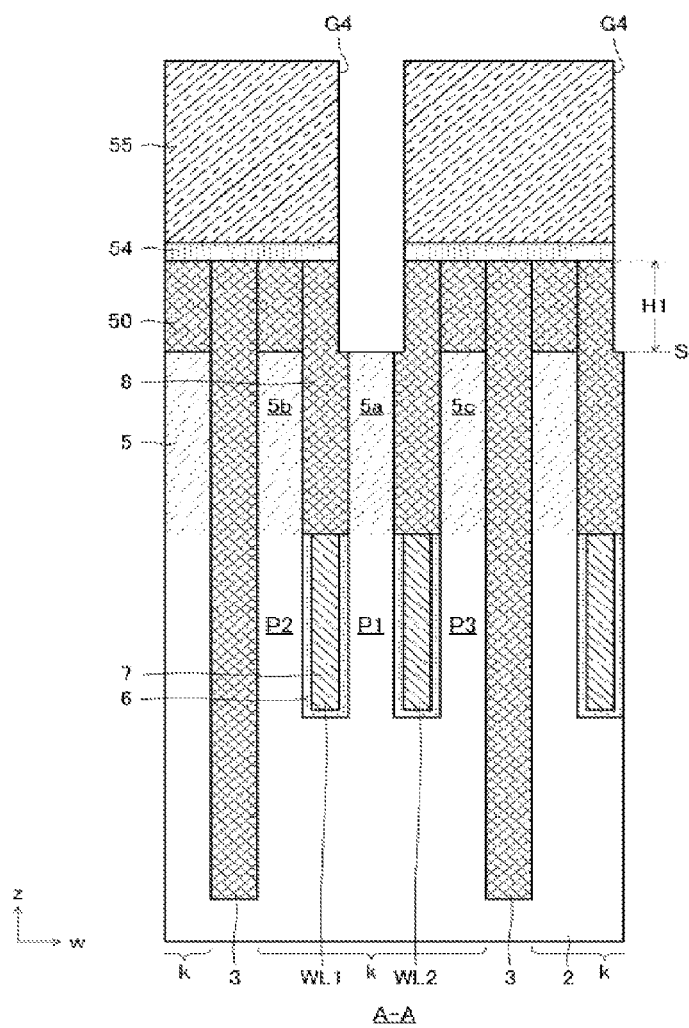
FIG. 23 is a vertical sectional view of the semiconductor device 1 that is taken along an A-A line of FIG. 22. Preferred embodiments of the present invention will now be described in detail with reference to the accompanying drawings.

Subsequently, as shown in FIGS. 22 and 23, a hard mask film composed of a silicon oxide film 54 and an amorphous carbon film 55 is formed across the whole surface by CVD. It is preferable that the thickness of the silicon oxide film 54 be 10 nm and the thickness of the amorphous carbon film 55 be 100 nm. On the upper surface of the hard mask film, a photoresist (not depicted) is deposited, on which openings extending in the y direction are formed by lithography for respective rows of active areas k arranged in the y direction. Each opening is formed such that its central position in the x direction matches the central positions in the x direction of the corresponding active areas k. It is preferable that the width in the x direction of the opening be, for example, about 40 nm.

Subsequently, the openings of the photoresist are transferred to the silicon oxide film 54 and amorphous carbon film 55 by anisotropic dry etching. As a result, bit contact trenches G4 are formed on the silicon oxide film 54 and amorphous carbon film 55. The photoresist is then eliminated. The bit contact trenches G4 are formed such that they extend in the y direction for respective rows of active areas k arranged in the y direction and that the central position in the x direction of each bit contact trench G4 matches the central positions in the x direction of the corresponding active areas k. The width L8 of the bit contact trench G4 is determined to be, for example, about 40 nm. As a result, on the bottom of the bit contact trench G4, the hard mask film 50 lying on top of the impurity diffusion layer 5 and the isolation dielectric film 4 sandwiched between adjacent active areas k are exposed alternately in the y direction as the cap dielectric film 8 formed on both sides in the x direction of the hard mask film 50 and isolation dielectric film 4 is also exposed.

Subsequently, the hard mask film 50, isolation dielectric film 4, and first cap dielectric film 8 are etched by anisotropic dry etching, using the silicon oxide film 54 and amorphous carbon film 55 as a mask, until the upper surface of the first portion 5a of the impurity diffusion layer 5 is exposed. By this etching, the bit contact trench G4 is extended up to the main surface S. The height of the bit contact trench G4 from the main surface S is determined to be, for example, the above height H1 (e.g., 40 nm). At this stage, on the bottom of the bit contact trench G4, the impurity diffusion layer 5 and the isolation dielectric film 4 are exposed alternately in the y direction as the cap dielectric film 8 formed on both sides in the x direction of the impurity diffusion layer 5 and isolation dielectric film 4 is also exposed, as shown in FIG. 22. One the inner side faces of the bit contact trench G4, the first cap dielectric film 8 is exposed.

Figure 24:
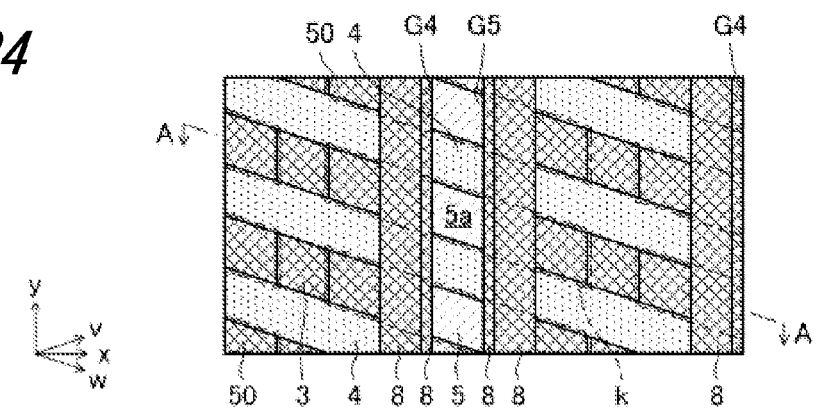
FIG. 24 is a top view of the semiconductor device 1 during a manufacturing process (which follows the process indicated in FIG. 22).
Figure 25:
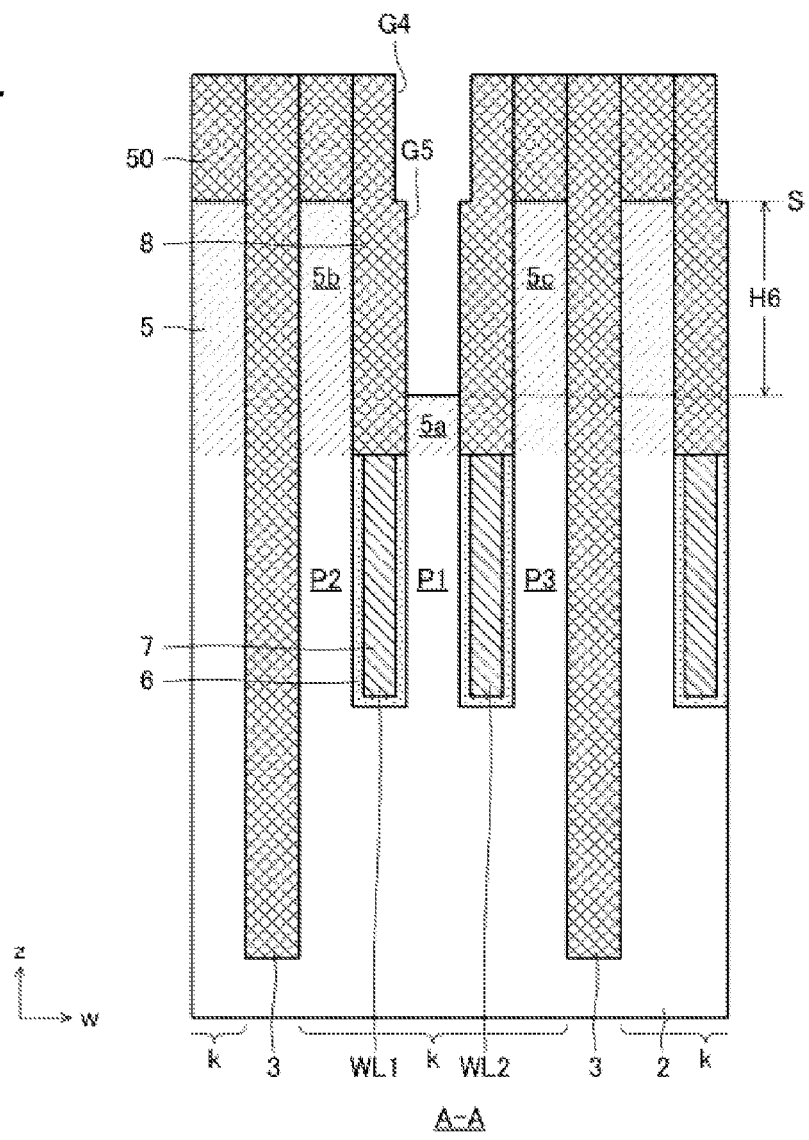
FIG. 25 is a vertical sectional view of the semiconductor device 1 that is taken along an A-A line of FIG. 24.
Figure 26:
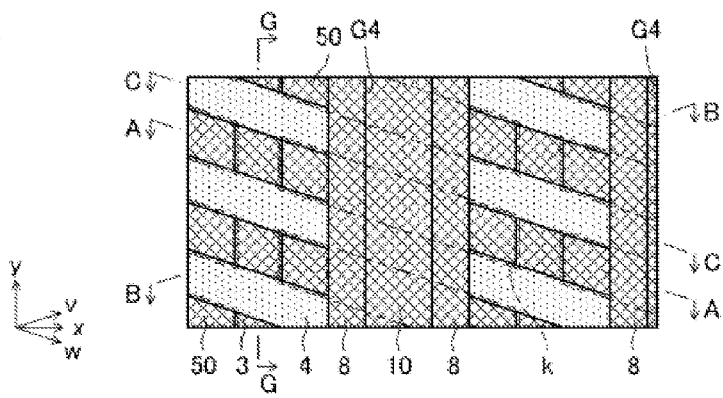
FIG. 26 is a top view of the semiconductor device 1 during a manufacturing process (which follows the process indicated in FIG. 24).
Figure 27:
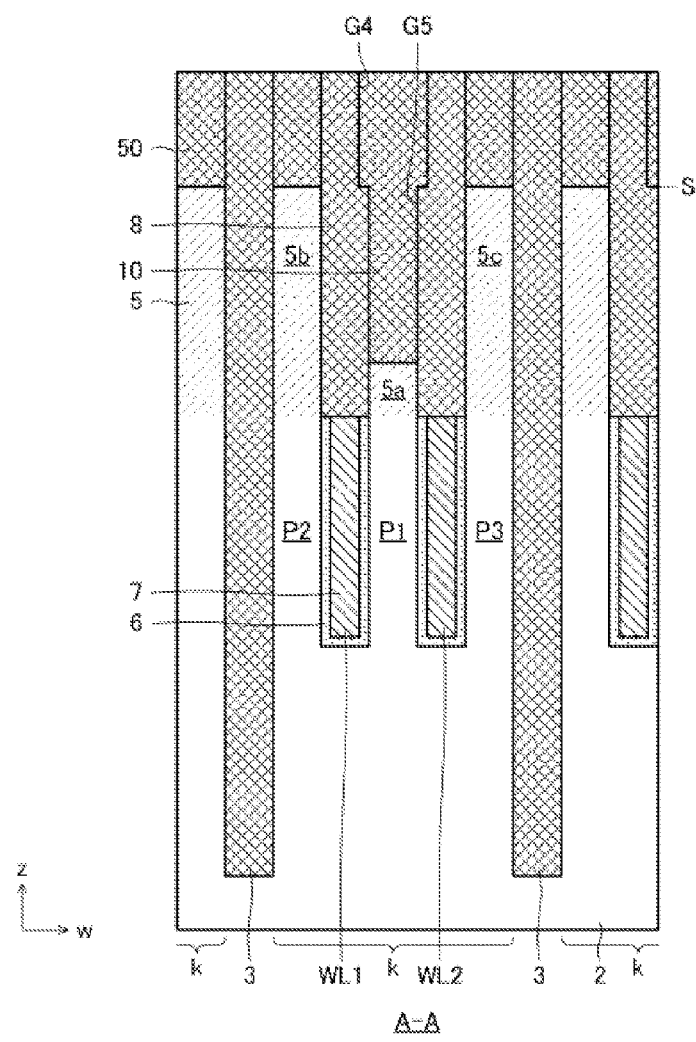
FIG. 27 is a vertical sectional view of the semiconductor device 1 that is taken along an A-A line of FIG. 26.
Figure 28:
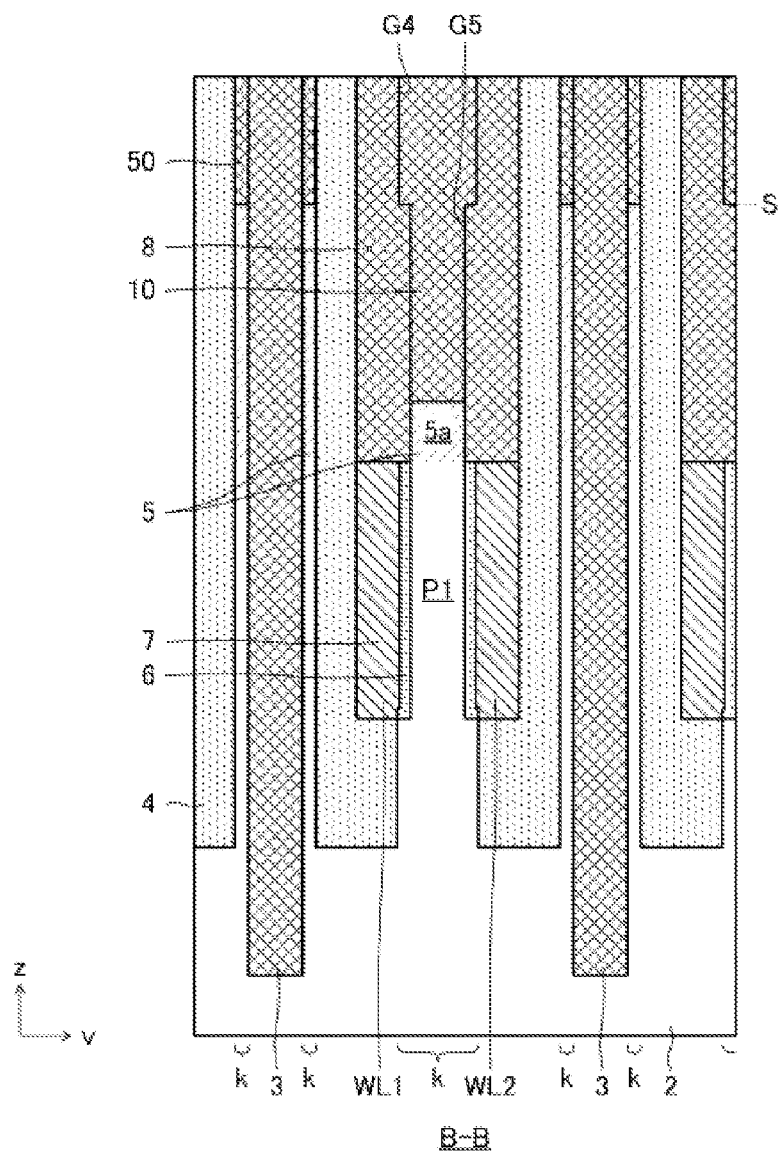
FIG. 28 is a vertical sectional view of the semiconductor device 1 that is taken along a B-B line of FIG. 26.
Figure 29:
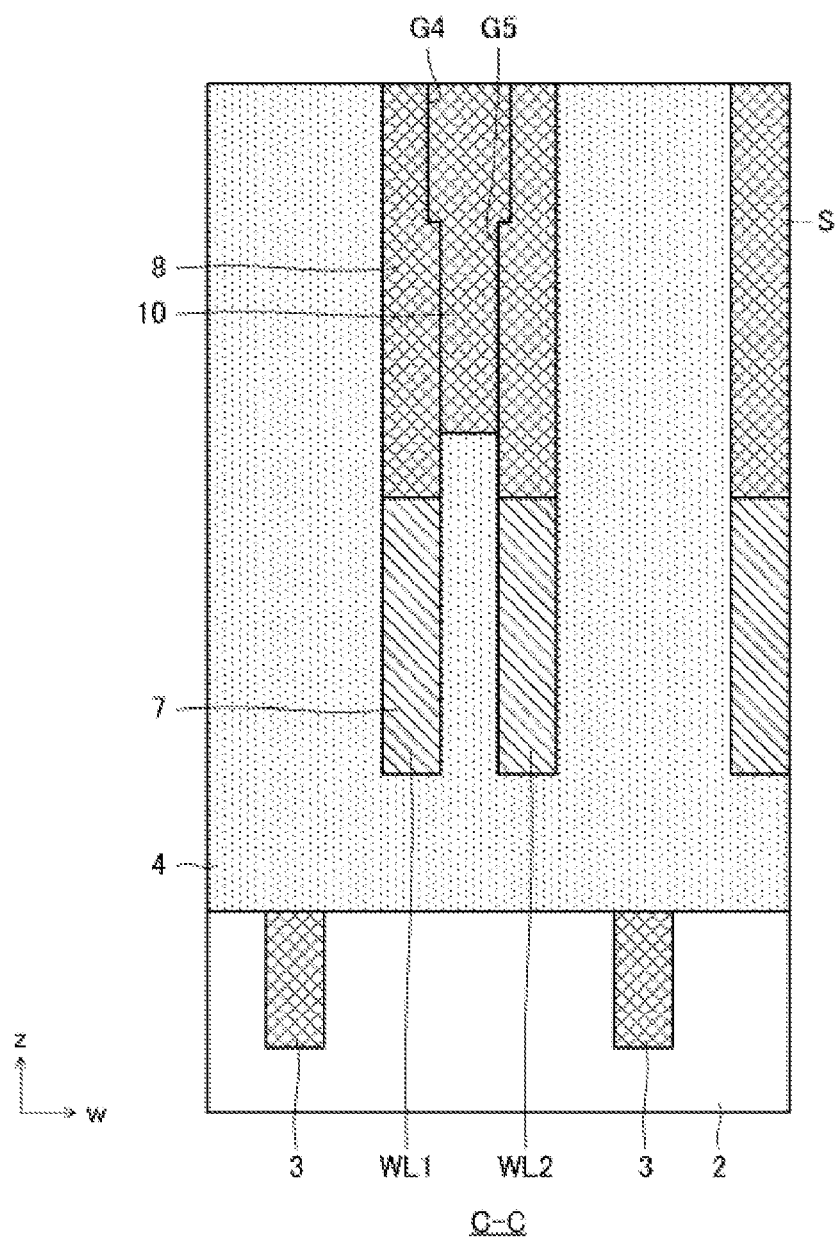
FIG. 29 is a vertical sectional view of the semiconductor device 1 that is taken along a C-C line of FIG. 26.
Figure 30:
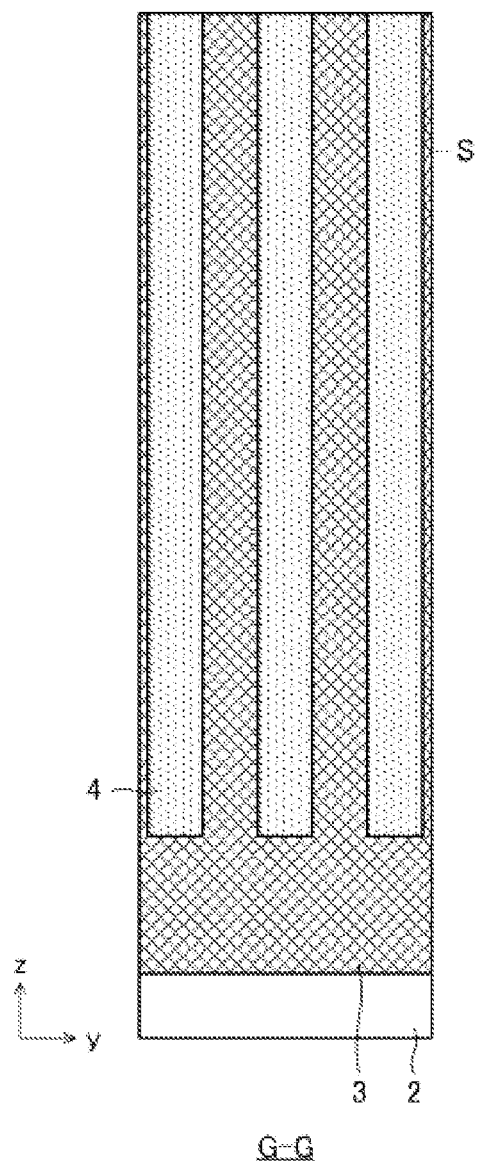
FIG. 30 is a vertical sectional view of the semiconductor device 1 that is taken along a G-G line of FIG. 26.
Figure 31:
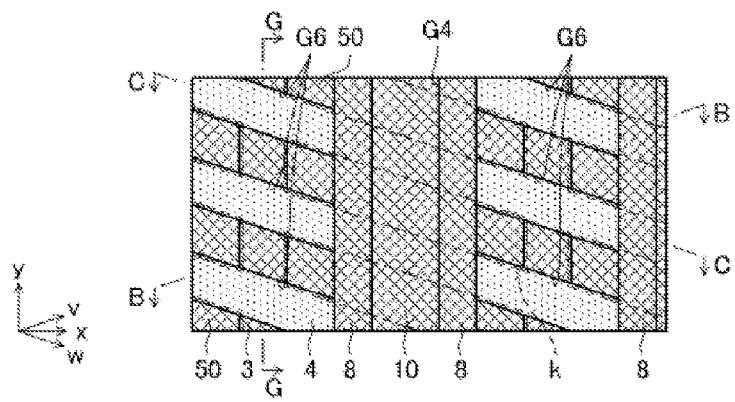
FIG. 31 is a top view of the semiconductor device 1 during a manufacturing process (which follows the process indicated in FIG. 26).
Figure 32:
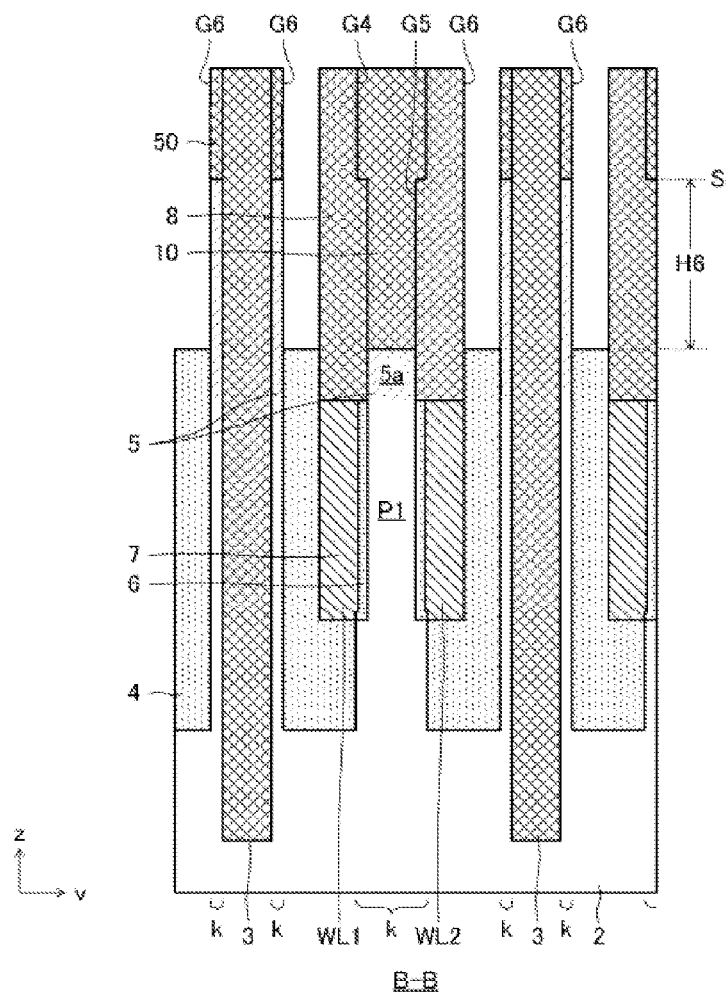
FIG. 32 is a vertical sectional view of the semiconductor device 1 that is taken along a B-B line of FIG. 31.
Figure 33:
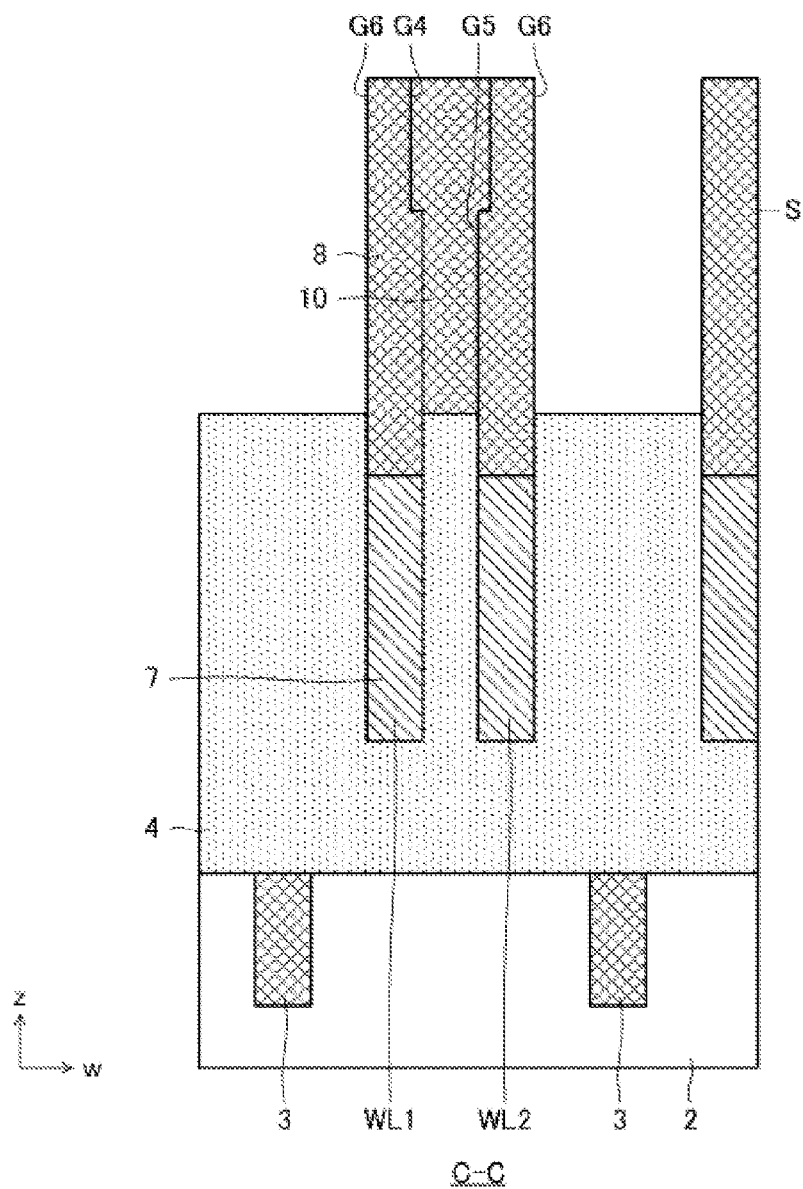
FIG. 33 is a vertical sectional view of the semiconductor device 1 that is taken along a C-C line of FIG. 31.
Figure 34:
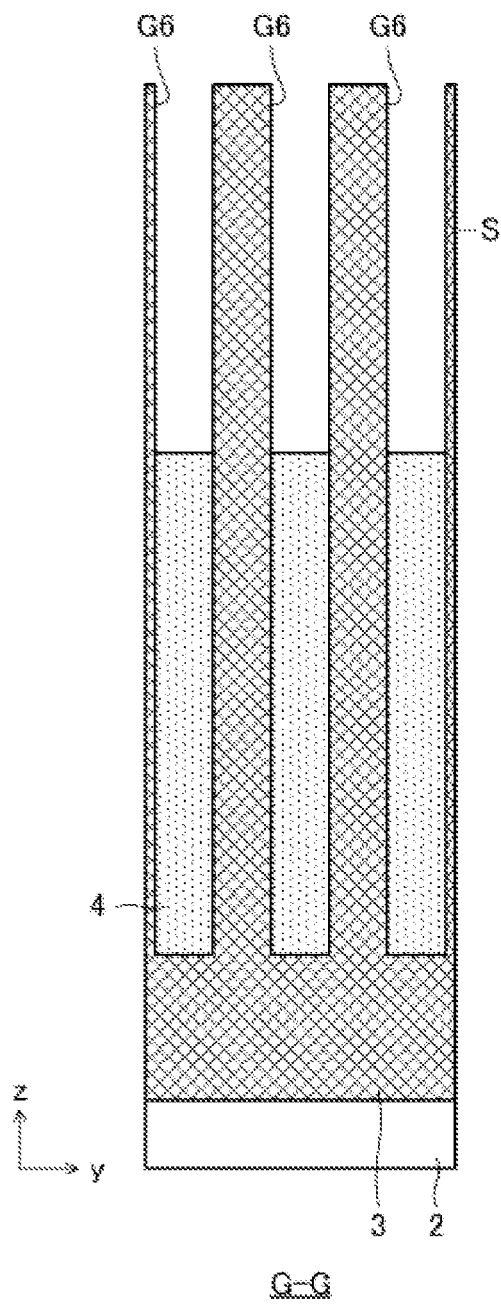
FIG. 34 is a vertical sectional view of the semiconductor device 1 that is taken along a G-G line of FIG. 31.

Subsequently, as shown in FIGS. 24 and 25, the first portion 5a of the impurity diffusion layer 5 and the isolation dielectric film 4 that are exposed on the bottom of the bit contact trench G4 are etched back by anisotropic dry etching. This etching back is carried out using the amorphous carbon film 55 and the hard mask film 50 and the first cap dielectric film 8 each of which is made of the silicon nitride film, the films 55, 50, and 3 being shown in FIGS. 22 and 23, as a mask. As a result, the impurity diffusion layer 5 made of the silicon and the isolation dielectric film 4 made of the silicon oxide film can be etched selectively against the silicon nitride film. The etching back results in formation of a bit contact trench G5 on the bottom of the bit contact trench G4, the bit contact trench G5 being formed integrally with the bit contact trench G4 to make up one deep bit contact trench. The depth of the bit contact trench G5 from the main surface S is determined to be, for example, the above depth H6 (e.g., 75 nm). On the bottom of the bit contact trench G5, the first portion 5a of the impurity diffusion layer 5 and the isolation dielectric film 4 are exposed alternately in the y direction as the first cap dielectric film 8 is exposed on the inner side faces of the bit contact trench G5. After the bit contact trench G5 is completely formed, the remaining silicon oxide film 54 and amorphous carbon film 55 are eliminated.

Subsequently, thorough the bit contact trench G5, for example, ions of n-type impurity, such as arsenic, are implanted into the semiconductor substrate 2 by ion implantation and then are subjected to a heat treatment. As a result, a high-concentration n-type impurity layer (not depicted) having impurity concentration of $1*10^{20}$ to $1*10^{21}$ (atoms/cm$^3$) is formed on top of the first portion 5a of the impurity diffusion layer 5. This high-concentration n-type impurity layer contributes to a reduction in contact resistance between the bitline BL and the first portion 5a of the impurity diffusion layer 5.

Subsequently, as shown in FIGS. 26 to 30, a silicon nitride film is so formed by CDV, etc., that it has an enough thickness to fill up the bit contact trenches G4 and G5. The silicon nitride film is then recessed by recess etching (e.g., wet etching using a hot phosphoric acid) until the upper surface of the hard mask film 50 is exposed. Hence the protective dielectric film 10 made of the silicon nitride film is formed inside the bit contact trenches G4 and G5 to fill them up. At this stage, a silicon nitride film layer composed of the hard mask film 50, isolation dielectric film 3, first cap dielectric film 8, and protective dielectric film 10 is formed near the surface of the semiconductor substrate 2.

Subsequently, the silicon oxide film is etched selectively. This selective etching should preferably be carried out using, for example, a solution containing a hydrofluoric acid (HF). By this etching, as shown in FIGS. 31 to 34, the silicon oxide film layer having its upper surface exposed is not etched and only the isolation dielectric film 4 is etched. As a result, the bitline trenches G6 (first partial bitline trench) are formed. In this etching, the silicon oxide film is recessed until the bottom of each bitline trench G6 descends deeper to a location lower than the main surface S by the depth H6 (e.g., 75 nm). As a result, the bottom of the bitline trench G6 becomes flush with the bottom of the bit contact trench G5. The bitline trench G6 is formed into a parallelogram having one pair of opposed sides parallel with the w direction and the other pair of opposed sides parallel with the y direction. In the bitline trench G6, the isolation dielectric film 3, hard mask film 50, and second and third portions 5b and 5c of the impurity diffusion layer 5 are exposed on each of the inner side faces opposed in the y direction, while the first cap dielectric film 8 is exposed on each of the inner side faces opposed in the w direction. The width in the y direction of the bitline trench G6 is equal to the width L3 in the y direction of the isolation dielectric film 4, and the arrangement pitch of the bitline trenches G6 in the y direction is equal to the arrangement pitch L4 of the isolation dielectric films 4 in the y direction.

Figure 35:
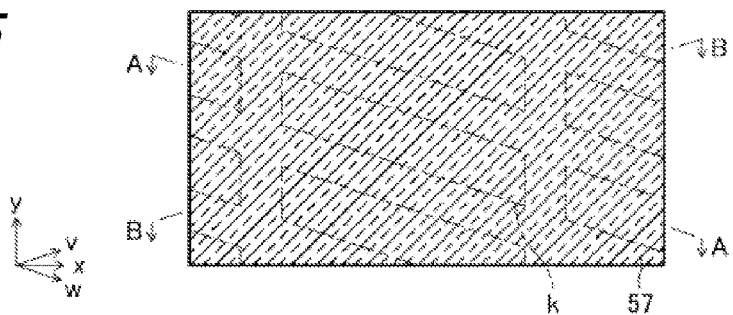
FIG. 35 is a top view of the semiconductor device 1 during a manufacturing process (which follows the process indicated in FIG. 31).
Figure 36:
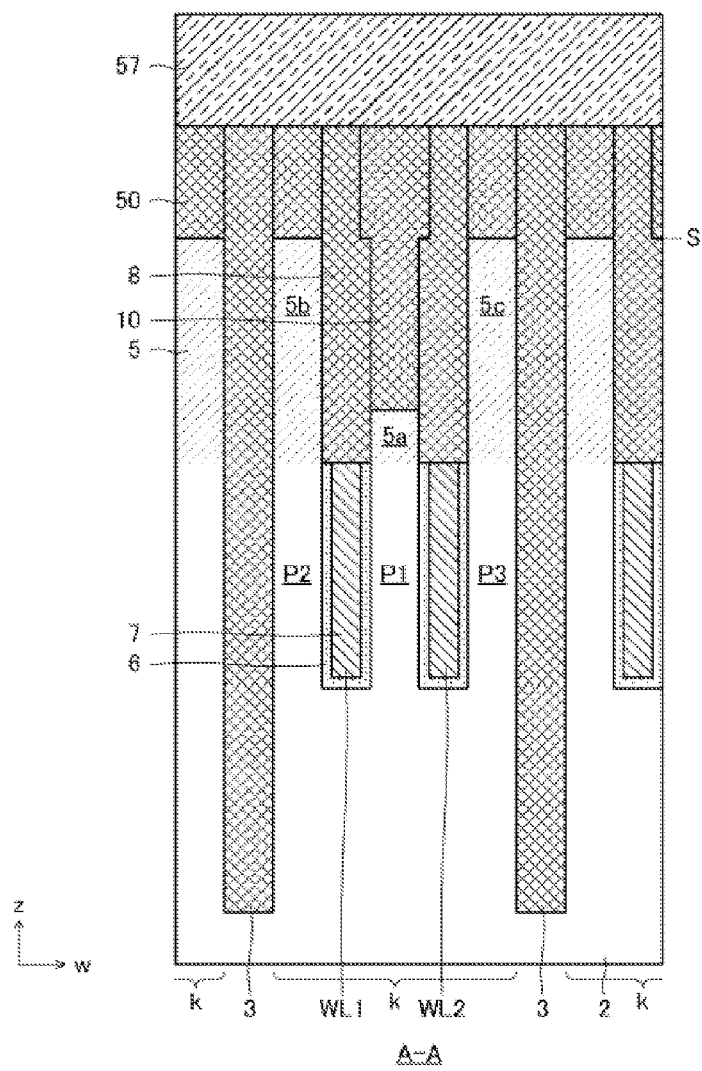
FIG. 36 is a vertical sectional view of the semiconductor device 1 that is taken along an A-A line of FIG. 35.
Figure 37:
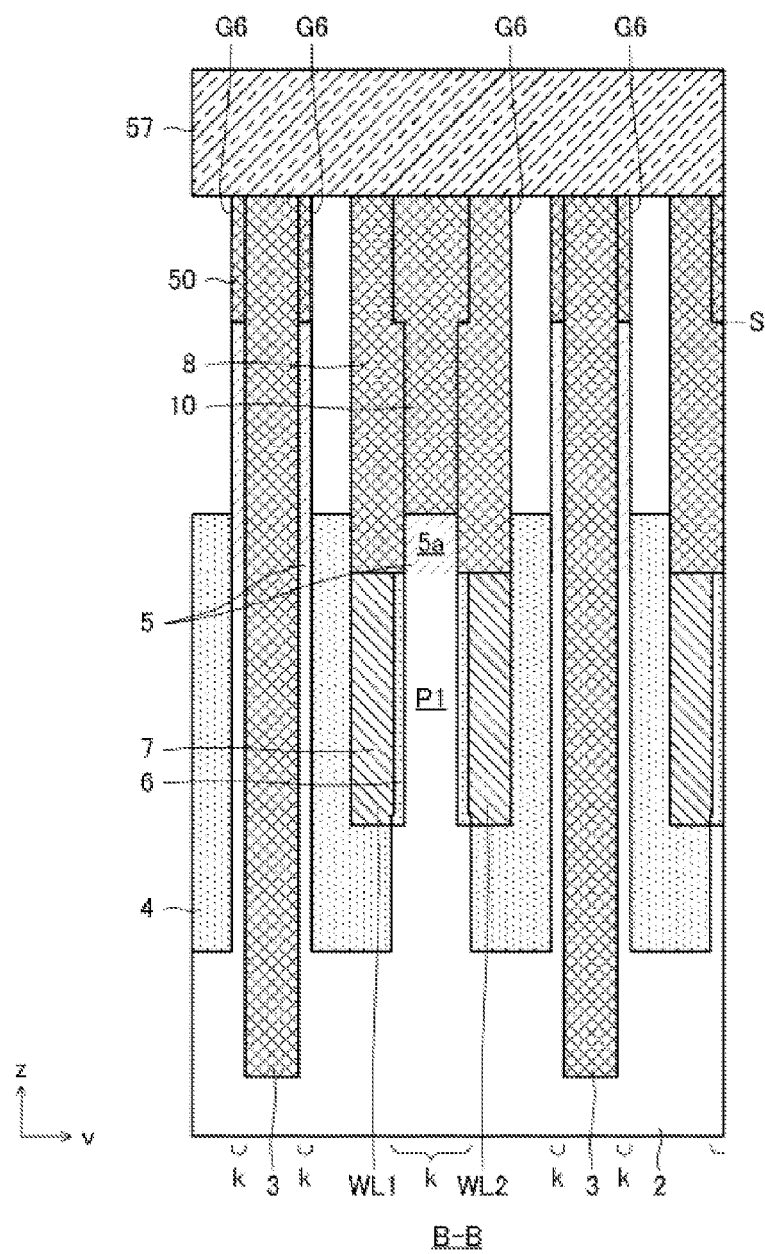
FIG. 37 is a vertical sectional view of the semiconductor device 1 that is taken along a B-B line of FIG. 35.

Subsequently, as shown in FIGS. 35 to 37, an amorphous carbon film 57 is formed across the whole surface by plasma CVD. Because film formation by the CVD results in inferior step coverage, the amorphous carbon film 57 does not spread into the bitline trenches G6 and ends up in blocking their upper openings. As a result, the bitline trenches G6 are made into cavities with their upper parts blocked with the amorphous carbon film 57.

Figure 38:
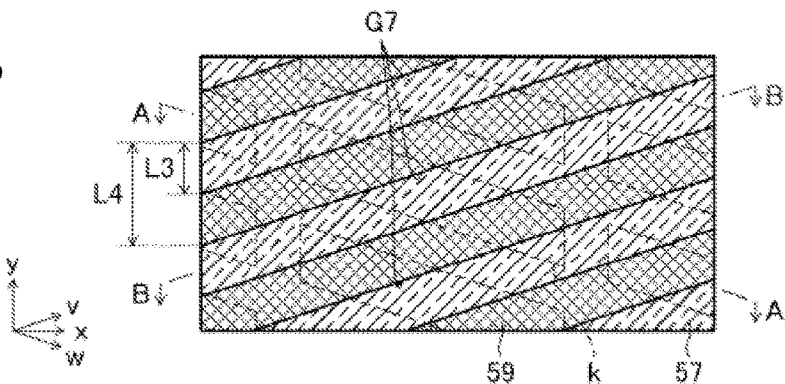
FIG. 38 is a top view of the semiconductor device 1 during a manufacturing process (which follows the process indicated in FIG. 35).
Figure 39:
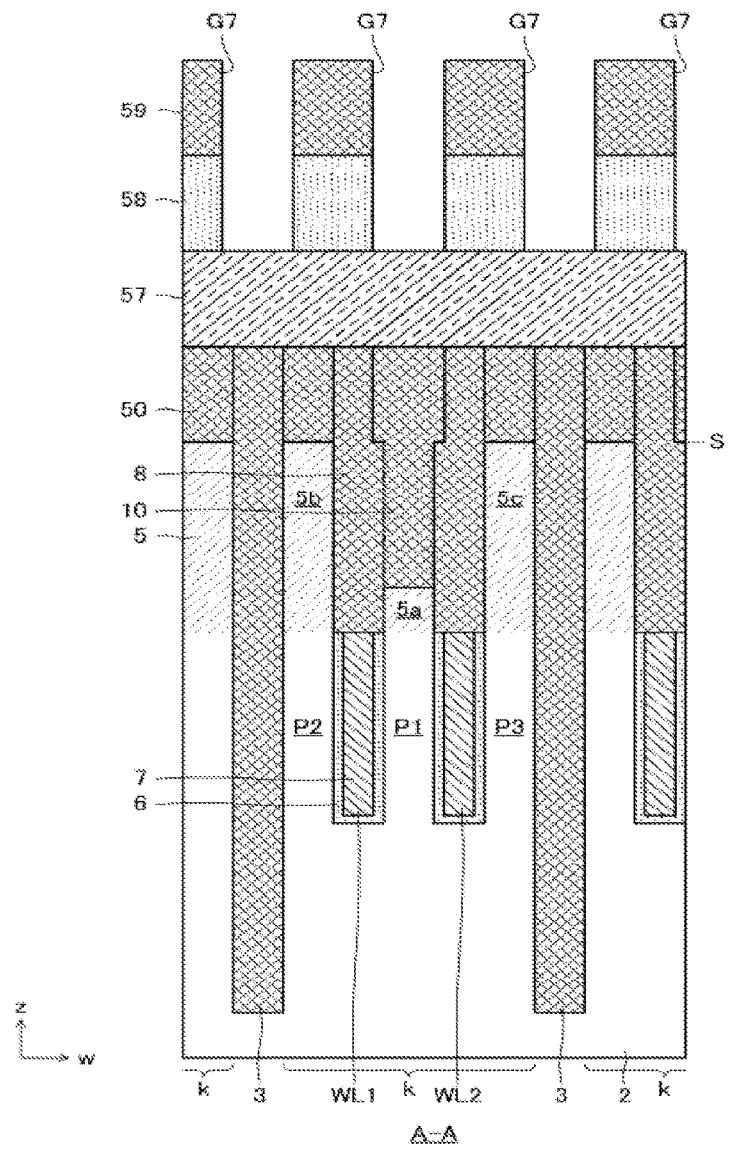
FIG. 39 is a vertical sectional view of the semiconductor device 1 that is taken along an A-A line of FIG. 38.
Figure 40:
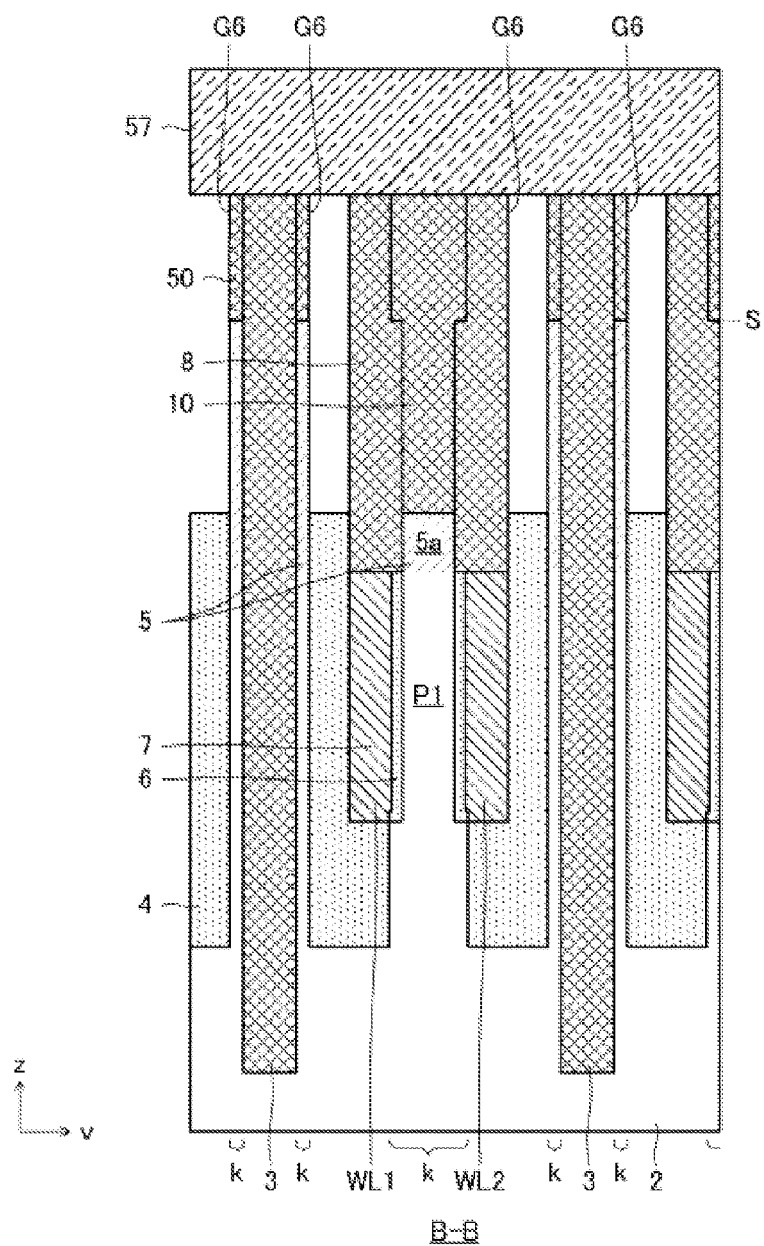
FIG. 40 is a vertical sectional view of the semiconductor device 1 that is taken along a B-B line of FIG. 38.

Subsequently, as shown in FIGS. 38 to 40, a hard mask film composed of a silicon oxide film 58 and a silicon nitride film 59 is formed. On the upper surface of the hard mask film, a photoresist (not depicted) is deposited, on which openings are formed by lithography, the opening having plane shapes equivalent to the bitline trenches G7 (second partial bitline trenches) extending in the v direction. These openings are extended in the v direction and are arranged repeatedly in the y direction.

Subsequently, the openings of the photoresist are transferred to the silicon oxide film 58 and silicon nitride film 59 by anisotropic dry etching. As a result, the bitline trenches G7, in which the amorphous carbon film 57 is exposed at their bottoms, are formed on the silicon oxide film 58 and silicon nitride film 59. The photoresist is then eliminated. The bitline trenches G7 are formed such that their width and arrangement pitch are identical with the width L3 and arrangement pitch L4 of the bitline trenches G6. The arrangement of the bitline trenches G7 in the y direction is determined such that each bitline trench G7 intersects the corresponding active area k at its center.

Figure 41:
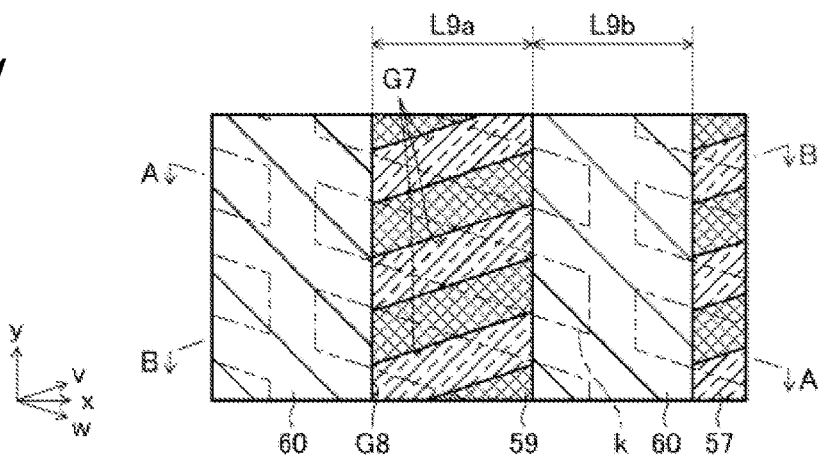
FIG. 41 is a top view of the semiconductor device 1 during a manufacturing process (which follows the process indicated in FIG. 38).
Figure 42:
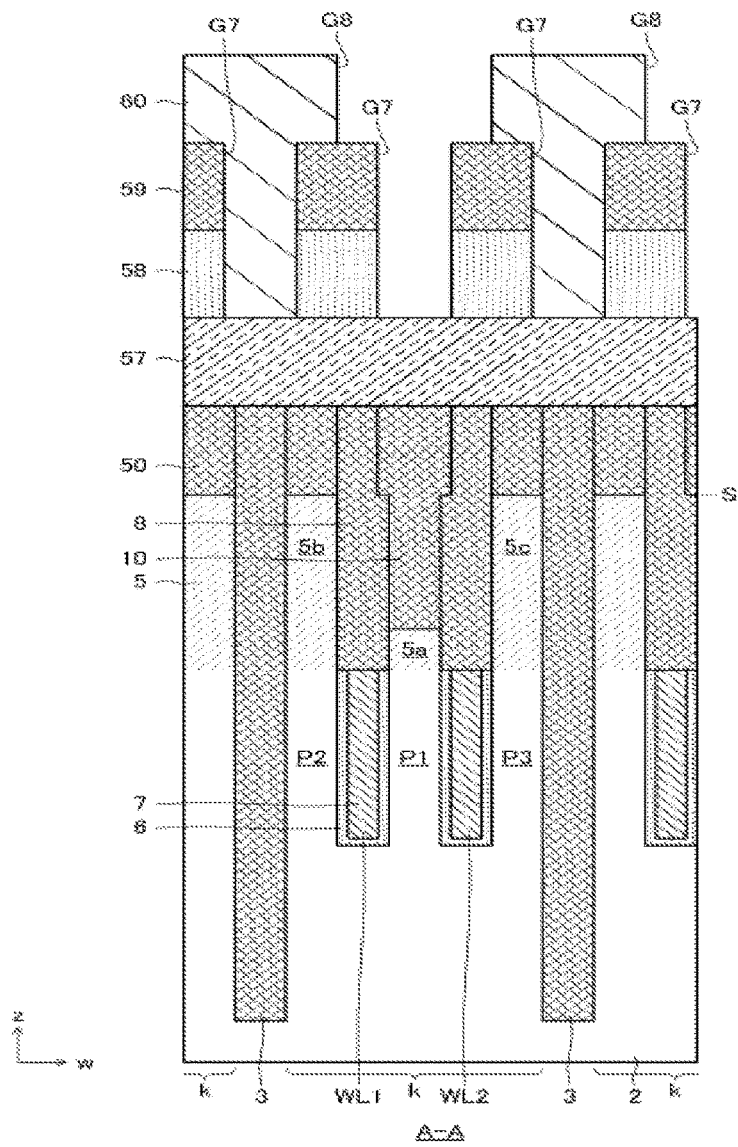
FIG. 42 is a vertical sectional view of the semiconductor device 1 that is taken along an A-A line of FIG. 41.
Figure 43:
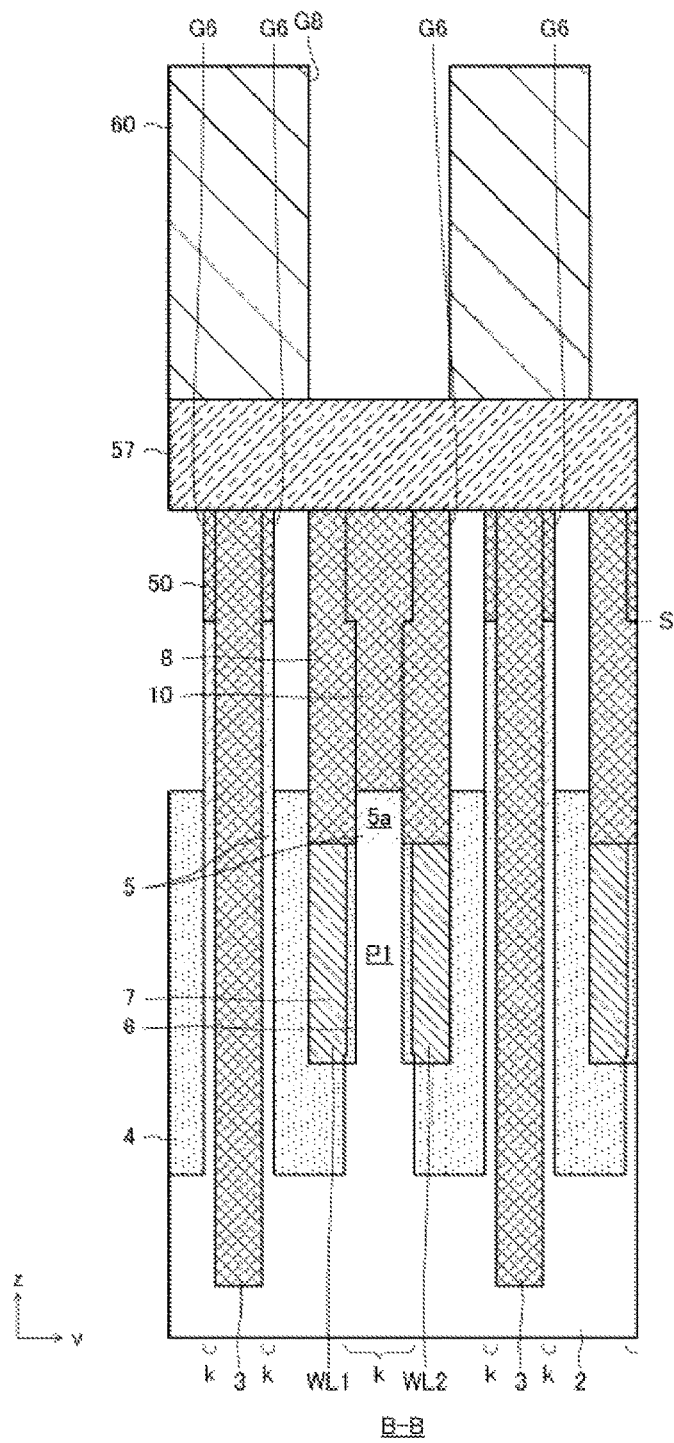
FIG. 43 is a vertical sectional view of the semiconductor device 1 that is taken along a B-B line of FIG. 41.

Subsequently, as shown in FIGS. 41 to 43, a photoresist 60 is formed, on which trenches G8 extending in the y direction are formed by lithography. The width in the x direction of each trench G8 is determined to be a width L9a with the protective dielectric film 10 at its center. The width L9a is equivalent to the width in the x direction of the above intersect line portion BLa, and is, for example, 60 nm. After formation of the trenches G8, the width in the x direction of the remaining photoresist 60 becomes equal to the width L9b in the x direction of the parallel line portion BLb.

Figure 44:
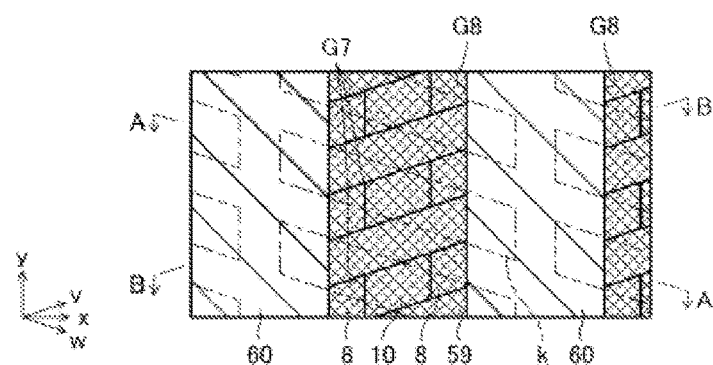
FIG. 44 is a top view of the semiconductor device 1 during a manufacturing process (which follows the process indicated in FIG. 41).
Figure 45:
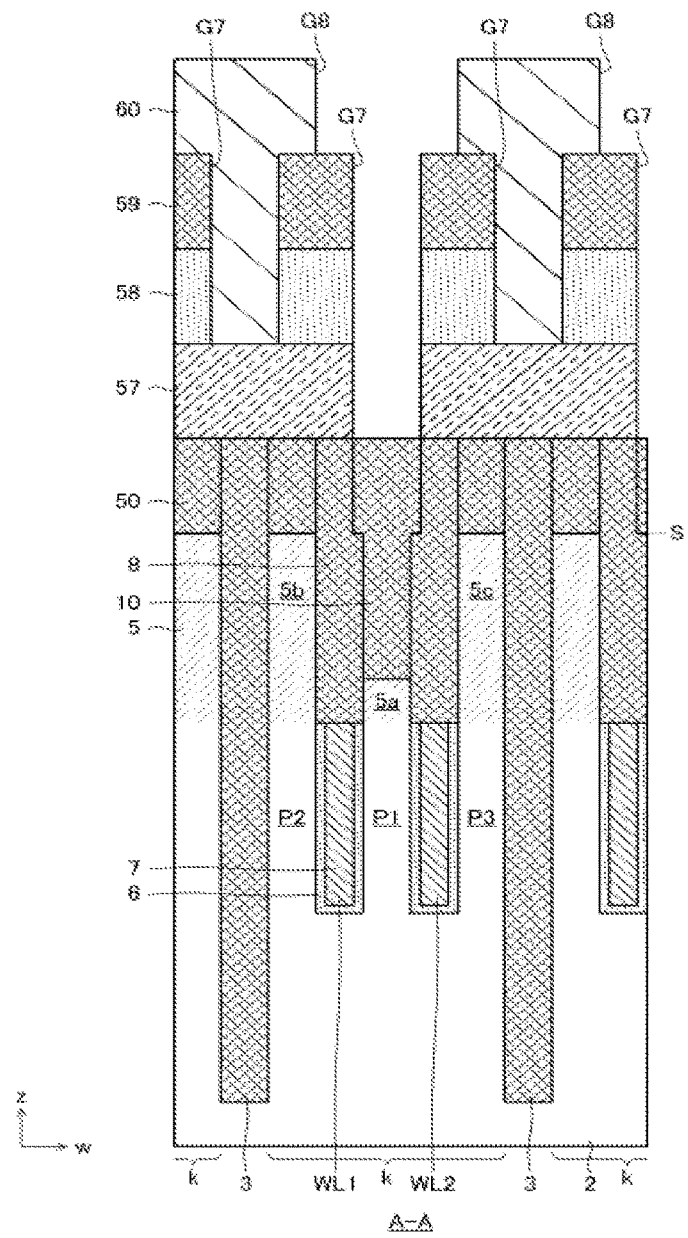
FIG. 45 is a vertical sectional view of the semiconductor device 1 that is taken along an A-A line of FIG. 44.
Figure 46:
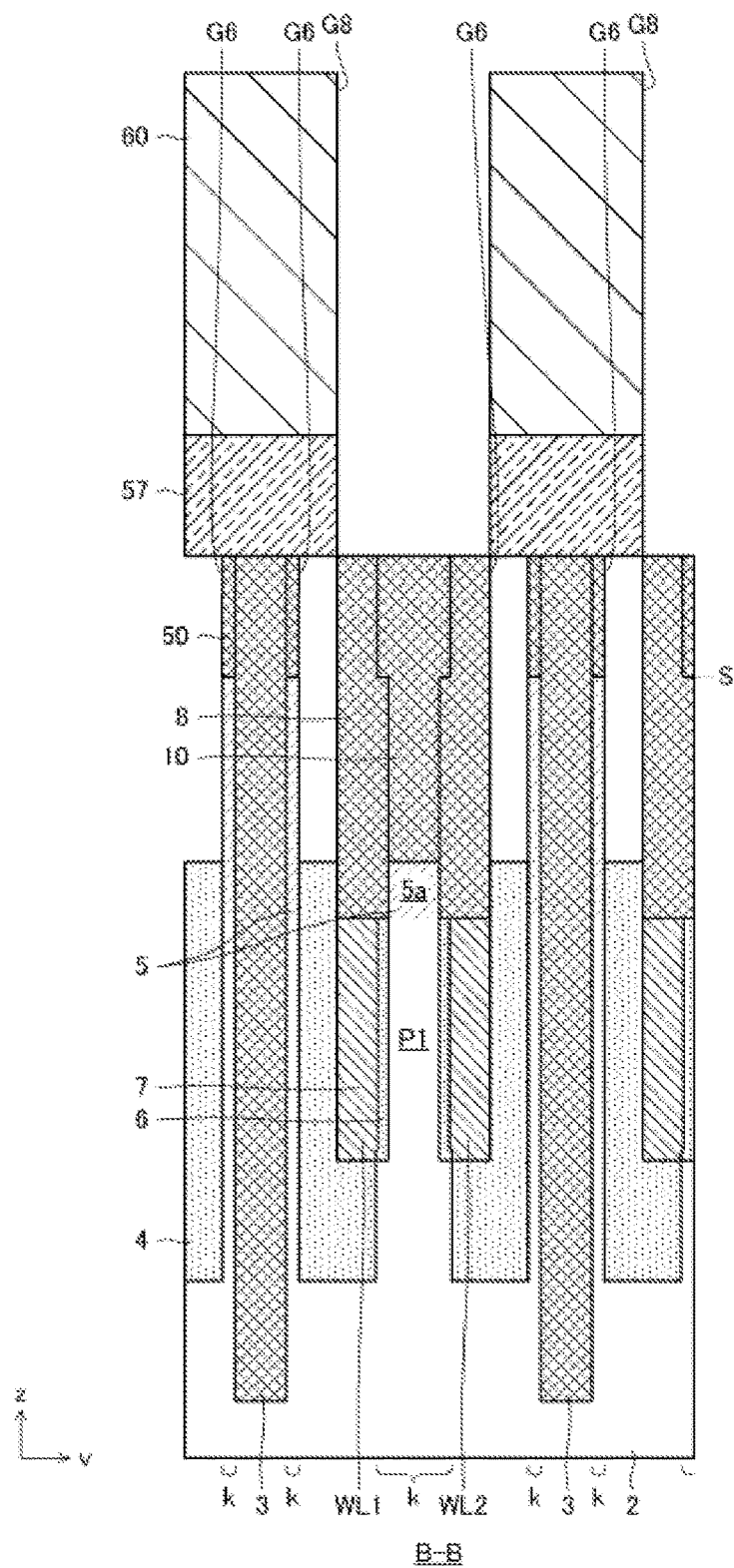
FIG. 46 is a vertical sectional view of the semiconductor device 1 that is taken along a B-B line of FIG. 44.

As a result of formation of the photoresist 60 having the trenches G8, the part of bitline trenches G7 formed on silicon oxide film 58 and silicon nitride film 59 that overlap regions for forming the intersect line portion BLa in a plan view is exposed, while the rest of bitline trenches G7 is kept covered with the photoresist. In this state, the amorphous carbon film 57 is etched, using the photoresist 60, silicon oxide film 58, and silicon nitride film 59 as a mask, to transfer the exposed part of the bitline trenches G7 to the amorphous carbon film 57, as shown in FIGS. 44 to 46. On the bottom of each bitline trench G7 transferred to the amorphous carbon film 57, the first cap dielectric film 8 and protective dielectric film 10 are exposed.

Figure 47:
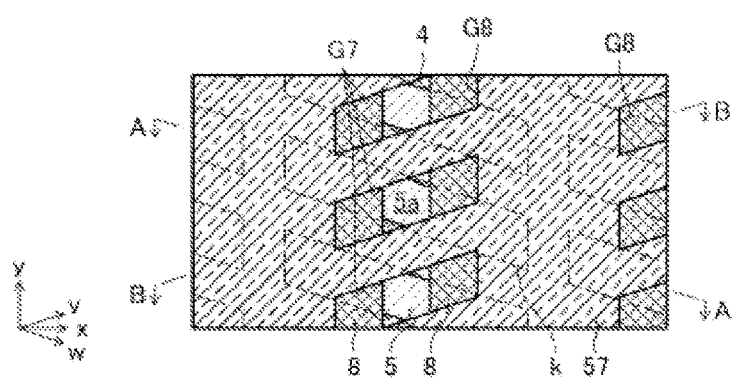
FIG. 47 is a top view of the semiconductor device 1 during a manufacturing process (which follows the process indicated in FIG. 44).
Figure 48:
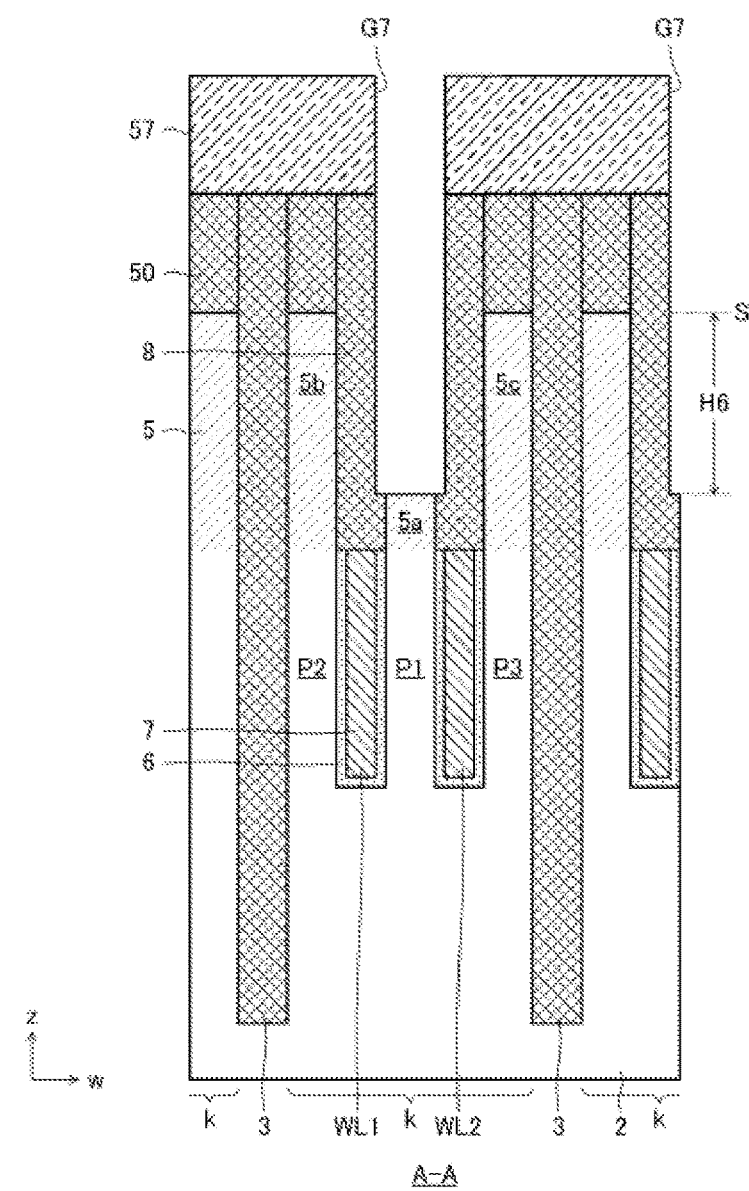
FIG. 48 is a vertical sectional view of the semiconductor device 1 that is taken along an A-A line of FIG. 47.
Figure 49:
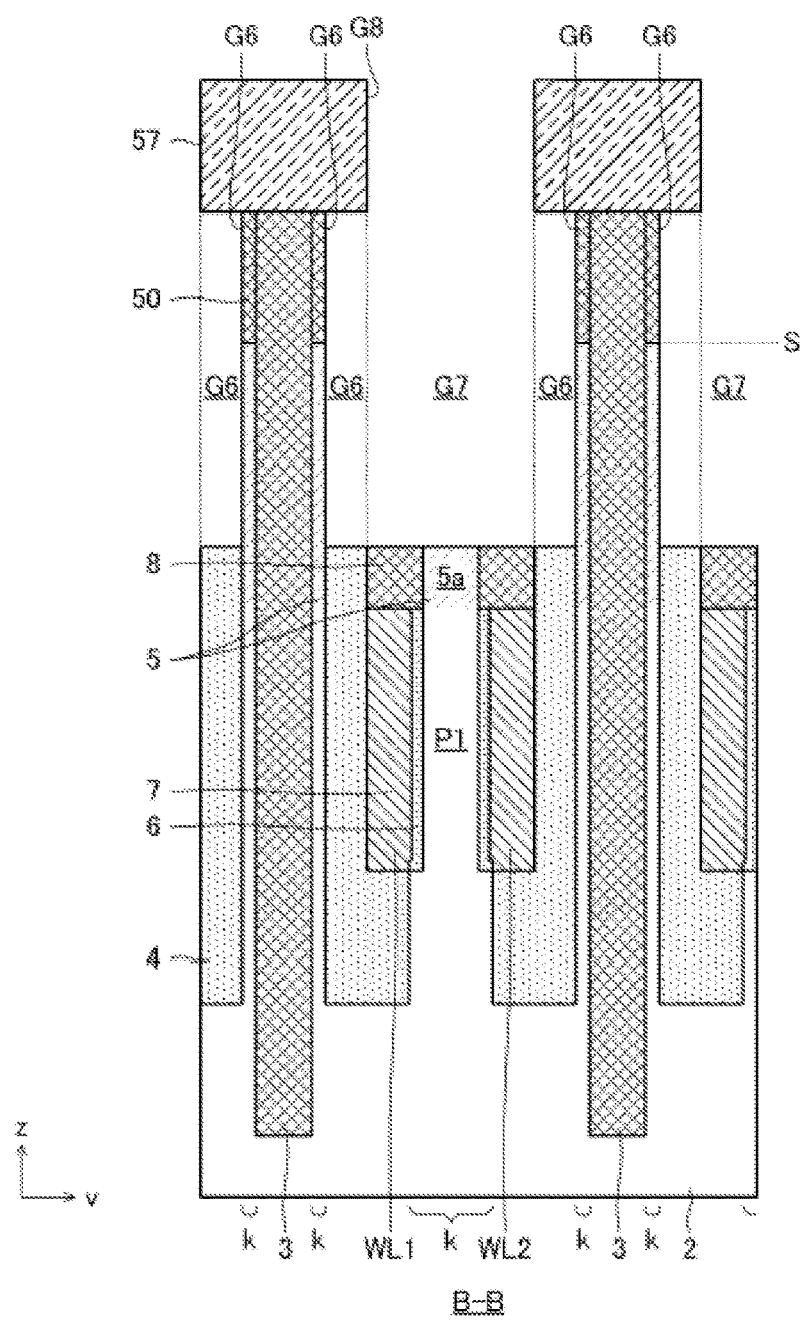
FIG. 49 is a vertical sectional view of the semiconductor device 1 that is taken along a B-B line of FIG. 47.
Figure 50:
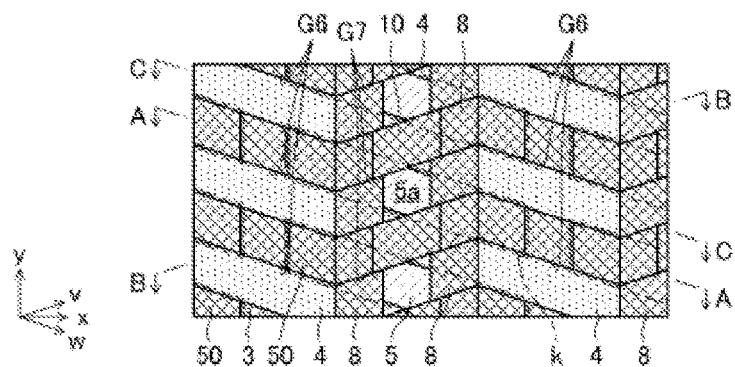
FIG. 50 is a top view of the semiconductor device 1 during a manufacturing process (which follows the process indicated in FIG. 47).
Figure 51:
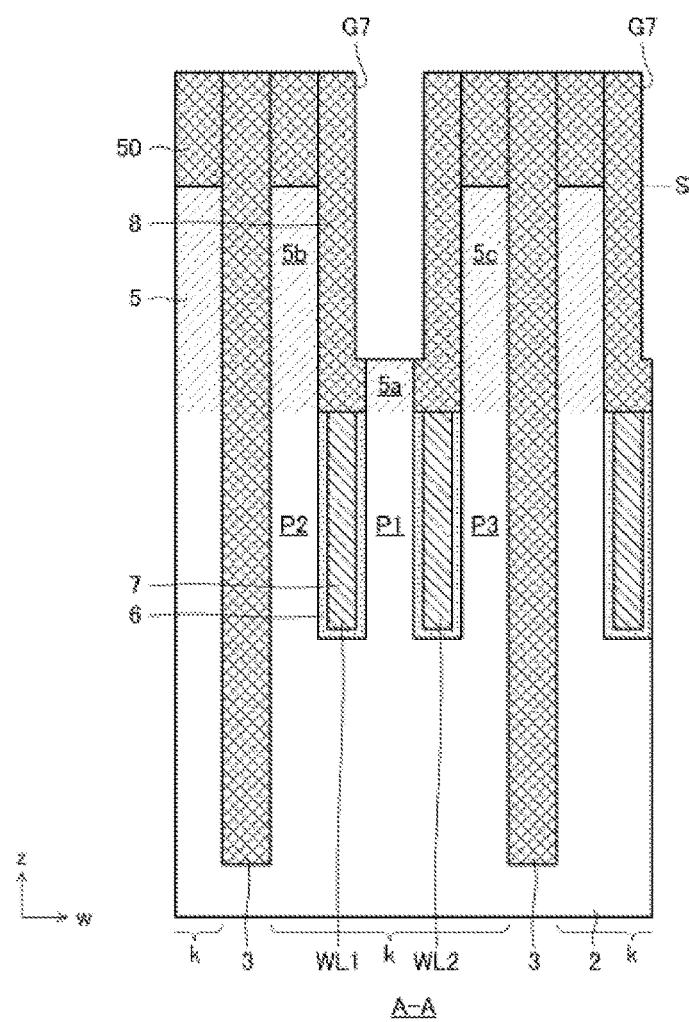
FIG. 51 is a vertical sectional view of the semiconductor device 1 that is taken along an A-A line of FIG. 50.
Figure 52:
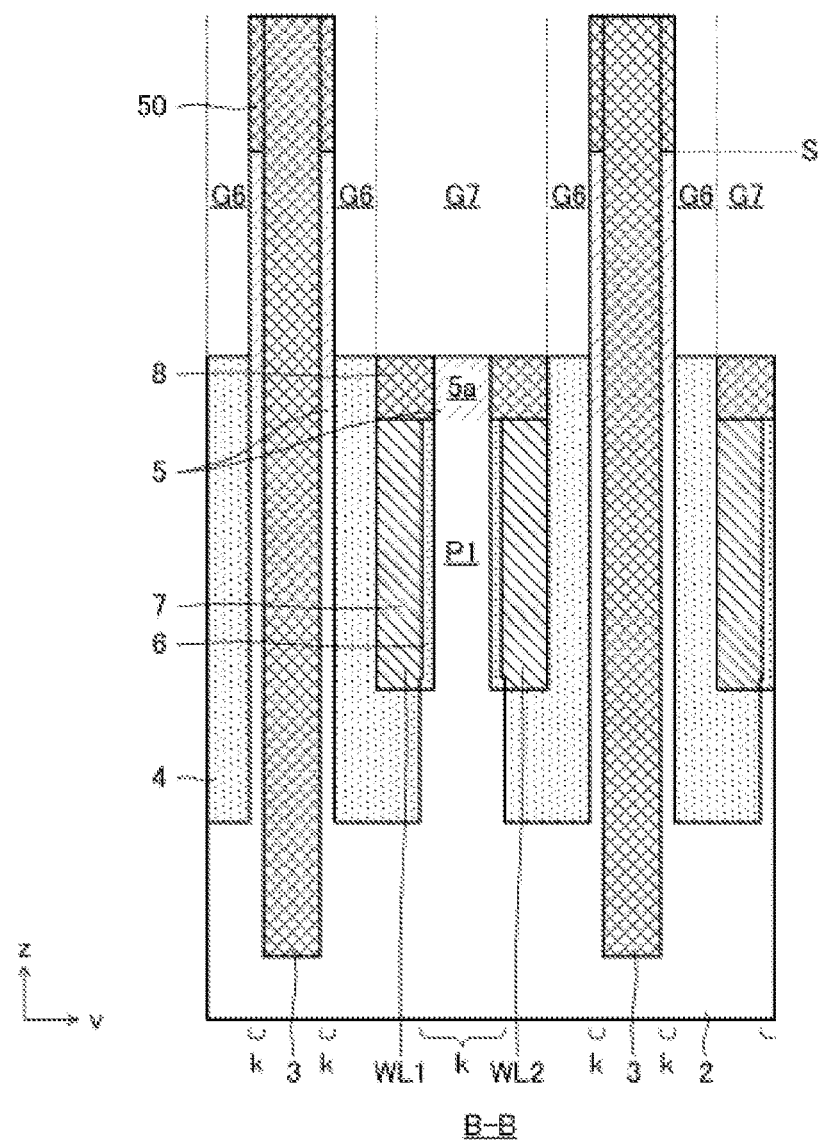
FIG. 52 is a vertical sectional view of the semiconductor device 1 that is taken along a B-B line of FIG. 50.
Figure 53:
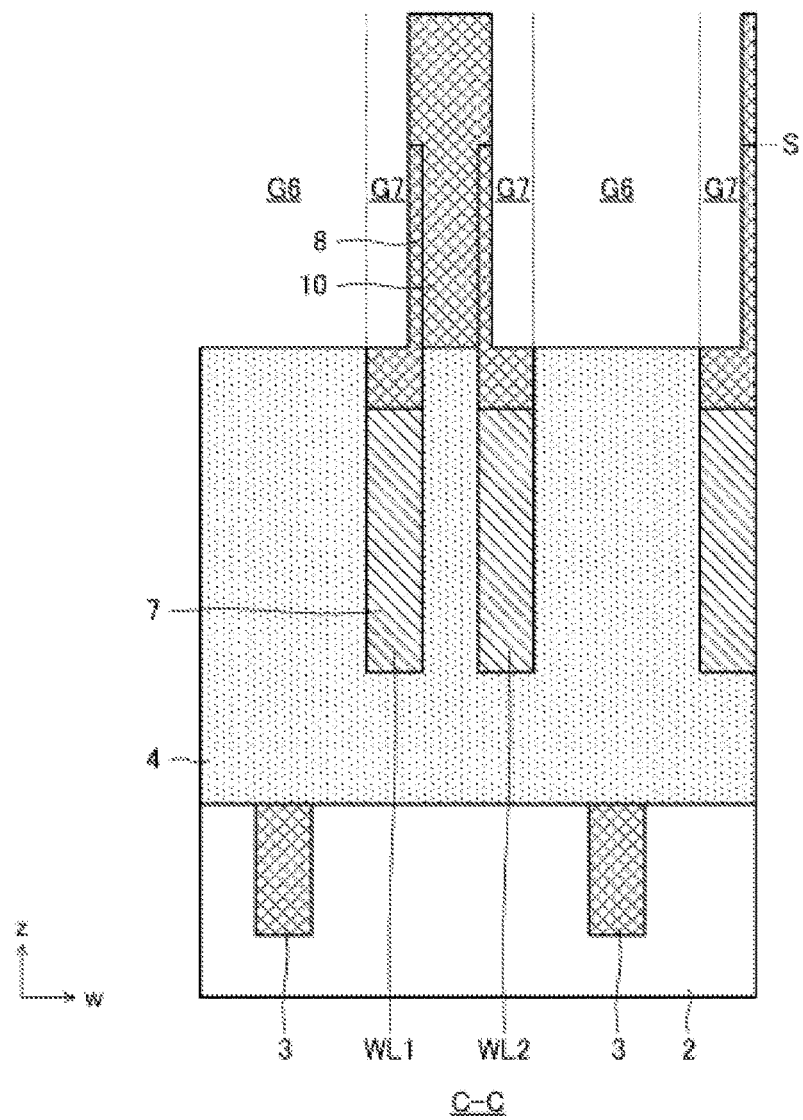
FIG. 53 is a vertical sectional view of the semiconductor device 1 that is taken along a C-C line of FIG. 50.
Figure 54:
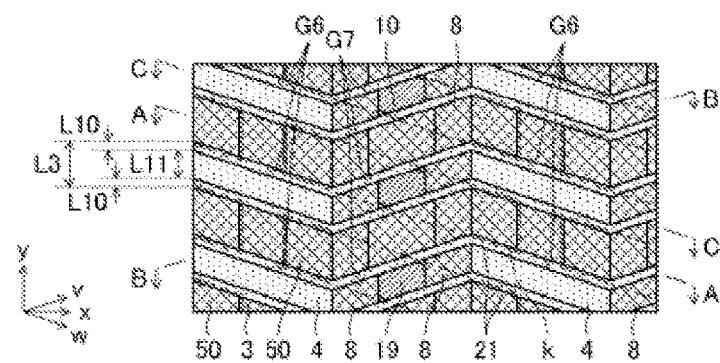
FIG. 54 is a top view of the semiconductor device 1 during a manufacturing process (which follows the process indicated in FIG. 50).
Figure 55:
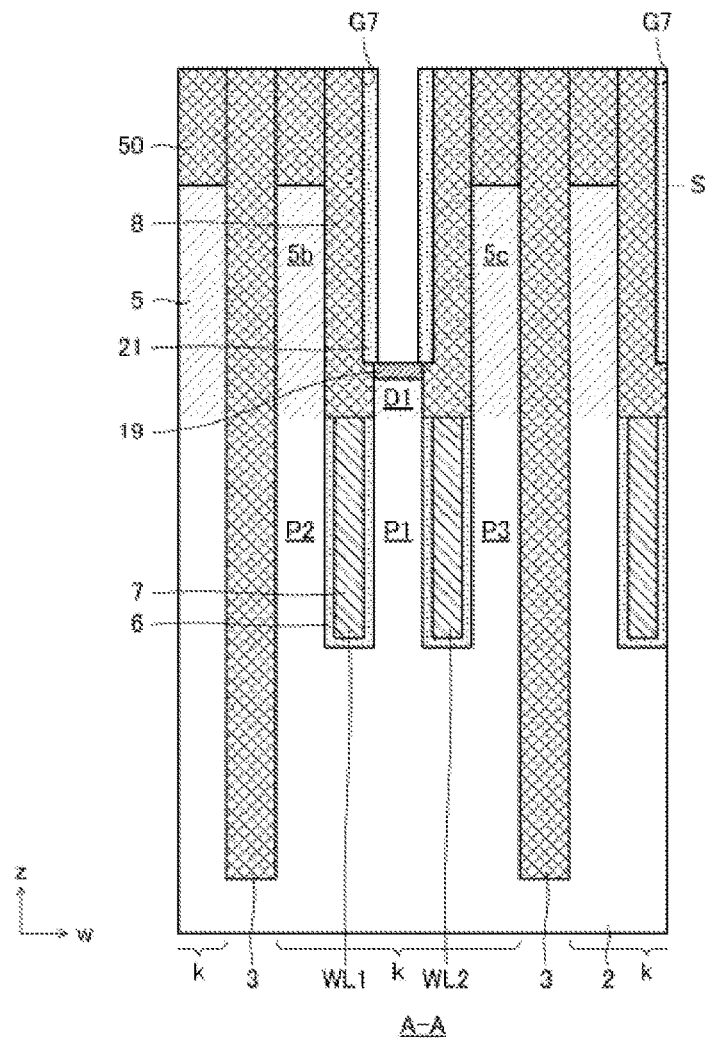
FIG. 55 is a vertical sectional view of the semiconductor device 1 that is taken along an A-A line of FIG. 54.
Figure 56:
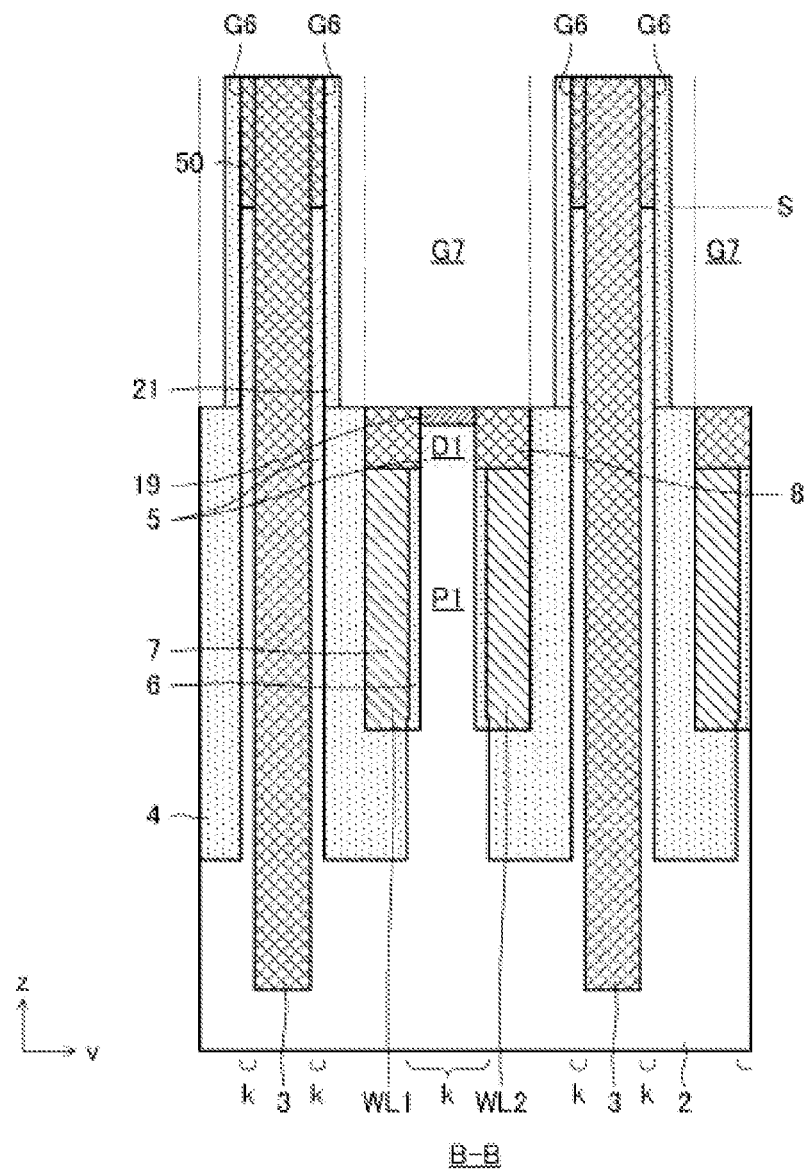
FIG. 56 is a vertical sectional view of the semiconductor device 1 that is taken along a B-B line of FIG. 54.
Figure 57:
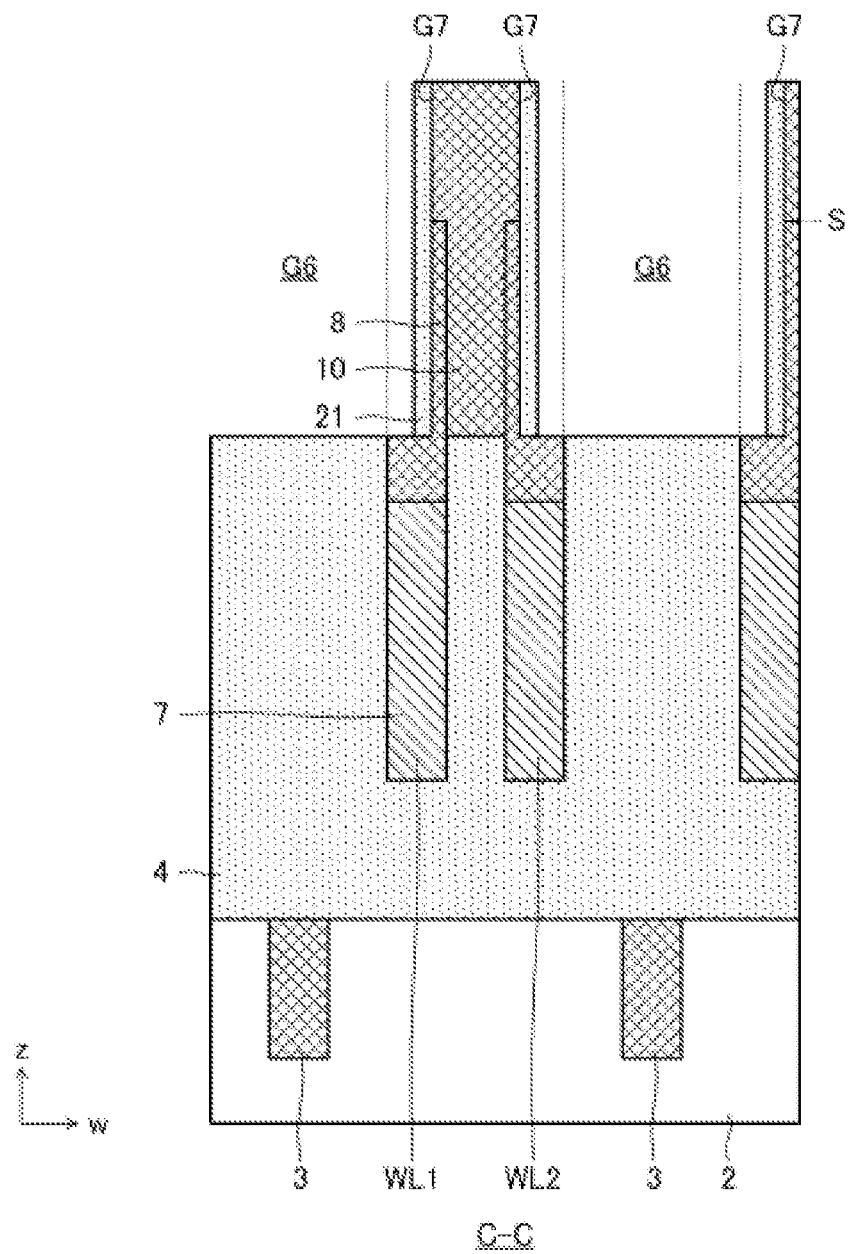
FIG. 57 is a vertical sectional view of the semiconductor device 1 that is taken along a C-C line of FIG. 54.
Figure 58:
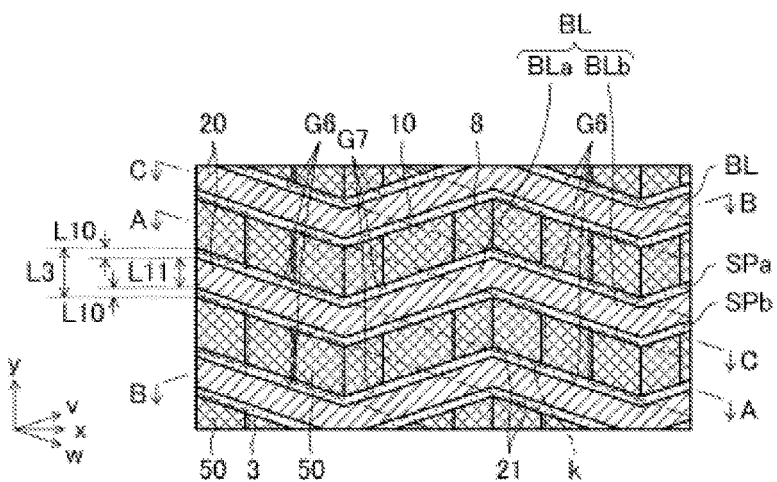
FIG. 58 is a top view of the semiconductor device 1 during a manufacturing process (which follows the process indicated in FIG. 54).
Figure 59:
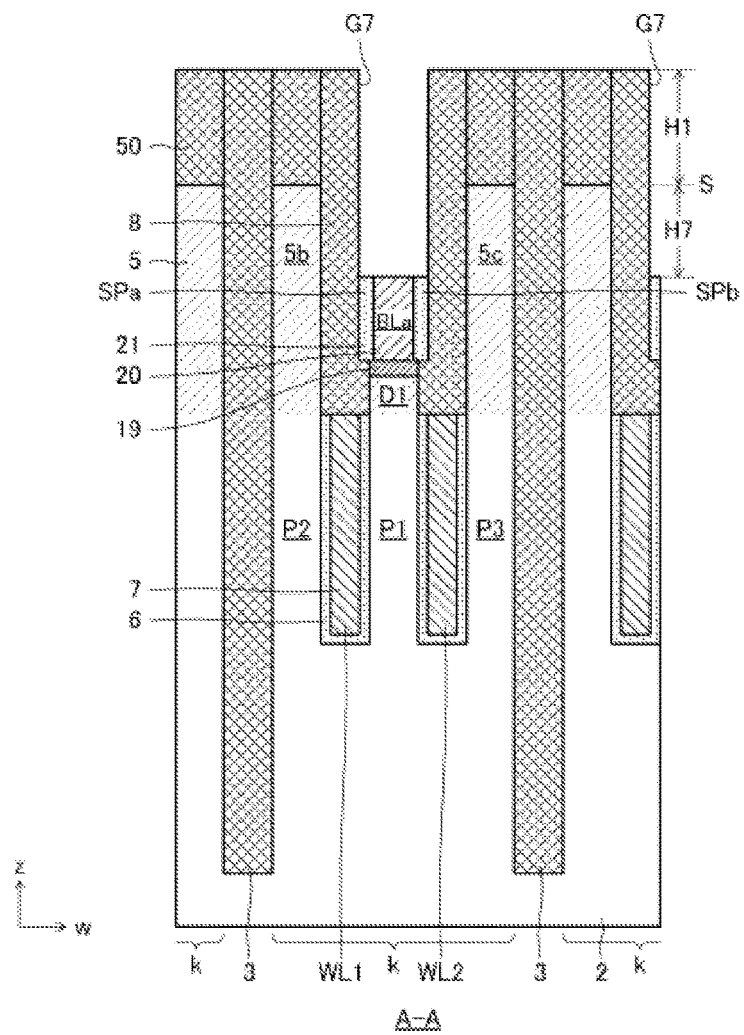
FIG. 59 is a vertical sectional view of the semiconductor device 1 that is taken along an A-A line of FIG. 58.
Figure 60:
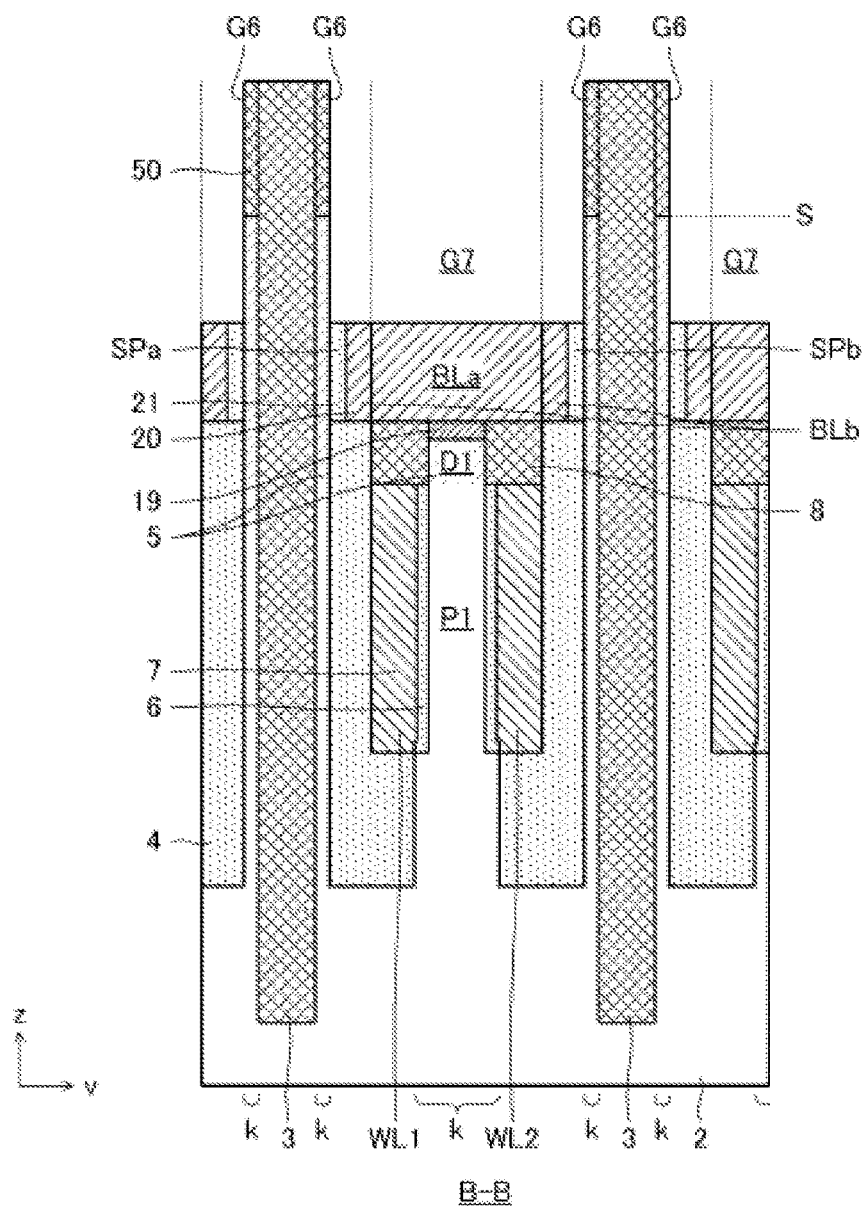
FIG. 60 is a vertical sectional view of the semiconductor device 1 that is taken along a B-B line of FIG. 58.
Figure 61:
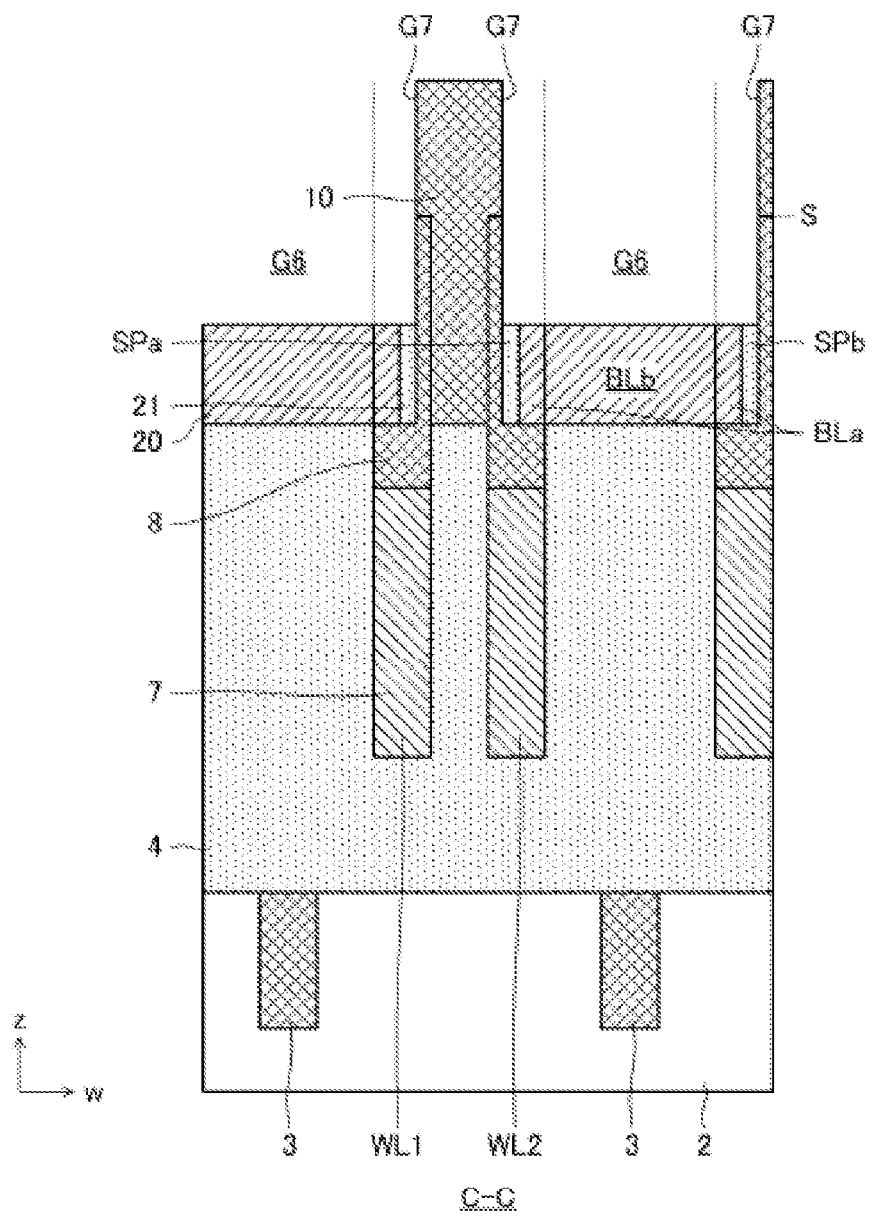
FIG. 61 is a vertical sectional view of the semiconductor device 1 that is taken along a C-C line of FIG. 58.
Figure 62:
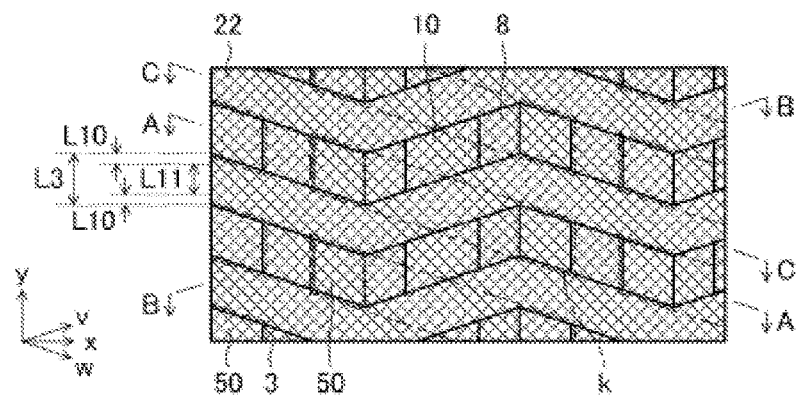
FIG. 62 is a top view of the semiconductor device 1 during a manufacturing process (which follows the process indicated in FIG. 58).
Figure 63:
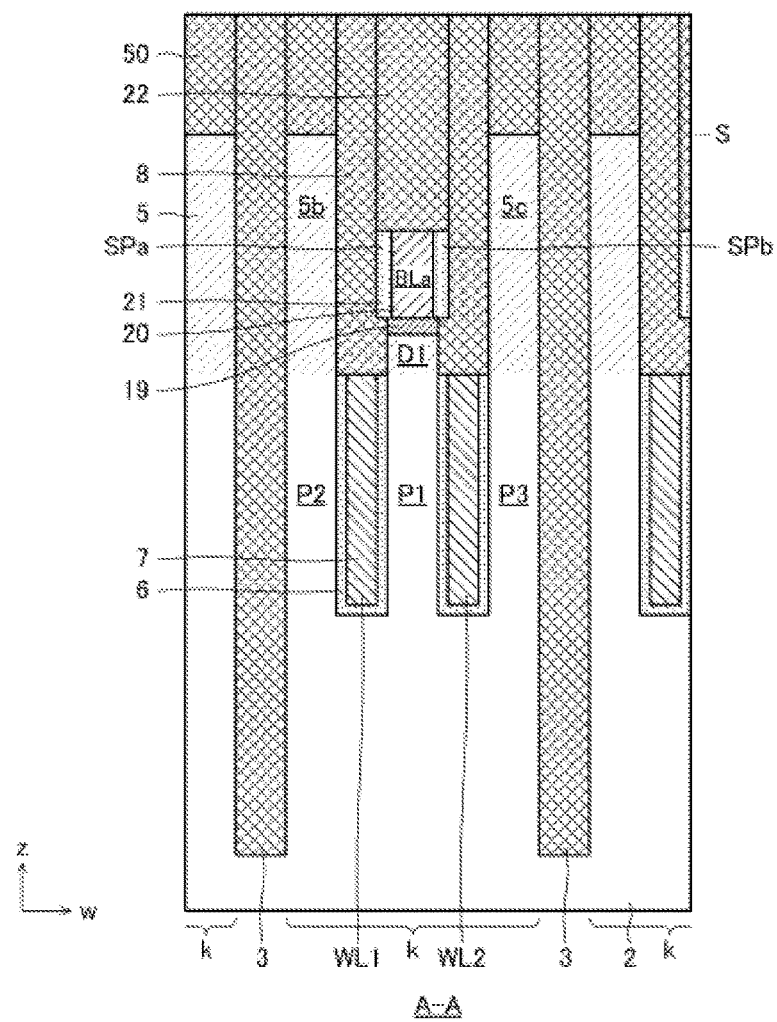
FIG. 63 is a vertical sectional view of the semiconductor device 1 that is taken along an A-A line of FIG. 62.
Figure 64:
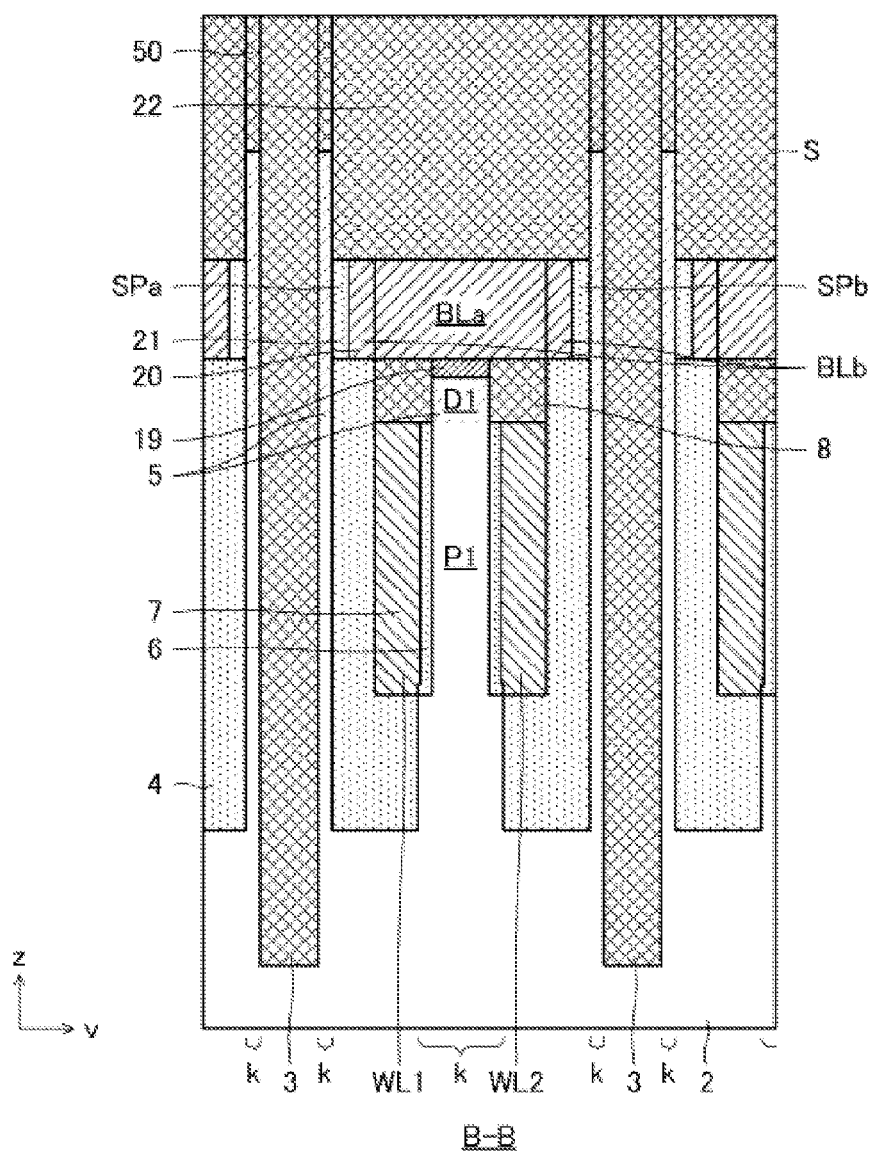
FIG. 64 is a vertical sectional view of the semiconductor device 1 that is taken along a B-B line of FIG. 62.

By further proceeding with the etching, the bitline trenches G7, which have been transferred to the amorphous carbon film 57, is transferred to the first cap dielectric film 8 and protective dielectric film 10, as shown in FIGS. 47 to 49. In the course of this etching, the photoresist 60, silicon oxide film 58, and silicon nitride film 59 virtually vanish. As shown in FIGS. 47 to 49, each bitline trench G7 transferred to the amorphous carbon film 57, first cap dielectric film 8, and protective dielectric film 10 is a parallelogram with one pair of opposed sides extending in the v direction and the other pair of opposed sides extending in the y direction. The depth of the bitline trench G7 from the main surface S is determined to be the same depth H6 of the bit contact trench G5. At the bottom of the bitline trench G7, therefore, the first portion 5a of the impurity diffusion layer 5 and the first cap dielectric film 8 and isolation dielectric film 4 located around the first portion 5a are exposed. It is understood from FIG. 49 that the bitline trench G7 is integrated with the bitline trenches G6 adjacent in the x direction to the bitline trench G7 on its both sides in the x direction. As a result, multiple bitline trenches G6 and G7 arranged in the x direction make up a single snaking trench extending in the x direction as a whole.

In the above process, the bitline trenches G7 are transferred to the first cap dielectric film 8 and protective dielectric film 10 by etching that leaves the unetched photoresist 60 as it is. However, following transfer of the bitline trenches G7 to the amorphous carbon film 57, the photoresist 60 may be eliminated. In such a process, the amorphous carbon film 57 protects the isolation dielectric film 3 and hard mask film 50 from the etching liquid, thus preventing a case where the bitline trench G7 is expanded out from the region having the width L9a with the protective dielectric film 10 at its center.

Subsequently, the remaining amorphous carbon film 57 is eliminated to expose the bitline trenches G6, as shown in FIGS. 50 to 53. At the bottom of each exposed bitline trench G6, the isolation dielectric film 4 is exposed.

Subsequently, a silicon oxide film having a thickness L10 of, for example, 4 nm is formed across the whole surface by CVD or ALD. As a result, the inner surfaces of the bitline trenches G6 and G7 are covered with the silicon oxide film, which is then entirely etched back by anisotropic dry etching. This etching back eliminates the part of silicon oxide film that is formed on the bottom face of the bitline trenches G6 and G7, thus leaving a side-wall-shaped silicon oxide film 21 on the one and another of inner side faces of the bitline trenches G6 and G7, as shown in FIGS. 54 to 57. The silicon oxide film 21 left on the side faces serves as the bitline spacers SPa and SPb. The bitline spacer SPa is on the one of inner side faces of the bitline trenches G6 and G7. The bitline spacer SPb is on another of inner side faces of the bitline trenches G6 and G7.

It is understood from the above processes that the silicon oxide film 21 is formed on the inner side faces of the bitline trenches G6 and G7 in a self-aligning manner. A positional shift of the silicon oxide film 21, therefore, never occurs. The horizontal thickness L10 of the silicon oxide film 21 left on the one and another of inner side faces of the bitline trenches G6 and G7 is defined by the original film thickness adopted at the formation of the silicon oxide film 21, and is therefore controlled precisely.

Subsequently, a cobalt film is formed by sputtering. This film formation process is controlled such that the cobalt film on the upper surface of the impurity diffusion layer 5a exposed on the bottom of the bitline trench G7 has a thickness of 2 nm. The cobalt film and the silicon making up the impurity diffusion layer 5a are then caused to react with each other by a heat treatment to form the metal silicide film 19 of 3 to 4 nm in thickness on top of the first diffusion layer 5a exposed on the bottom of the bitline trench G7. As a result, the first diffusion layer D1 composed of the first portion 5a of the impurity diffusion layer 5a and the metal silicide film 19 is formed on top of the semiconductor pillar P1. The cobalt film is formed also on the surface where various films other than the impurity diffusion layer 5a are exposed. It is understood from FIG. 54 that because the exposed films are all dielectric films, they do not react with the cobalt film when subjected to the heat treatment, in which case no metal silicide film is formed.

Subsequently, the remaining non-reactive cobalt film is eliminated by a solution containing a sulfuric acid, after which a titanium nitride film of 2 nm in thickness serving as a barrier metal is formed by CVD or ALD and then a tungsten film of 10 nm in thickness serving as a low-resistance line is formed by CVD. By this film forming process, the titanium nitride film is formed uniformly across the whole surface including the upper surface of the metal silicide film 19. When formation of the titanium nitride film is over, a space with a width in the y direction of 8 nm is left in the bitline trenches G6 and G7. This space is filled completely with the tungsten film that is formed after formation of the titanium nitride film. Subsequently, the titanium nitride film and tungsten film deposited outside the bitline trenches G6 and G7 are eliminated by dry etching, and the titanium nitride film and tungsten film deposited in bitline trenches G6 and G7 are etched back. Hence, as shown in FIGS. 58 to 61, the bitline BL is formed in the bitline trenches G6 and G7. The bitline BL formed in this manner is composed of the intersect line portions BLa formed in the bitline trenchers G7 and the parallel line portions BLb formed in the bitline trenchers G6.

The depth of the bitline BL is adjusted such that its upper surface is located lower than the main surface S by the depth H7 (that is, at this point, located at least lower than the upper surfaces of the second and third portions 5b and 5c of the impurity diffusion layer 5). As described above, the depth H7 is determined to be within a range of 10 nm to 50 nm, and should preferably be 40 nm. Given the fact that the height H1 of the hard mask film 50 is 50 nm, therefore, when the depth H7 is 40 nm, the depth of the bitline trenches G6 and G7 (depth from the top surface) after formation of the bitline BL is determined to be H1+H7=90 nm.

The width L11 of the bitline BL is determined to be 12 nm that is smaller than the minimum processing dimension F (20 nm). Such a thin bitline BL can be formed according to this embodiment because the bitline BL is formed by a non-lithographic method, which is understood from the above description of film forming methods.

Subsequently, a silicon nitride film is formed by CVD or ALD such that it fills up the bitline trenches G6 and G7, and the silicon nitride film deposited outside the bitline trenches G6 and G7 is eliminated by etching back or CMP. As a result, as shown in FIGS. 62 to 65, the second cap dielectric film 22 filling up the upper part of the bitline trenches G6 and G7 is formed. As shown in FIGS. 62 to 65, after formation of the second cap dielectric film 22, the whole upper surface becomes a flat surface where only the silicon nitride film (including, specifically, the isolation dielectric film 3, first cap dielectric film 8, second cap dielectric film 22, protective dielectric film 10, and hard mask film 50) is exposed.

Subsequently, as shown in FIG. 3, etc., two capacitors C are formed in each active area k. According to the conventional method of manufacturing the semiconductor device, the silicon nitride film functioning as a stopper must be formed on the surface before formation of the cylinder holes G9. The method of manufacturing the semiconductor device according to the first embodiment, however, does not require the formation of the silicon nitride film as the stopper because the entire exposed surface is the silicon nitride film surface.

A method of forming the capacitor C will be described specifically, referring to FIG. 3. First, a silicon oxide film is deposited across the surface by CVD to form the cylinder dielectric film 34, whose thickness H8 is determined to be, for example, 1500 nm. The cylinder dielectric film 34 is then etched by lithography and anisotropic dry etching to form the cylindrical cylinder hole G9 for each of the semiconductor pillars P2 and P3. At this stage, the hard mask film 50 above the semiconductor pillars P2 and P3 and the silicon nitride film around the hard mask film 50 are exposed on the bottom of the cylinder hole G9. The silicon nitride film is then etched by anisotropic dry etching to extend the cylinder hole (through-hole) G9 into the silicon nitride film. At this stage, the upper surface of the impurity diffusion layer 5 (second or third portion shown in FIG. 63) formed on top of the corresponding semiconductor pillar P2 or P3 is exposed on the bottom of the cylinder hole G9.

Subsequently, the metal silicide film 29 is formed on top of each of the semiconductor pillars P2 and P3 by carrying out the same process by which the metal silicide film 19 is formed on top of the semiconductor pillar P1. As a result, the diffusion layers D2 and D3 are formed on top of the semiconductor pillars P2 and P3, respectively. The diffusion layers D2 and D3 are each composed of the impurity diffusion layer 5 and the metal silicide film 29.

Subsequently, the lower electrode 30 made of such a metallic film as titanium nitride film is formed on the inner surface of the cylinder hole G9 by CVD or ALD. At the bottom of the cylinder hole G9, the lower electrode 30 is connected to the uppers surface of the corresponding diffusion layer D2 or D3. Following this process, the capacitor dielectric film 31 and the upper electrode 32 are formed in increasing order by CVD or ALD. Hence the semiconductor device 1 is completed.

As described above, according to the method of manufacturing the semiconductor device of the first embodiment, the bitline BL is insulated from the conductive layers (diffusion layers D2 and D3) adjacent thereto, via the bitline spacers SPa and SPb. A parasitic capacitance created between the bitline BL and the conductive layers is, therefore, reduced, which realizes the faster operation of the semiconductor device 1.

Because the bitline BL is located below the upper surfaces of the diffusion layers D2 and D3, forming a memory element contact plug is not necessary. This avoids a contact resistance problem that the trench gate type semiconductor device must deal with.

The bitline trenches G6 and G7 are formed on the silicon nitride film layer, and the bitline spacers SPa and SPb and bitline BL are formed in the bitline trenches G6 and G7. This means that the bitline BL can be formed by a simple process similar to the process of forming the bitline BL in the conventional trench gate type semiconductor device. Compared to the vertical-transistor-utilized semiconductor device, therefore, the semiconductor device of the first embodiment offers higher production yield.

Figure 66:
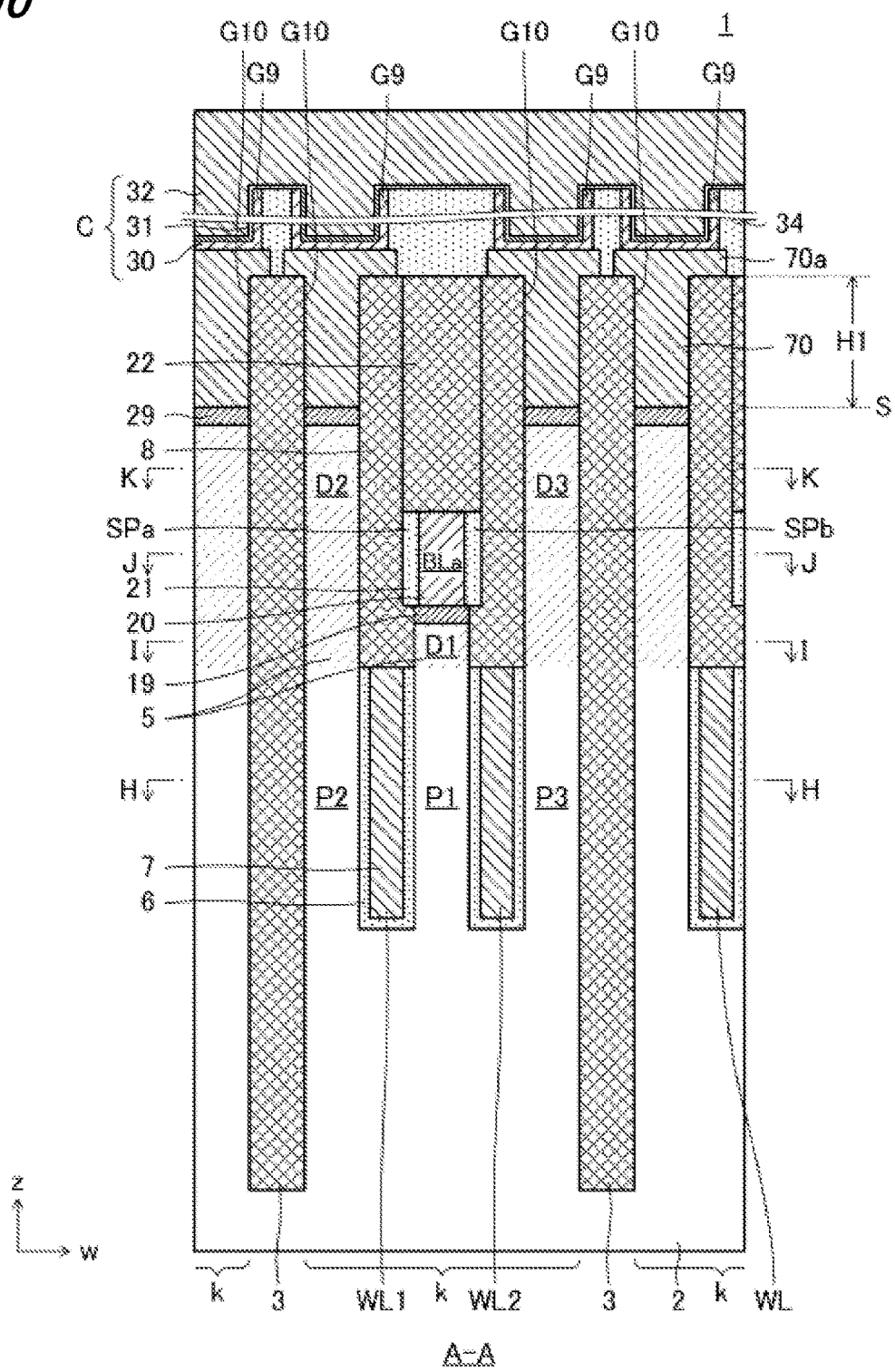
FIG. 66 is a vertical sectional view of the semiconductor device 1 according to a preferred second embodiment of the present invention, showing a sectional view taken along the A-A line of FIG. 1.

A configuration of the semiconductor device 1 according to a second embodiment of the present invention will then be described, referring to FIG. 66. FIG. 66 is a vertical sectional view of the semiconductor device 1 according to the second embodiment that corresponds to an A-A sectional view of FIG. 3.

The semiconductor device 1 of the second embodiment is different from the semiconductor device 1 of the first embodiment in that a metal film 70 is provided between the lower electrode 30 and each of the diffusion layers D2 and D3, and is identical with the semiconductor device 1 of the first embodiment in other aspects. The same constituent elements as described in the first embodiment, therefore, will be denoted by the same reference numerals used in the first embodiment, and the following description will be made by paying attention to differences between both embodiments.

According to a method of manufacturing the semiconductor device 1 of the second embodiment, after a state of processing shown in FIGS. 62 to 65 is achieved, the silicon nitride film is etched to form a contact hole (though-hole) G10 above each of the semiconductor pillars P2 and P3, before formation of the cylinder dielectric film 34. The contact hole G10 is a cylindrical hole having a depth H1 of, for example, 50 nm and a diameter of 20 nm. The location of the contact hole G10 is so determined that the corresponding semiconductor pillar P2 or P3 is exposed at the bottom of the contact hole G10.

Subsequently, the metal silicide film 29 is formed on top of each of the semiconductor pillars P2 and P3 in the same manner as in the first embodiment. As a result, the diffusion layers D2 and D3 are formed on top of the semiconductor pillars P2 and P3, respectively.

Subsequently, a titanium nitride film of 10 nm in thickness and a tungsten film of 20 nm in thickness are formed in increasing order across the surface by CVD, to form the metal film (contact plug) 70, which is a lamination of the titanium nitride film and the tungsten film. The titanium nitride film is deposited in the contact hole G10 as well as outside the contact hole G10. Meanwhile, the tungsten film is formed as a flat film on the titanium nitride film.

Subsequently, by patterning the metal film 70 by lithography and anisotropic dry etching, the part of metal film 70 that is deposited outside the contact hole G10 is processed into a metal pad 70a larger in diameter than the cylinder hole G9. Following this, the cylinder dielectric film 34 is formed and the cylinder hole G9 is formed thereon in the same manner as in the first embodiment. Etching of the cylinder dielectric film 34 for forming the cylinder hole G9 is, however, stopped at the point that the upper surface of the metal pad 70a is exposed at the bottom of the cylinder hole G9. Following this, in the same manner as in the first embodiment, the lower electrode 30, the capacitor dielectric film 31, and the upper electrode 32 are formed in order. Hence the semiconductor device 1 of the second embodiment is completed.

According to the semiconductor device 1 of the second embodiment and the method of manufacturing the same, it is unnecessary to form the cylinder holes G9 larger in diameter than the contact holes G10 in the silicon nitride film (in the hard mask film 50 and the silicon nitride film formed around it). The amount of etching of the silicon nitride film, therefore, can be reduced to be smaller than the same in the case of the first embodiment.

Figure 67:
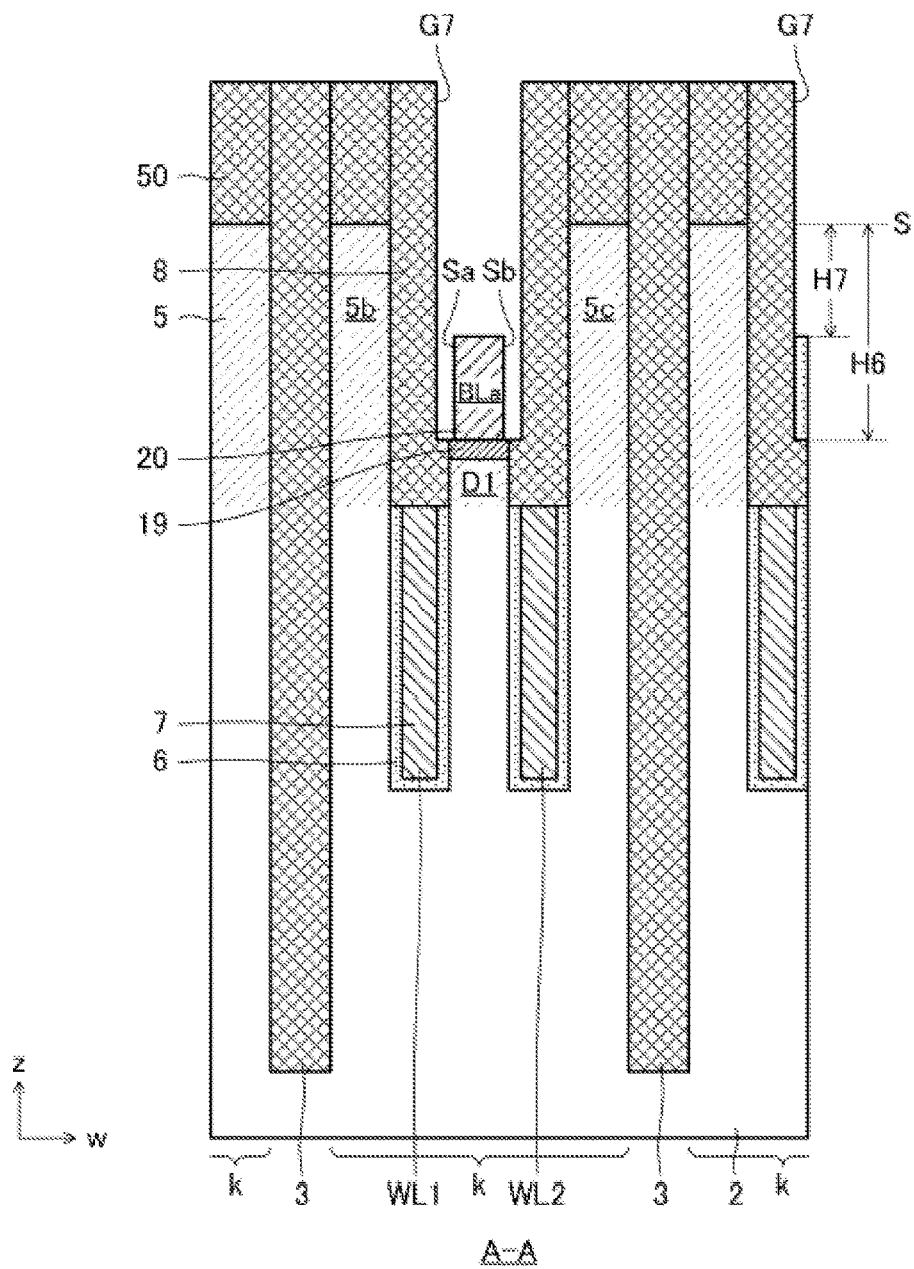
FIG. 67 is a vertical sectional view of the semiconductor device 1 according to a preferred third embodiment of the present invention during a manufacturing process (which follows a process indicated in FIG. 59).
Figure 68:
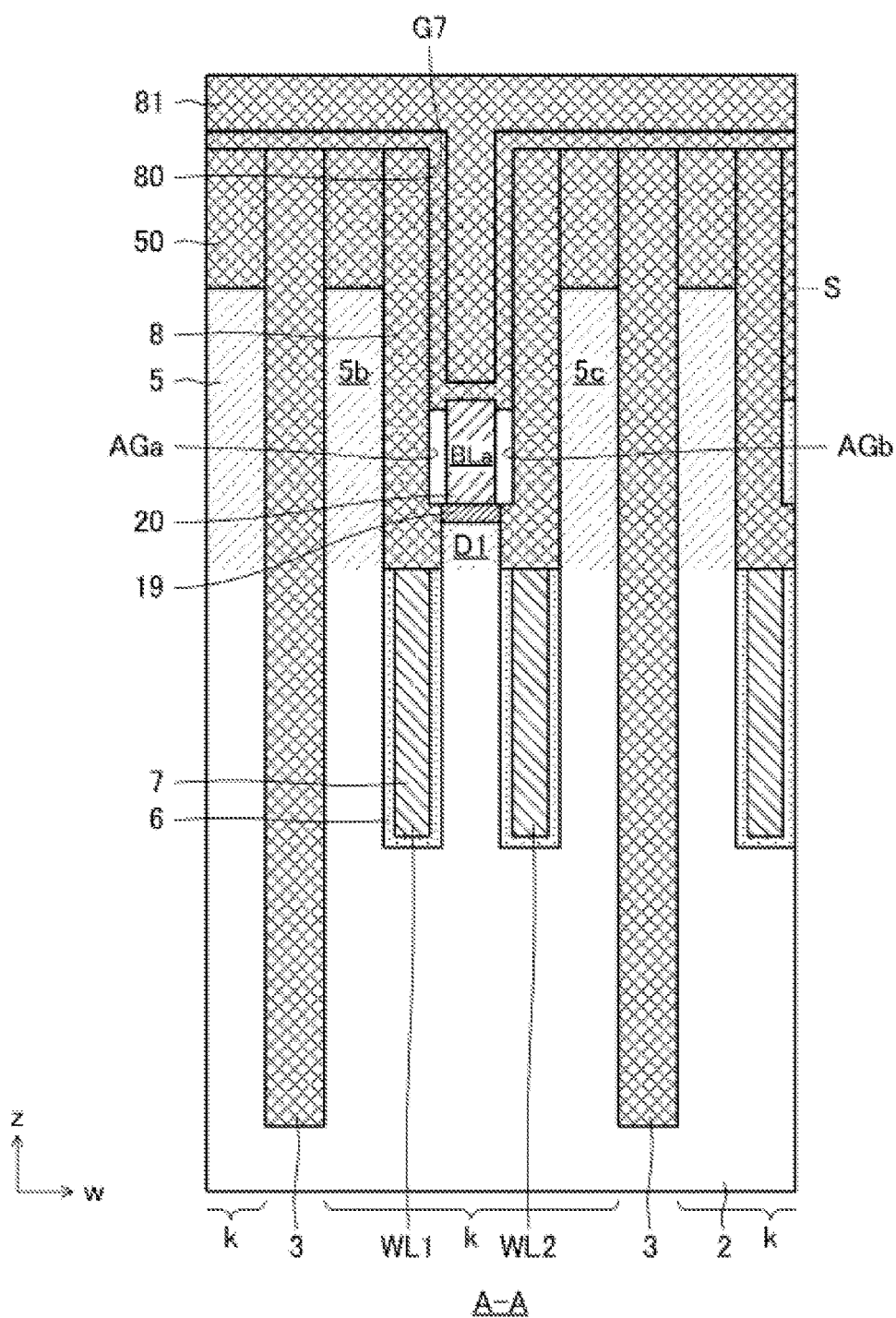
FIG. 68 is a vertical sectional view of the semiconductor device 1 during a manufacturing process (which follows the process indicated in FIG. 67).
Figure 69:
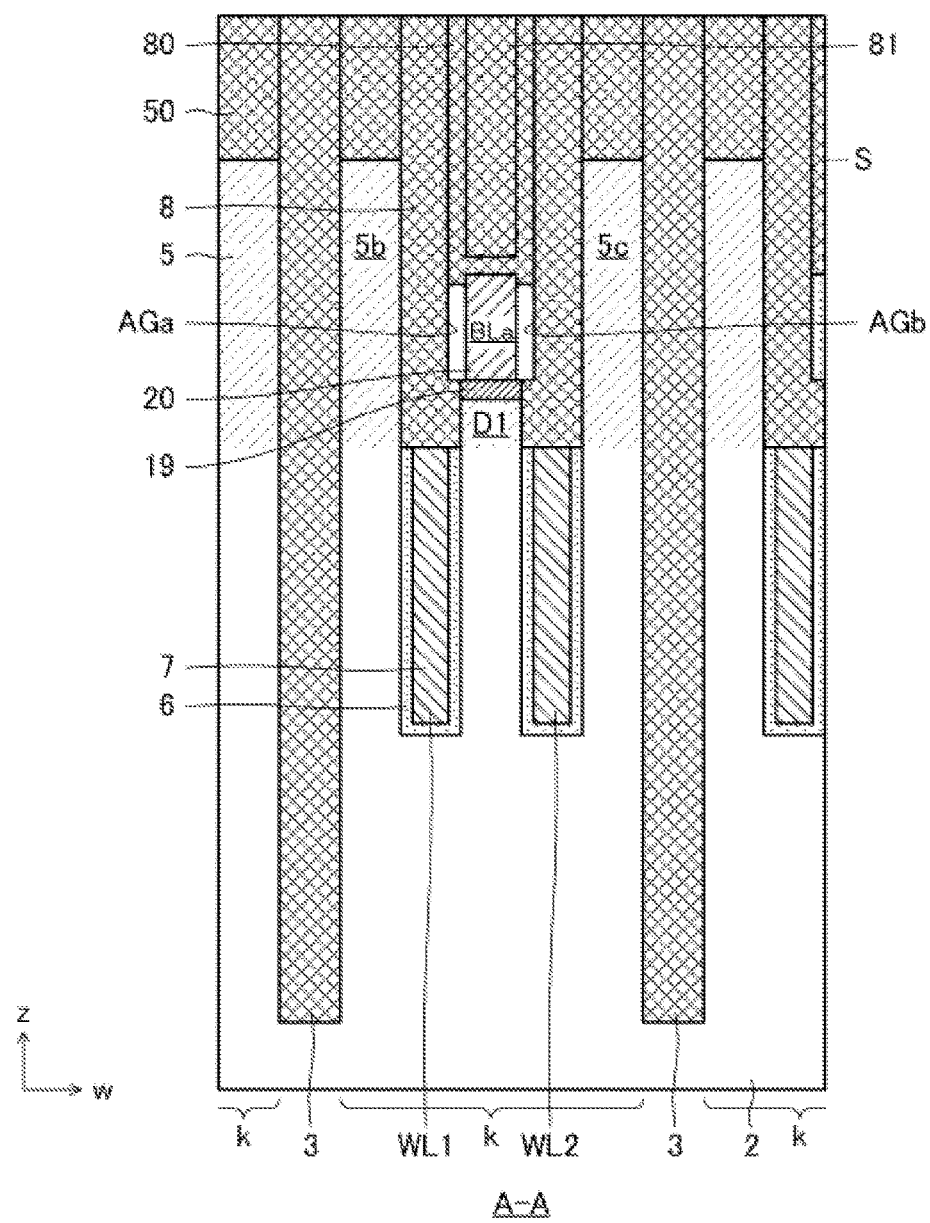
FIG. 69 is a vertical sectional view of the semiconductor device 1 during a manufacturing process (which follows the process indicated in FIG. 68).

A configuration of the semiconductor device 1 according to a third embodiment of the present invention will then be described, referring to FIGS. 67 to 69. FIGS. 67 to 69 are vertical sectional views of the semiconductor device 1 according to the third embodiment during a manufacturing process that follows a manufacturing process indicated in FIG. 59, each corresponding to the A-A sectional view of FIG. 3.

The semiconductor device 1 of the third embodiment is different from the semiconductor device 1 of the first embodiment in that air gaps AGa and AGb are provided in place of the bitline spacers SPa and SPb made of the silicon oxide film 21, and is identical with the semiconductor device 1 of the first embodiment in other aspects. The same constituent elements as described in the first embodiment, therefore, will be denoted by the same reference numerals used in the first embodiment, and the following description will be made by paying attention to differences between both embodiments.

According to a method of manufacturing the semiconductor device 1 of the third embodiment, after a state of processing shown in FIGS. 58 to 61 is achieved, the silicon oxide film 21 making up the bitline spacers SPa and SPb is eliminated by selective etching using a solution containing a hydrofluoric acid. As a result, spacer slits Sa and Sb are formed in the location originally occupied by the bitline spacers SPa and SPb shown in FIG. 67. The width in the y direction of each of the spacer slits SPa and SPb is the width L10 (e.g., 4 nm) shown in FIG. 58, and the height of the same (i.e., distance between the lower end and upper end of each of the spacer slits SPa and SPb) is equal to H6-H7 (e.g., 75 nm−40 nm=35 nm).

Subsequently, as shown in FIG. 68, a protective dielectric film 80, which is, for example, a silicon nitride film of 4 nm in thickness, is formed by plasma CVD with inferior step coverage. The protective dielectric film 80 formed in this manner hardly spreads into the spacer slits Sa and Sb. As a result, the air gaps AGa and AGb are formed inside the spacer slits Sa and Sb, respectively. The protective dielectric film 80 is formed on the upper surface of the bitline BL, the inner surface of the bitline trenches G6 and G7 located above the bitline BL, and the upper surface of the hard mask film 50.

Subsequently, a silicon nitride film is formed by CVD or ALD with superior step coverage to form a protective dielectric film 81 that fills up the bitline trenches G6 and G7. The protective dielectric film 81 is formed also on the upper surface of the protective dielectric film 80 formed on the upper surface of the hard mask film 50, etc. Following this, the silicon nitride film deposited outside the bitline trenches G6 and G7 are eliminated by etching back or CMP. As a result, the bitline BL with the air gaps AGa and AGb is buried in the bitline trenches G6 and G7 shown in FIG. 69. Processes to follow this process are the same as those of the first embodiment. Hence the semiconductor device 1 of the third embodiment is completed.

The air gaps have a dielectric constant (about 1) smaller than that of the silicon oxide film. Providing the air gaps AGa and AGb in place of the bitline spacers SPa and SPb, therefore, further reduces the parasitic capacitance of the bitline BL. This improves sensitivity to detection of memory charges stored in the capacitor C and allows the semiconductor device 1 to operate even faster.

Figure 70A:
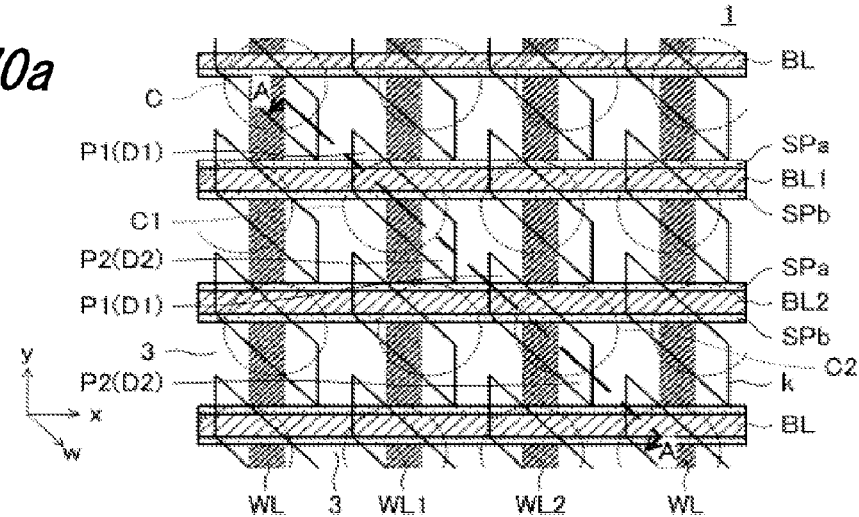
FIG. 70a is a diagram showing a planar structure of the semiconductor device 1 according to a preferred fourth embodiment of the present invention.
Figure 70B:
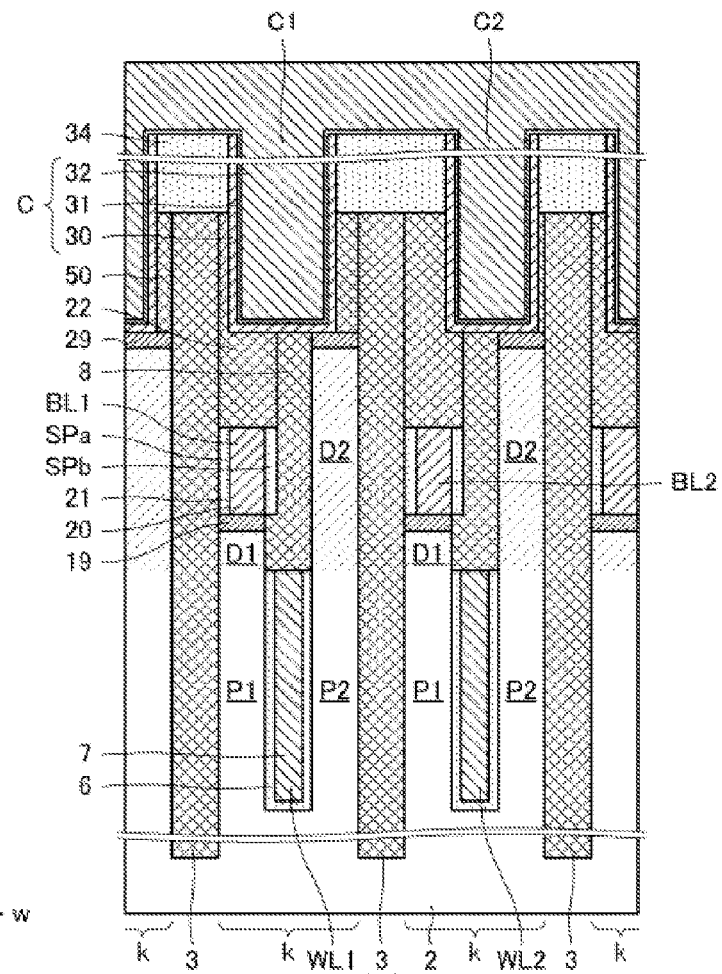

A configuration of the semiconductor device 1 according to a fourth embodiment of the present invention will then be described, referring to FIGS. 70a and 70b. FIG. 70a is a diagram showing a planar structure of the semiconductor device 1 according to the fourth embodiment, and FIG. 70b is a sectional view of the semiconductor device 1 that is taken along an A-A line of FIG. 70a.

The semiconductor device 1 of the fourth embodiment is different from the semiconductor device 1 of the first embodiment in that only one memory cell is disposed in one active area k, that the bitline BL is formed into a linear shape, and that the isolation dielectric film 3 (silicon nitride film) is used in place of the isolation dielectric film 4 (silicon oxide film). In other aspects, the semiconductor device 1 of the fourth embodiment is identical with the semiconductor device 1 of the first embodiment. The same constituent elements as described in the first embodiment, therefore, will be denoted by the same reference numerals used in the first embodiment, and the following description will be made by paying attention to differences between both embodiments.

Each active area k of the fourth embodiment is identical in shape with each active area k of the first embodiment, being a parallelogram having one pair of opposed sides parallel with the w direction and the other pair of opposed sides parallel with the y direction. According to the fourth embodiment, the w direction is inclined against the x direction by about 45 degrees. The active areas k are arranged such that they are lined up in the x direction into multiple rows extending in the x direction, in the y direction into multiple rows extending in the y direction, and in the w direction into multiple rows extending in the w direction. Each active area k is entirely surrounded with the isolation dielectric film 3, i.e., silicon nitride film, and is separated from an adjacent different active area k via the isolation dielectric film 3.

The wordlines WL (including the wordlines WL1 and WL2 shown in FIGS. 70a and 70b) are arranged such that each wordline WL passes through each of multiple active areas k lined up in the y direction. Different from the case of the first embodiment, only one wordline WL passes through one active area k. Each wordline WL is disposed such that it passes through the center in the x direction of each of the active areas k corresponding to the wordline WL.

Each active area k is divided by the corresponding wordline WL into two subareas respectively making up the semiconductor pillars P1 and P2. On top of the semiconductor pillar P1, the diffusion layer D1 connected to the corresponding bitline BL is formed. The bitline BL is formed such that it intersects each of multiple active areas k lined up in the x direction as it extends linearly in the x direction, and is therefore connected to the diffusion layer D1 in each active area k corresponding to the bitline BL. On top of the semiconductor pillar P2, the diffusion layer D2 connected to the lower electrode 30 of the corresponding capacitor C is formed.

According to the fourth embodiment, because the bitline BL is linear, using not the complicated method of the first embodiment but a simpler method for forming the bitline trench is preferable. Specifically, after the first cap dielectric film 8 covering the upper surface of the wordline WL is formed in the same manner as in the first embodiment, the silicon nitride film and the semiconductor substrate 2 are etched at a constant etching rate to form the bitline trench extending in the x direction. In this manner, the bitline trench can be formed by the method without resorting to wet etching. This method of forming the bitline trench is the same as the method of the first embodiment in that the bitline trench is formed in the silicon nitride film layer. In the same manner as in the first embodiment, therefore, the diffusion layer D2 can be insulated from the bitline BL via the bitline spacers SPa and SPb made of the silicon oxide film with a dielectric constant smaller than that of the silicon nitride film.

As described above, according to the semiconductor device 1 of the fourth embodiment, the diffusion layer D2 is insulated from the bitline BL via the bitline spacers SPa and SPb made of the silicon oxide film, in the same manner as in the first embodiment. As a result, the parasitic capacitance between the bitline and the diffusion layer D2 is reduced, which realizes the faster operation of the semiconductor device 1.

In the same manner as in the first embodiment, the bitline BL is buried in a location deeper than the upper surface of the diffusion layer D2 (main surface S). Providing the above memory element contact plug is, therefore, unnecessary. In this case, a problem that the memory element contact plug cannot be disposed at the center of the upper surface of the diffusion layer D2 does not arise and therefore a problem of an increase in the contact resistance between the capacitor C and the diffusion layer D2 does not arise, either.

The fourth embodiment also offers the advantage that the arrangement of the lower electrodes 30 is not hampered by the bitline BL, as the first embodiment does. As a result, the lower electrodes 30 can be arranged in a close-packed structure, which allows enlargement of the surface area of the capacitor C, thus allowing an increase in the capacitance of the capacitor C. If the lower electrode 30 is so disposed as to extend across multiple active areas k, the active areas k may short-circuit via the lower electrode 30, which is another problem. According to the fourth embodiment, such disposition of the lower electrode 30 is avoided and yet the lower electrodes 30 can be arranged in a close-packed structure.

Figure 71A:
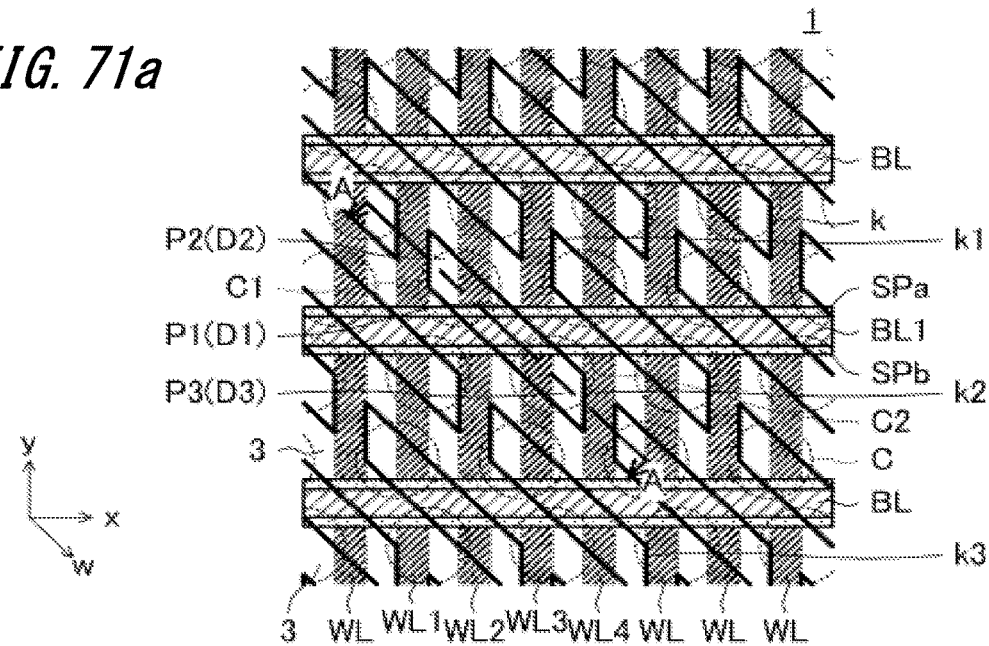
FIG. 71a is a diagram showing a planar structure of the semiconductor device 1 according to a preferred fifth embodiment of the present invention.
Figure 71B:
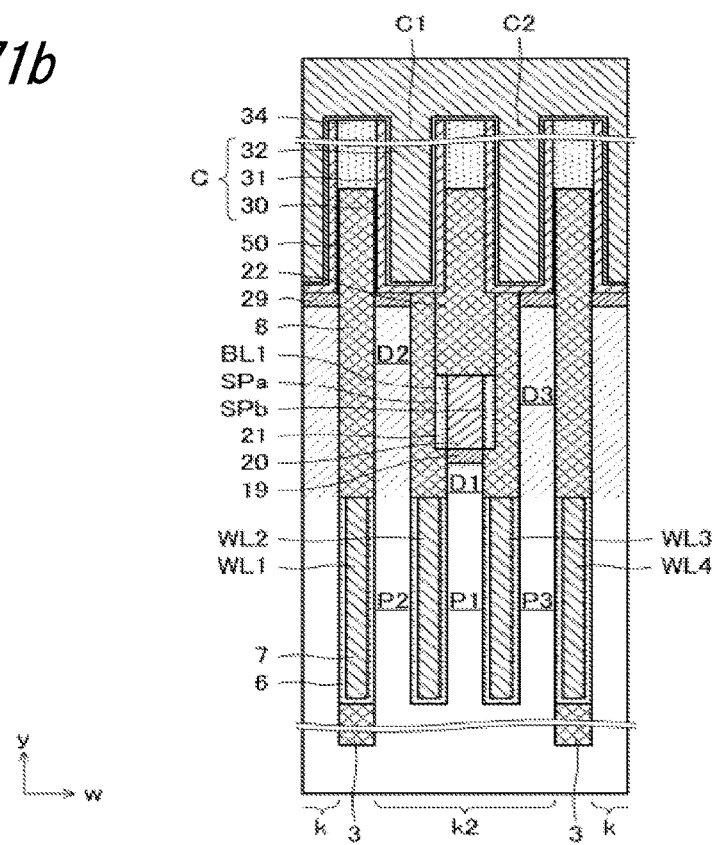

A configuration of the semiconductor device 1 according to a fifth embodiment of the present invention will then be described, referring to FIGS. 71a and 71b. FIG. 71a is a diagram showing a planar structure of the semiconductor device 1 according to the fifth embodiment, and FIG. 71b is a sectional view of the semiconductor device 1 that is taken along an A-A line of FIG. 71a.

The semiconductor device 1 of the fifth embodiment is different from the semiconductor device 1 of the first embodiment in that the positions of the active areas k in the x direction vary in each row of active areas k arranged in the x direction, that the wordlines WL are arranged at the equal interval, that the bitline BL is formed into a linear shape, and that the isolation dielectric film 3 (silicon nitride film) is used in place of the isolation dielectric film 4 (silicon oxide film). In other aspects, the semiconductor device 1 of the fifth embodiment is identical with the semiconductor device 1 of the first embodiment. The same constituent elements as described in the first embodiment, therefore, will be denoted by the same reference numerals used in the first embodiment, and the following description will be made by paying attention to differences between both embodiments.

Each active area k of the fifth embodiment is identical in shape with each active area k of the first embodiment, being a parallelogram having one pair of opposed sides parallel with the w direction and the other pair of opposed sides parallel with the y direction. According to the fifth embodiment, the w direction is inclined against the x direction by about 45 degrees, as is in the fourth embodiment. The active areas k are arranged such that they are lined up in the x direction into multiple rows extending in the x direction and in the w direction into multiple rows extending in the w direction. In the same manner as in the fourth embodiment, each active area k is entirely surrounded with the isolation dielectric film 3, i.e., silicon nitride film, and is separated from an adjacent different active area k via the isolation dielectric film 3.

Different from the case of the first embodiment, the wordlines WL (including the wordlines WL1 to WL4 shown in FIGS. 71a and 71b) are arranged at the equal interval. Paying attention to each row of active areas k in the x direction reveals that in each row, one active area k is placed for two wordlines WL. These two wordlines WL both pass through the corresponding active area k. As a result, the diffusion layer D2 in each active area k is disposed in the location same in the y direction as the location of the diffusion layers D3 in different active areas k each adjacent in the x direction to the active area k. Paying attention to each row of active areas k in the w direction reveals that in each row, one active area k is placed for three wordlines WL. Of the three wordlines WL, two wordlines WL pass through the corresponding active area k, while the remaining one wordline WL is disposed on the isolation dielectric film 3 between different active areas k.

As a result of such arrangement, the active areas k of the fifth embodiment are not lined up in the y direction in which each active area k is shifted in the x direction by an interval equivalent to the width of one wordline WL. Specifically, for example, active areas k1 to k3 shown in FIG. 71a are arranged in the y direction but their centers in the x direction are not lined up in the y direction. The arrangement of the active areas k according to the fifth embodiment is, therefore, not the arrangement that is determined by dividing the belt-shaped active areas extending in the w direction by the linear isolation regions.

Each active area k is divided by the corresponding two wordlines WL into three subareas respectively making up the semiconductor pillars P1, P2, and P3, as is in the first embodiment. On top of the semiconductor pillar P1 at the center of the active area, the diffusion layer D1 connected to the corresponding bitline BL is formed. The bitline BL is formed such that it intersects each of multiple active areas k lined up in the x direction as it extends linearly in the x direction, and is therefore connected to the diffusion layer D1 in each active area k corresponding to the bitline BL. On top of the semiconductor pillar P2, the diffusion layer D2 connected to the lower electrode 30 of the corresponding capacitor C is formed. Likewise, on top of the semiconductor pillar P3, the diffusion layer D3 connected to the lower electrode 30 of the corresponding capacitor C is formed.

According to the fifth embodiment, for forming the bitline trench, using the method of etching the silicon nitride film and the semiconductor substrate 2 at a constant etching rate following formation of the first cap dielectric film 8, the method being the same as the method of the fourth embodiment, is preferable. In this manner, the bitline trench can be formed by the method without resorting to wet etching. In addition, in the same manner as in the first embodiment, the diffusion layers D2 and D3 can be insulated from the bitline BL via the bitline spacers SPa and SPb made of the silicon oxide film with a dielectric constant smaller than that of the silicon nitride film.

As described above, according to the semiconductor device 1 of the fifth embodiment, the diffusion layers D2 and D3 can be insulated from the bitline BL via the bitline spacers SPa and SPb made of the silicon oxide film, in the same manner as in the first embodiment. As a result, the parasitic capacitance between the bitline and the diffusion layers D2 and D3 is reduced, which realizes the faster operation of the semiconductor device 1.

In the same manner as in the first embodiment, the bitline BL is buried in a location deeper than the upper surfaces of the diffusion layers D2 and D3 (main surface S). Providing the above memory element contact plug is, therefore, unnecessary. In this case, a problem that the memory element contact plug cannot be disposed at the center of the upper surface of the diffusion layer D2 or D3 does not arise and therefore a problem of an increase in the contact resistance between the capacitor C and the diffusion layers D2 and D3 does not arise, either.

The fifth embodiment also offers the advantage that the arrangement of the lower electrodes 30 is not hampered by the bitline BL, as the first embodiment does. As a result, the lower electrodes 30 can be arranged in a close-packed structure, which allows enlargement of the surface area of the capacitor C, thus allowing an increase in the capacitance of the capacitor C. Arranging the lower electrodes 30 in the close-packed structure is realized by defining the w direction as the direction inclined against the x direction by 45 degrees. In the same manner as in the fourth embodiment, the lower electrodes 30 can be arranged in the close-packed structure as the arrangement in which the lower electrode 30 extends across multiple active areas k is avoided.

The preferred embodiments of the present invention have been described above. The present invention is not limited to the above embodiments but may be modified into various forms of applications on the condition that the modification does not deviate from the substance of the invention. Obviously, the modified applications are also included in the scope of the present invention.

For example, the case of making the bitline spacers SPa and SPb out of the silicon oxide film 21 is described in the first embodiment. However, a different material having a dielectric constant equal to or smaller than that of the silicon oxide film may also be used to make the bitline spacers SPa and SPb.

The metal silicide film 19 formed on top of the diffusion layer D1 and the metal silicide film 29 formed on top of the diffusion layers D2 and D3 may be made out of a metal different from the above cobalt, such as titanium.

In each of the above embodiments, the case of using the so-called concave type capacitor C having the lower electrode 30 formed only on the inner surface of the cylinder hole G9 is described. The present invention can be preferably applied also to a semiconductor device including a different type of capacitor, e.g., crown type capacitor C.

The configuration in which the metal film 70 is formed between the lower electrode 30 and the diffusion layers D2 and D3 is described in the second embodiment. The configuration in which the air gaps AGa and AGb are provided in place of the bitline spacers SPa and SPb is described in the second embodiment. All of these configurations are applicable to the fourth and fifth embodiments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A device comprising:
   a semiconductor substrate having a main surface;
   a first wordline buried in the semiconductor substrate;
   a first bitline buried in the semiconductor substrate between the first wordline and the main surface of the semiconductor substrate;
   a first transistor including a gate, a source and a drain; the gate being electrically connected to the first wordline, and one of the source and drain being electrically connected to the first bitline;
   a first memory element formed over the main surface of the semiconductor substrate and electrically connected to the other of the source and drain;
   a bitline trench provided over the first wordline, wherein the first bitline is buried in the bitline trench; and
   wherein each of the bitline trench and the first bitline has a snake shape pattern and elongates in a direction substantially vertical to a first direction in which the first wordline elongates.

2. The device of claim 1, further comprising bitline spacers each covering a corresponding one of side surfaces of the first bitline.

3. The device of claim 2, wherein each of the bitline spacers comprises a silicon oxide film.

4. The device of claim 2, wherein each of the bitline spacers comprises an air gap.

5. The device of claim 2, wherein an upper surface of each of the bitline spacers and an upper surface of the first bitline are substantially coplanar with each other.

6. The device of claim 5, wherein a portion of the bitline trench between the main surface of the semiconductor substrate and each of the upper surfaces of the bitline spacers is filled with a cap dielectric film.

7. The device of claim 1, wherein the other of the source and drain is formed such that the first wordline is sandwiched between the one of the source and drain and the other of the source and drain, and the first memory element is connected to an upper surface of the other of the source and drain of the first transistor.

8. The device of claim 7, wherein the first memory element comprises a lower electrode, a capacitor dielectric film covering the lower electrode and an upper electrode covering the capacitor dielectric film, the lower electrode is directly connected to the upper surface of the other of the source and drain of the first transistor.

9. The device of claim 7, wherein the upper surface of the other of the source and drain of first transistor is substantially coplanar with the main surface of the semiconductor substrate, the upper surface of the one of the source and drain of the first transistor being formed at a lower position than the main surface of the semiconductor substrate and at a higher position than an upper surface of the first wordline.

10. The device of claim 1, further comprising an active area defined by a first isolation dielectric film extending in a first direction and a second isolation dielectric film extending in a second direction crossing the first direction, the first wordline elongating in the first direction so as to cross the active area, the first transistor is formed within the active area.

11. The device of claim 10, wherein an etching rate of the first isolation dielectric film is less than that of the second isolation dielectric film.

12. The device of claim 11, wherein the first isolation dielectric film comprises a silicon nitride film and the second isolation dielectric film comprises a silicon oxide film.

* * * * *